US012201010B2

(12) United States Patent
Choi et al.

(10) Patent No.: US 12,201,010 B2
(45) Date of Patent: Jan. 14, 2025

(54) ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

(71) Applicant: Samsung Electronics Co., Ltd., Suwon-si (KR)

(72) Inventors: Whail Choi, Seoul (KR); Yoonhyun Kwak, Seoul (KR); Hyun Koo, Seongnam-si (KR); Sungjun Kim, Seongnam-si (KR); Sukekazu Aratani, Hwaseong-si (KR); Kum Hee Lee, Suwon-si (KR); Sunyoung Lee, Seoul (KR); Kyuyoung Hwang, Anyang-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 497 days.

(21) Appl. No.: 16/392,090

(22) Filed: Apr. 23, 2019

(65) Prior Publication Data

US 2019/0326527 A1    Oct. 24, 2019

(30) Foreign Application Priority Data

Apr. 23, 2018   (KR) .................. 10-2018-0046992
Apr. 19, 2019   (KR) .................. 10-2019-0046230

(51) Int. Cl.
*H01L 51/00*   (2006.01)
*C07F 15/00*   (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
CPC ............ H01L 51/0085; C07F 15/0033; C09K 2211/185; C09K 2211/1033; C09K 2211/1037; H10K 85/342
See application file for complete search history.

(56) References Cited

U.S. PATENT DOCUMENTS 8,941,297 B2   1/2015   Kaiser et al.
10,023,598 B2  7/2018   Choi et al.
(Continued)

FOREIGN PATENT DOCUMENTS

CN    109970810 A     7/2019
DE    102010020044 A1  11/2011
(Continued)

OTHER PUBLICATIONS

Extended European Search Report issued by the Chinese Patent Office on Sep. 3, 2019 in the examination of the European Patent Application No. 19170458.4, which corresponds to the U.S. Application above.
(Continued)

*Primary Examiner* — Alexander C Kollias
(74) *Attorney, Agent, or Firm* — CANTOR COLBURN LLP

(57) ABSTRACT

Provided are an organometallic compound represented by Formula 1, an organic light-emitting device including the organometallic compound, and a diagnostic composition including the organometallic compound:

$$M(L_1)_{n1}(L_2)_{n2} \quad \text{Formula 1}$$

wherein M, $L_1$, $L_2$, n1 and n2 are each independently the same as defined in the specification.

10 Claims, 1 Drawing Sheet

(51) Int. Cl.
*C09K 11/06* (2006.01)
*H10K 85/30* (2023.01)
*H10K 50/11* (2023.01)
*H10K 50/15* (2023.01)
*H10K 50/16* (2023.01)
*H10K 50/17* (2023.01)
*H10K 50/18* (2023.01)
*H10K 101/10* (2023.01)

(52) U.S. Cl.
CPC ............... *C09K 2211/1033* (2013.01); *C09K 2211/1037* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 2101/10* (2023.02)

(56) References Cited

U.S. PATENT DOCUMENTS

| | | | |
|---|---|---|---|
| 10,205,106 | B2 | 2/2019 | Stoessel et al. |
| 2002/0132275 | A1* | 9/2002 | Fidler ................. G01N 33/574 435/7.23 |
| 2003/0075720 | A1* | 4/2003 | Liao ....................... H10K 50/00 257/79 |
| 2006/0134462 | A1 | 6/2006 | Yeh et al. |
| 2011/0285275 | A1 | 11/2011 | Huang et al. |
| 2015/0097169 | A1 | 4/2015 | Xia et al. |
| 2015/0188060 | A1 | 7/2015 | Chao et al. |
| 2015/0236276 | A1 | 8/2015 | Boudreault et al. |
| 2015/0315222 | A1 | 11/2015 | Boudreault et al. |
| 2016/0155963 | A1 | 6/2016 | Hwang et al. |
| 2016/0164006 | A1* | 6/2016 | Chao ................... C07F 15/0033 546/4 |
| 2016/0165007 | A1* | 6/2016 | Assem Aly Salama ..................... H04L 67/142 709/224 |
| 2016/0336520 | A1* | 11/2016 | Boudreault ......... H01L 51/0085 |
| 2017/0040551 | A1 | 2/2017 | Hwang et al. |
| 2017/0062737 | A1* | 3/2017 | Xia ........................ C09K 11/06 |
| 2017/0062739 | A1 | 3/2017 | Choi et al. |
| 2017/0155063 | A1* | 6/2017 | Wu ..................... C07F 15/0033 |
| 2017/0155065 | A1* | 6/2017 | Lin ..................... H10K 85/657 |
| 2018/0097187 | A1* | 4/2018 | Boudreault ......... H10K 85/6574 |
| 2019/0194234 | A1* | 6/2019 | Xia ..................... H01L 51/0085 |
| 2019/0207127 | A1 | 7/2019 | Lin et al. |
| 2022/0255022 | A1 | 8/2022 | Boudreault et al. |

FOREIGN PATENT DOCUMENTS

| | | |
|---|---|---|
| EP | 2940098 A1 | 11/2015 |
| EP | 3450442 A1 | 3/2019 |
| JP | 2017002027 A | 1/2017 |
| KR | 1020150129504 A | 11/2015 |
| KR | 20160134579 A | 11/2016 |
| KR | 1020170024545 A | 3/2017 |
| WO | 2014023377 A3 | 9/2014 |

OTHER PUBLICATIONS

Amedeo Santoro, et al., Synthesis MEsomorphism, and Luminescent Properties of Calamitic 2-Phenylpyridines and Their Complexes with Platinum (II), Chem. Mater. 2009, 21, 16, 3871-3882.
Chunmiao Han, et al. "Short-Axis Substitution Approach Selectively Optimizes Electrical Properties of Dibenzothiophene-Based Phosphine Oxide Hosts", J. Am. Chem. Soc.2012, 134, 46, 19179-19188.
Meng-Ting Lee, et al., "Host-free yellow phosphorescent material in white organic light-emitting diodes", Journal of Physics D: Applied Physics (2010), 43(44), 442003/1-442003/4.
Wook Song and Jun Yeob Lee, "High-Power-efficiency hybrid white organic light-emitting diodes with a single emitting laer doped with blue delayed fluorescent and yellow phosphorescent emitters", Journal of Physics D: Applied Physics, 2015, vol. 48, No. 36.
English Translation of Office Action dated Dec. 9, 2022, issued in corresponding CN Patent Application No. 201910327626.6, 9 pp.
English Translation of Office Action dated Feb. 21, 2023, issued in corresponding JP Patent Application No. 2019-81877, 4 pp.
Office Action dated Dec. 9, 2022, issued in corresponding CN Patent Application No. 201910327626.6, 7 pp.
Office Action dated Feb. 21, 2023, issued in corresponding JP Patent Application No. 2019-81877, 4 pp.
English Translation of Office Action dated Apr. 7, 2023, issued in corresponding KR Patent Application No. 10-2019-0046230, 5 pp.
Office Action dated Apr. 7, 2023, issued in corresponding KR Patent Application No. 10-2019-0046230, 6 pp.

* cited by examiner

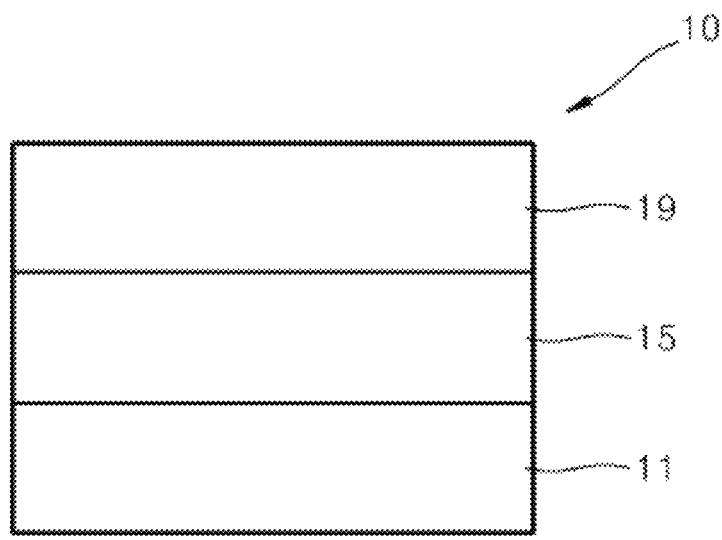

ORGANOMETALLIC COMPOUND, ORGANIC LIGHT-EMITTING DEVICE INCLUDING THE ORGANOMETALLIC COMPOUND, AND DIAGNOSTIC COMPOSITION INCLUDING THE ORGANOMETALLIC COMPOUND

CROSS-REFERENCE TO RELATED APPLICATION

This application claims priority to and the benefit of Korean Patent Application No. 10-2018-0046992, filed on Apr. 23, 2018, and Korean Patent Application No. 10-2019-0046230, filed on Apr. 19, 2019, in the Korean Intellectual Property Office, the contents of which are both incorporated herein in their entirety by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices are self-emission devices, which have better characteristics in terms of a viewing angle, a response time, a brightness, a driving voltage, and a response speed, and produce full-color images.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Luminescent compounds may be used to monitor, sense, or detect a variety of biological materials including cells and proteins. An example of the luminescent compounds includes a phosphorescent luminescent compound.

SUMMARY

Aspects of the present disclosure provide an organometallic compound, an organic light-emitting device including the organometallic compound, and a diagnostic composition including the organometallic compound.

Additional aspects will be set forth in part in the description which follows and, in part, will be apparent from the description, or may be learned by practice of the presented embodiments.

An aspect of the present disclosure provides an organometallic compound represented by Formula 1:

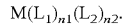
Formula 1

M in Formula 1 may be a first-row transition metal, a second-row transition metal, or a third-row transition metal, of the Periodic Table of Elements, $L_1$ in Formula 1 may be a ligand represented by Formula 2, n1 in Formula 1 may be 1, 2, or 3, wherein, when n1 is two or more, two or more $L_1$ may be identical to or different from each other, $L_2$ in Formula 1 may be a monodentate ligand, a bidentate ligand, a tridentate ligand, or a tetradentate ligand, n2 in Formula 1 may be 0, 1, 2, 3, or 4, wherein, when n2 is two or more, two or more $L_2$ may be identical to or different from each other, and $L_1$ and $L_2$ in Formula 1 may be different from each other:

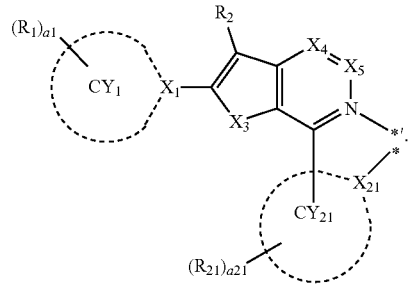
Formula 2

In Formula 2, $X_1$ may be C, N, Si, or P, $X_{21}$ may be C or N, ring $CY_1$ and ring $CY_{21}$ may each independently be a $C_3$-$C_{60}$ carbocyclic group or a $C_1$-$C_{60}$ heterocyclic group, $X_3$ may be O, S, Se, or $N(R_3)$, $X_4$ may be N or $C(R_4)$, $X_5$ may be N or $C(R_5)$, $R_1$ to $R_5$ and $R_{21}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, a1 and a21 may each independently be an integer from 0 to 20, ring $CY_1$ and $R_2$ are not linked to each other, and $R_1$ and $R_2$ are not linked to each other, $R_4$ and $R_5$ may optionally be linked to form a $C_5$-$C_{30}$ carbocyclic group that is unsubstituted or substituted with $R_{10a}$ or a $C_1$-$C_{30}$ heterocyclic group that is unsubstituted or substituted with $R_{10a}$, a plurality of $R_{21}$ may optionally be linked to form a $C_5$-$C_{30}$ carbocyclic group that is unsubstituted or substituted with $R_{10a}$ or a $C_1$-$C_{30}$ heterocyclic group that is unsubstituted or substituted with $R_{10a}$, $R_{10a}$ may be the same as defined in connection with $R_{21}$, * and *' each indicate a binding site to M in Formula 1, a substituent of the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, or the substituted monovalent non-aromatic condensed heteropolycyclic group may be:

deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a combination thereof;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N(Q$_{11}$)(Q$_{12}$), —Si(Q$_{13}$)(Q$_{14}$)(Q$_{15}$), —B(Q$_{16}$)(Q$_{17}$), —P(=O)(Q$_{18}$)(Q$_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with deuterium, —F, —Cl, —Br, —I, —CD$_3$, —CD$_2$H, —CDH$_2$, —CF$_3$, —CF$_2$H, —CFH$_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N(Q$_{21}$)(Q$_{22}$), —Si(Q$_{23}$)(Q$_{24}$)(Q$_{25}$), —B(Q$_{26}$)(Q$_{27}$), —P(=O)(Q$_{28}$)(Q$_{29}$), or a combination thereof; or —N(Q$_{31}$)(Q$_{32}$), —Si(Q$_{33}$)(Q$_{34}$)(Q$_{35}$), —B(Q$_{36}$)(Q$_{37}$), —P(=O)(Q$_{38}$)(Q$_{39}$), or a combination thereof; and $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group, or a combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof.

Another aspect of the present disclosure provides an organic light-emitting device including: a first electrode; a second electrode; and an organic layer between the first electrode and the second electrode and including an emission layer, wherein the organic layer includes the organometallic compound.

The organometallic compound in the emission layer of the organic layer may act as a dopant.

Another aspect of the present disclosure provides a diagnostic composition including an organometallic compound represented by Formula 1.

BRIEF DESCRIPTION OF THE DRAWING

These and/or other aspects will become apparent and more readily appreciated from the following description of the embodiments, taken in conjunction with FIGURE which is a schematic view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

An organometallic compound according to an embodiment is represented by Formula 1 below:

$$M(L_1)_{n1}(L_2)_{n2}. \qquad \text{Formula 1}$$

In Formula 1, M may be a first-row transition metal, a second-row transition metal, or a third-row transition metal, of the Periodic Table of Elements.

For example, M may be iridium (Ir), platinum (Pt), osmium (Os), titanium (Ti), zirconium (Zr), hafnium (Hf), europium (Eu), terbium (Tb), thulium (Tm), or rhodium (Rh).

In one embodiment, M may be Ir, Pt, Os, or Rh, but embodiments of the present disclosure are not limited thereto.

$L_1$ in Formula 1 may be a ligand represented by Formula 2, and n1 in Formula 1 indicates the number of $L_1$ in Formula 1 and may be 1, 2, or 3. When n1 is two or more, two or more $L_1$ may be identical to or different from each other:

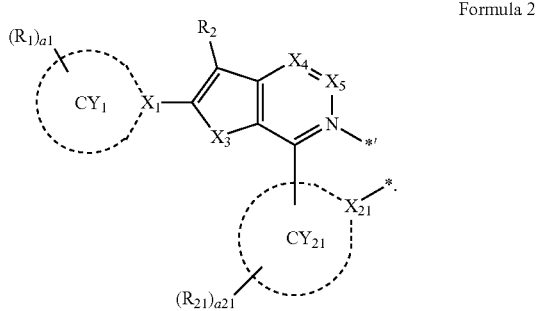

Formula 2

Formula 2 is the same as described below.

For example, n1 may be 1 or 2.

$L_2$ in Formula 1 may be a monodentate ligand, a bidentate ligand, a tridentate ligand, or a tetradentate ligand, and n2 in Formula 1 indicates the number of $L_2$ and may be 0, 1, 2, 3, or 4. When n2 is two or more, two or more $L_2$ may be identical to or different from each other. $L_2$ is the same as described below.

For example, n2 in Formula 1 may be 1 or 2.

$L_1$ and $L_2$ in Formula 1 may be different from each other.

In one embodiment, M may be Ir or Os, and the sum of n1 and n2 may be 3 or 4; or M may be Pt, and the sum of n1 and n2 may be 2.

In Formula 2, $X_1$ may be C, N, Si, or P, and $X_{21}$ may be C or N.

For example, in Formula 2, $X_{21}$ may be C.

In Formula 2, ring $CY_1$ and ring $CY_{21}$ may each independently be a $C_3$-$C_{60}$ carbocyclic group or a $C_1$-$C_{60}$ heterocyclic group.

For example, ring $CY_1$ and ring $CY_{21}$ may each independently be i) a first ring, ii) a second ring, iii) a condensed ring in which two or more first rings are condensed with each other, iv) a condensed ring in which two or more second rings are condensed with each other, and v) a condensed ring in which one or more first rings and one or more second rings are condensed with each other.

The first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group, and the second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

In one embodiment, ring $CY_1$ and ring $CY_{21}$ may each independently be a cyclopentene group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, but embodiments of the present disclosure are not limited thereto.

In one or more embodiments, ring $CY_1$ may be a cyclopentane group, a cyclohexane group, a cycloheptane group, a cyclooctane group, an adamantane group, a norbornane group, a norbornene group, a cyclopentene group, a cyclohexene group, a cycloheptene group, a benzene group, a naphthalene group, a fluorene group, a phenanthrene group, an anthracene group, a fluoranthene group, a triphenylene group, a pyrene group, a chrysene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, an isoindole group, an indole group, an indazole group, a purine group, a quinoline group, an isoquinoline group, a benzoquinoline group, a quinoxaline group, a quinazoline group, a cinnoline group, a carbazole group, a phenanthroline group, a benzimidazole group, a benzofuran group, a benzothiophene group, an isobenzothiazole group, a benzoxazole group, an isobenzoxazole group, a triazole group a tetrazole group, an oxadiazole group, a triazine group, a dibenzofuran group, a dibenzothiophene group, a dibenzosilole group, a benzocarbazole group, a dibenzocarbazole group, an imidazopyridine group, or an imidazopyrimidine group, but embodiments of the present disclosure are not limited thereto.

In Formula 2, $X_3$ may be O, S, Se, or $N(R_3)$, $X_4$ may be N or $C(R_4)$, and $X_5$ may be N or $C(R_5)$.

In one embodiment, $X_3$ may be O or S, and $X_5$ may be $C(R_5)$.

In one or more embodiments, $X_3$ may be O or S, and $X_4$ may be N.

In one or more embodiments, $X_4$ may be N, and $X_5$ may be $C(R_5)$.

In one or more embodiments, $X_4$ may be $C(R_4)$, and $X_5$ may be $C(R_5)$.

In Formula 2, $R_1$ to $R_5$ and $R_{21}$ may each independently be hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, and $Q_1$ to $Q_9$ are the same as described above.

For example, $R_1$ to $R_5$ and $R_{21}$ may each independently be:
  hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;
  a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or a combination thereof;
  a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each unsubstituted or substituted with a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cycloctyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkyl phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or a combination thereof; or —$N(Q_1)(Q_2)$, —$Si(Q_3)(Q_4)(Q_5)$, —$B(Q_6)(Q_7)$, or —$P(=O)(Q_8)(Q_9)$, or a combination thereof, and $Q_1$ to $Q_9$ may each independently be:
—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CH_3$, —$CD_2CD_3$, —$CD_2CD_2H$ or —$CD_2CDH_2$; or
an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each unsubstituted or substituted with a deuterium, a $C_1$-$C_{10}$ alkyl group, or a phenyl group, but embodiments of the present disclosure are not limited thereto.

In Formula 2, a1 and a21 each indicate the number of $R_1$ and the number of $R_{21}$, respectively, and may each independently be an integer from 0 to 20 (for example, an integer from 0 to 10 or an integer from 0 to 5). When a1 is two or more, two or more $R_1$ may be identical to or different from each other, and when a21 is two or more, two or more $R_{21}$ may be identical to or different from each other.

In Formula 2, ring $CY_1$ and $R_2$ are not linked to each other, and $R_1$ and $R_2$ are not linked to each other.

In one embodiment, a group represented by

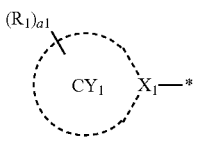

in Formula 2 may be a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group, each unsubstituted or substituted with $R_1$ in the number of a1.

In Formula 2, $R_1$ and $R_2$ may each independently be:
hydrogen, deuterium, —F, —Cl, —Br, —I, a cyano group, or —$SF_5$; or
a $C_1$-$C_{60}$ alkyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group, each unsubstituted or substituted with a deuterium, —F, —Cl, —Br, —I, —$CD_3$, —$CD_2H$, —$CDH_2$, —$CF_3$, —$CF_2H$, —$CFH_2$, a cyano group, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, or a pyrimidinyl group, and
a1 may be an integer from 0 to 10.

Each of a1, $R_1$, a $C_1$-$C_{60}$ alkyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group are the same as described above.

In one or more embodiments, a group represented by

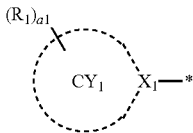

in Formula 2 may be a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each unsubstituted or substituted with an $R_1$ in the number of a1, In Formula 2, $R_1$ and $R_2$ may each independently be:
hydrogen, deuterium, —F, —Cl, —Br, —I, a cyano group, or —$SF_5$; or
a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an iso-nonyl group, a sec-nonyl group, a tert-nonyl group, an n-decanyl group, an isodecanyl group, a sec-decanyl group, a tert-decanyl group, a $C_1$-$C_{10}$ alkoxy, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, a dibenzofuranyl group, or a dibenzothiophenyl group, each unsubstituted or substituted with a deuterium, —F, —Cl, —Br, —I, —$CD_3$, —$CD_2H$, —$CDH_2$, —$CF_3$, —$CF_2H$, —$CFH_2$, a cyano group, a $C_1$-$C_{20}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a biphenyl group, a naphthyl group, a pyridinyl group, a pyrimidinyl group, a dibenzofuranyl group, or a dibenzothiophenyl group, and a1 may be an integer from 0 to 5, but embodiments of the present disclosure are not limited thereto.

In one or more embodiments, a group represented by

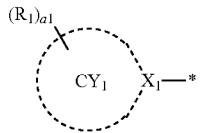

in Formula 2 may be a group represented by Formulae 10-13(1) to 10-13(18) or 10-13:
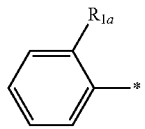
10-13(1)
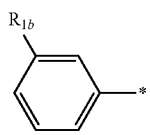
10-13(2)
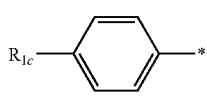
10-13(3)
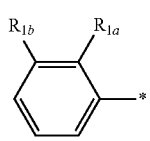
10-13(4)
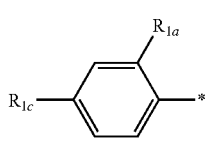
10-13(5)
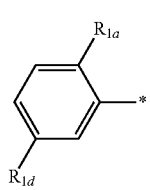
10-13(6)
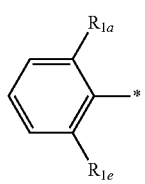
10-13(7)
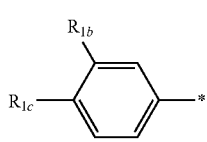
10-13(8)
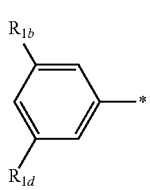
10-13(9)
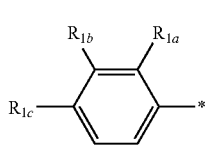
10-13(10)
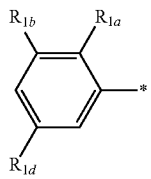
10-13(11)
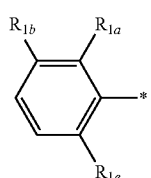
10-13(12)
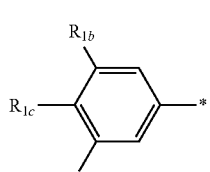
10-13(13)
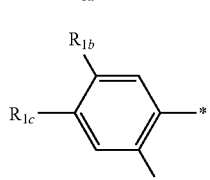
10-13(14)
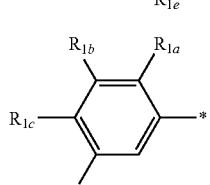
10-13(15)
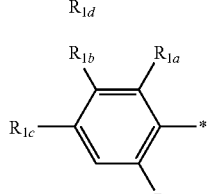
10-13(16)
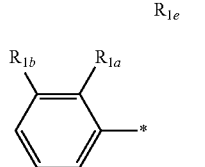
10-13(17)
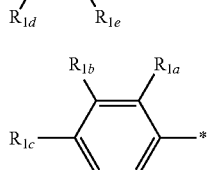
10-13(18)
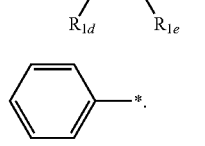
10-13
In Formulae 10-13(1) to 10-13(18) and 10-13, $R_{1a}$ to $R_{1e}$ may each independently the same as defined in connection with R$_1$, wherein R$_{1a}$ to R$_{1e}$ may not each independently be hydrogen, and * indicates a binding site to a neighboring atom.

In one or more embodiments, in Formula 2,

X$_4$ may be C(R$_4$), and

R$_4$ may be hydrogen, deuterium, —F, —Cl, —Br, —I, —SF$_5$, a cyano group, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{10}$ cycloalkyl group, a substituted or unsubstituted C$_1$-C$_{10}$ heterocycloalkyl group, a substituted or unsubstituted C$_3$-C$_{10}$ cycloalkenyl group, a substituted or unsubstituted C$_1$-C$_{10}$ heterocycloalkenyl group, —N(Q$_1$)(Q$_2$), —Si(Q$_3$)(Q$_4$)(Q$_5$), —B(Q$_6$)(Q$_7$), or —P(=O)(Q$_8$)(Q$_9$).

In one or more embodiments, in Formula 2,

X$_4$ may be C(R$_4$), and

R$_4$ may be a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_1$-C$_{60}$ heteroaryl group, a substituted or unsubstituted monovalent non-aromatic condensed polycyclic group, or a substituted or unsubstituted monovalent non-aromatic condensed heteropolycyclic group.

In one or more embodiments, in Formula 2, X$_4$ may be N. For example, a group represented by

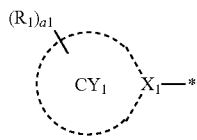

in Formula 2 may be a group represented by Formulae 10-13 to 10-229, and/or R$_1$ to R$_5$ and R$_{21}$ may each independently be hydrogen, deuterium, —F, a cyano group, a nitro group, —SF$_5$, —CH$_3$, —CD$_3$, —CD$_2$H, —CDH$_2$, —CF$_3$, —CF$_2$H, —CFH$_2$, a group represented by Formulae 9-1 to 9-19, a group represented by Formulae 10-1 to 10-229, or —Si(Q$_3$)(Q$_4$)(Q$_5$) (wherein Q$_3$ to Q$_5$ are the same as described above), but embodiments of the present disclosure are not limited thereto:

9-1
9-2
9-3
9-4
9-5
9-6

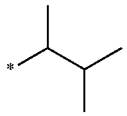 9-7

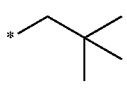 9-8

9-9

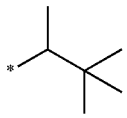 9-10

9-11

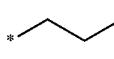 9-12

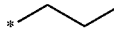 9-13

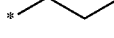 9-14

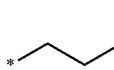 9-15

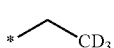 9-16

 9-17

 9-18

 9-19

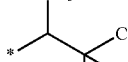 10-1

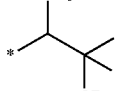 10-2

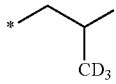

10-3

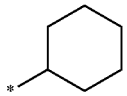

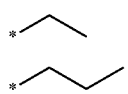
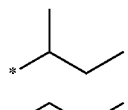

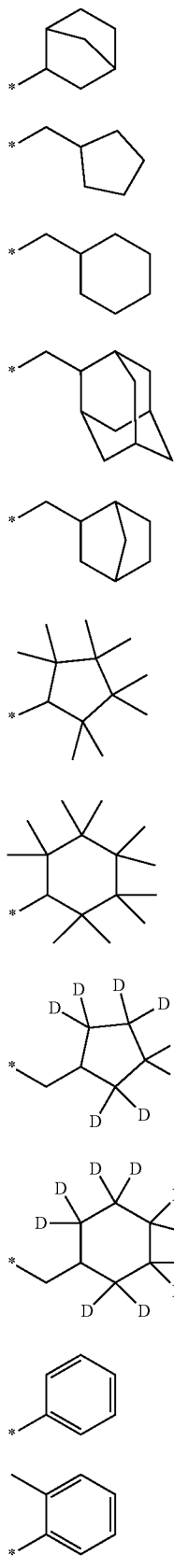
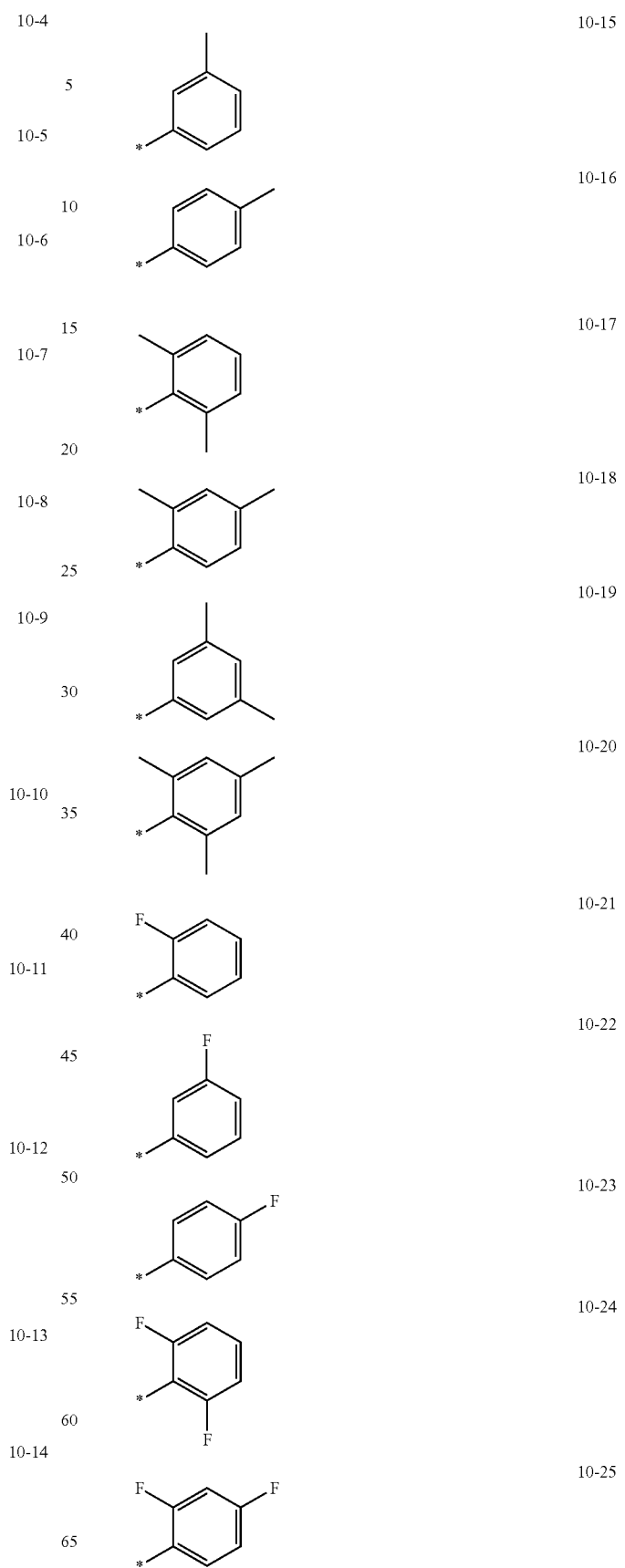

| | |
|---|---|
| 10-26 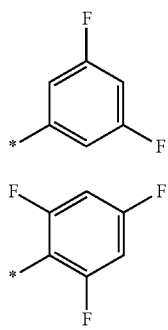 | 10-37 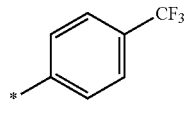 |
| 10-27 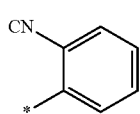 | 10-38 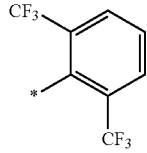 |
| 10-28 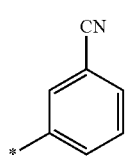 | 10-39 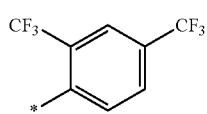 |
| 10-29 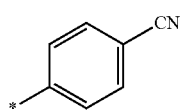 | 10-40 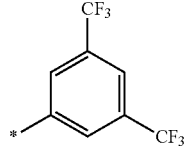 |
| 10-30 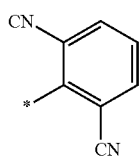 | 10-41 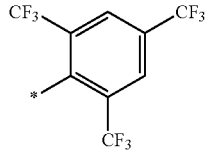 |
| 10-31 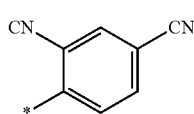 | 10-42 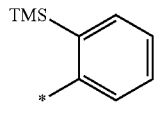 |
| 10-32 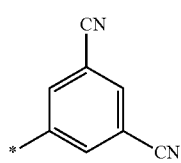 | 10-43 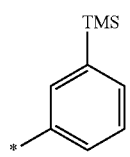 |
| 10-33 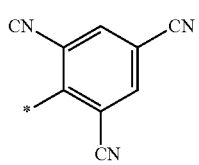 | 10-44 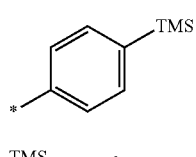 |
| 10-34 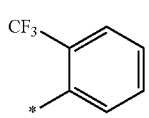 | 10-45 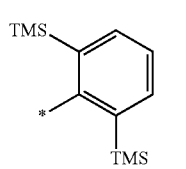 |
| 10-35 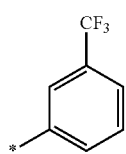 | 10-46 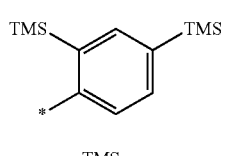 |
| 10-36 | 10-47 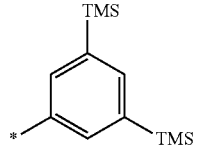 |

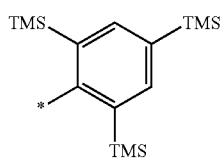
10-48
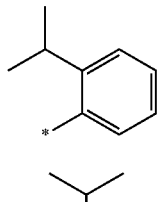
10-49
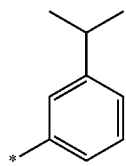
10-50
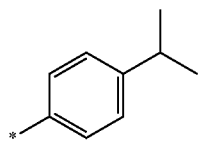
10-51
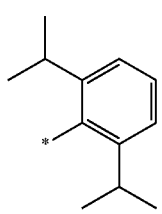
10-52
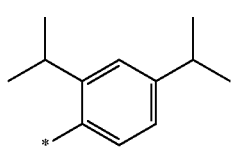
10-53
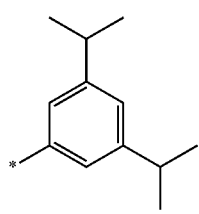
10-54
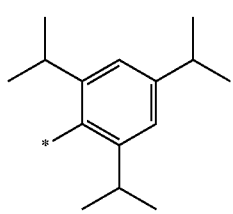
10-55
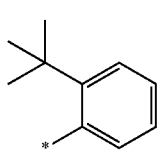
10-56
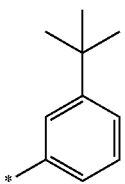
10-57
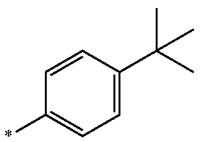
10-58
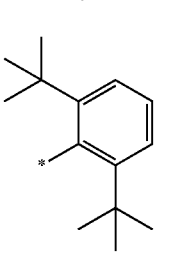
10-59
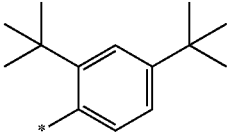
10-60
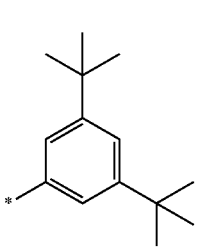
10-61
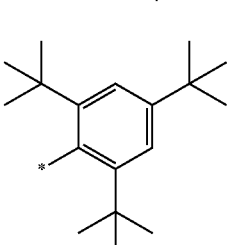
10-62
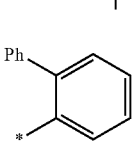
10-63
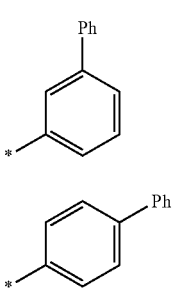
10-64
10-65

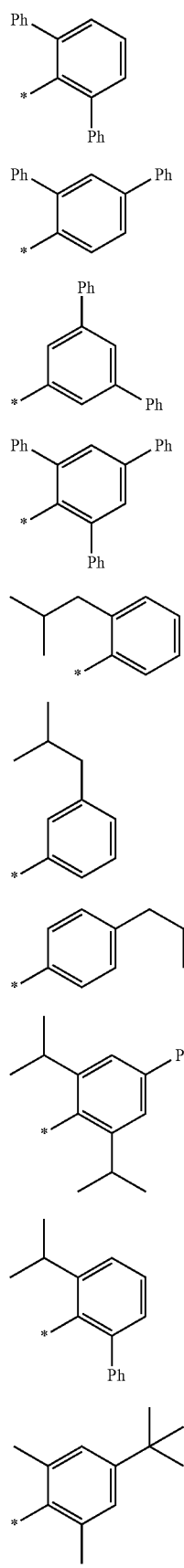
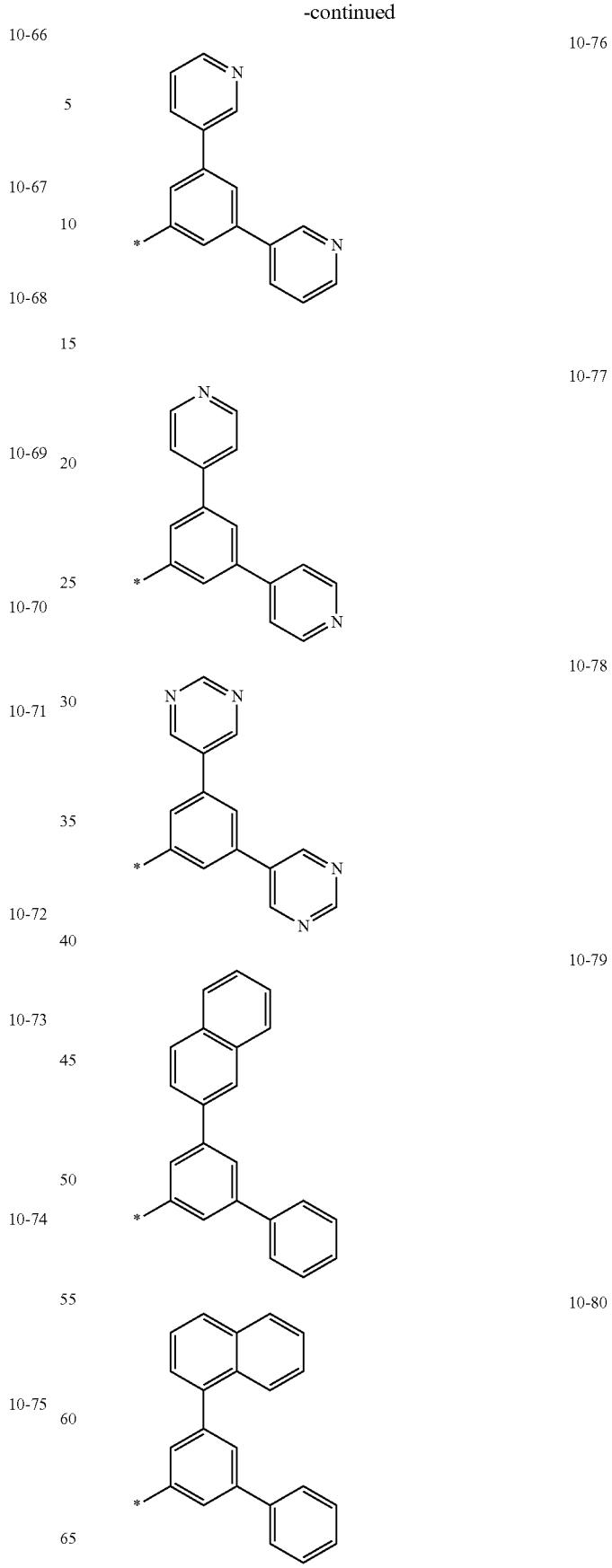

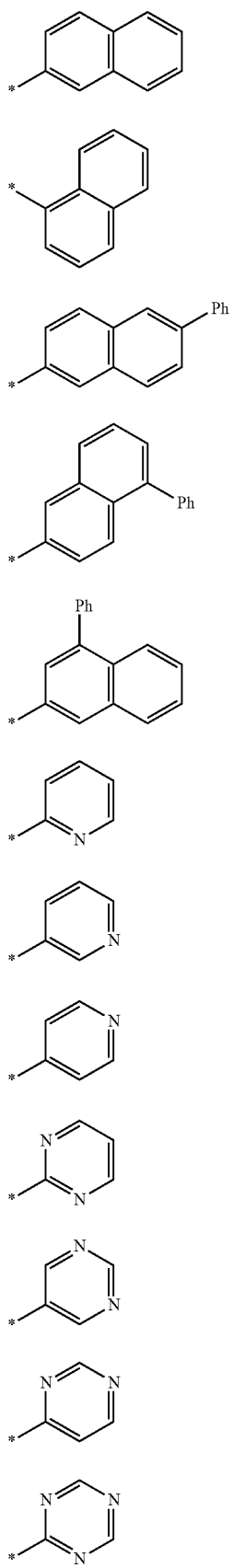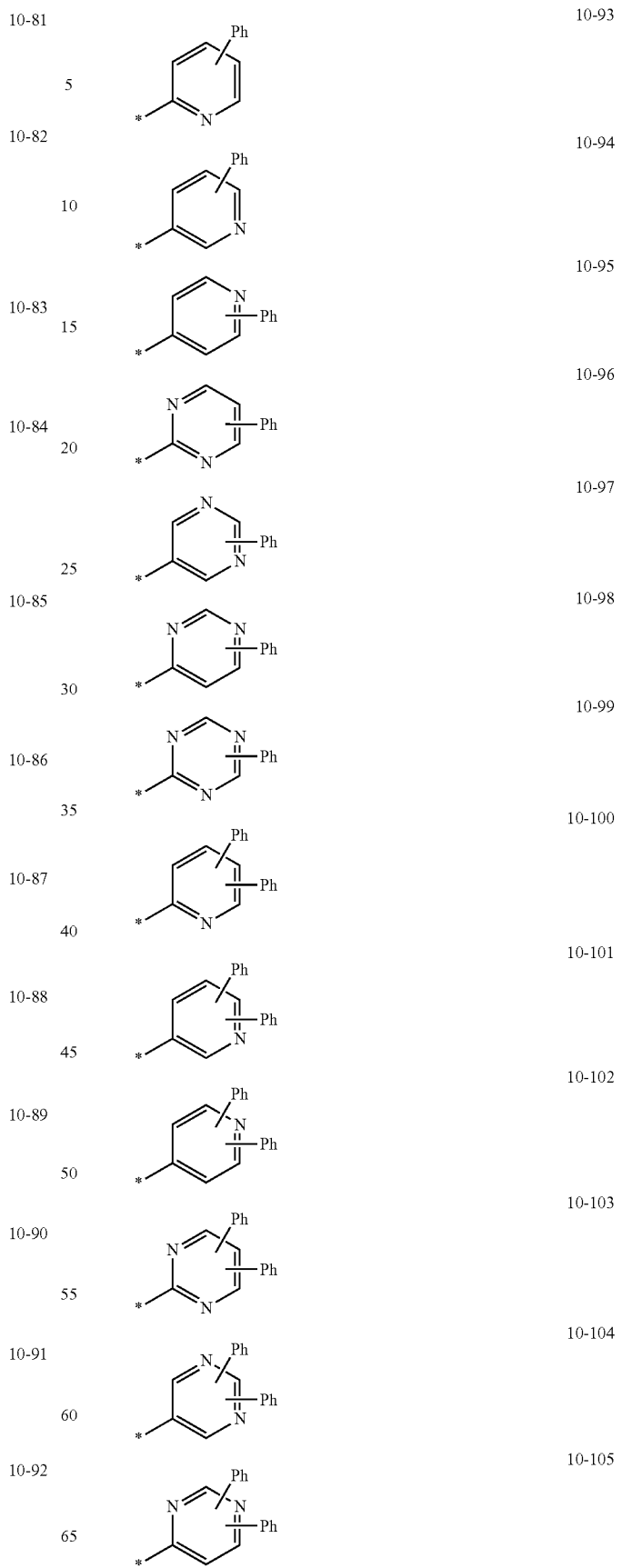

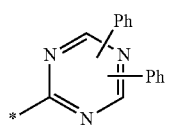
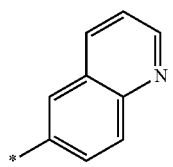
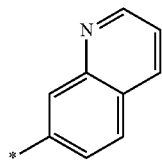
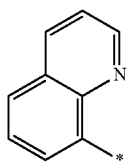
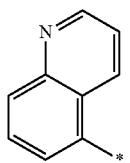
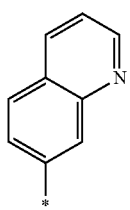
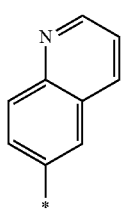
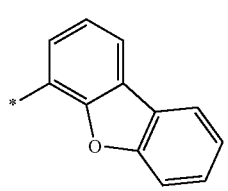
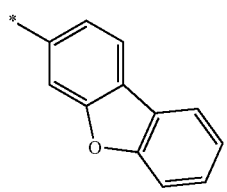
10-106
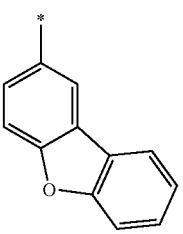
10-107
10-108
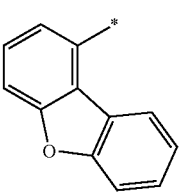
10-109
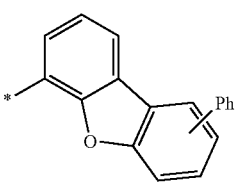
10-110
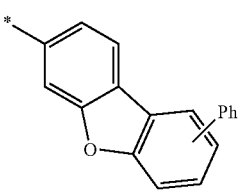
10-111
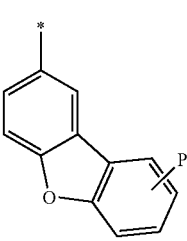
10-112
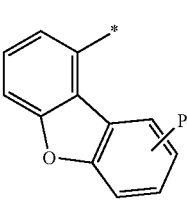
10-113
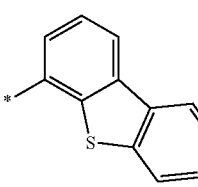
10-114
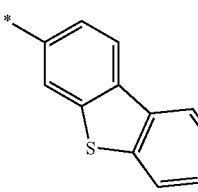
10-115
10-116
10-117
10-118
10-119
10-120
10-121
10-122

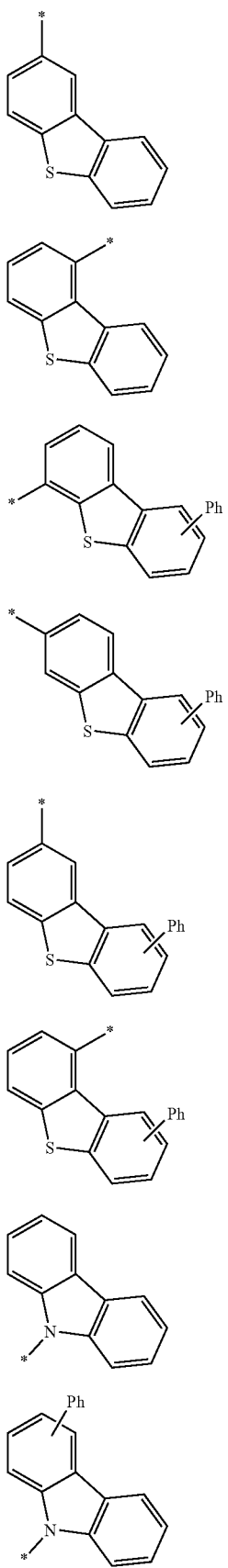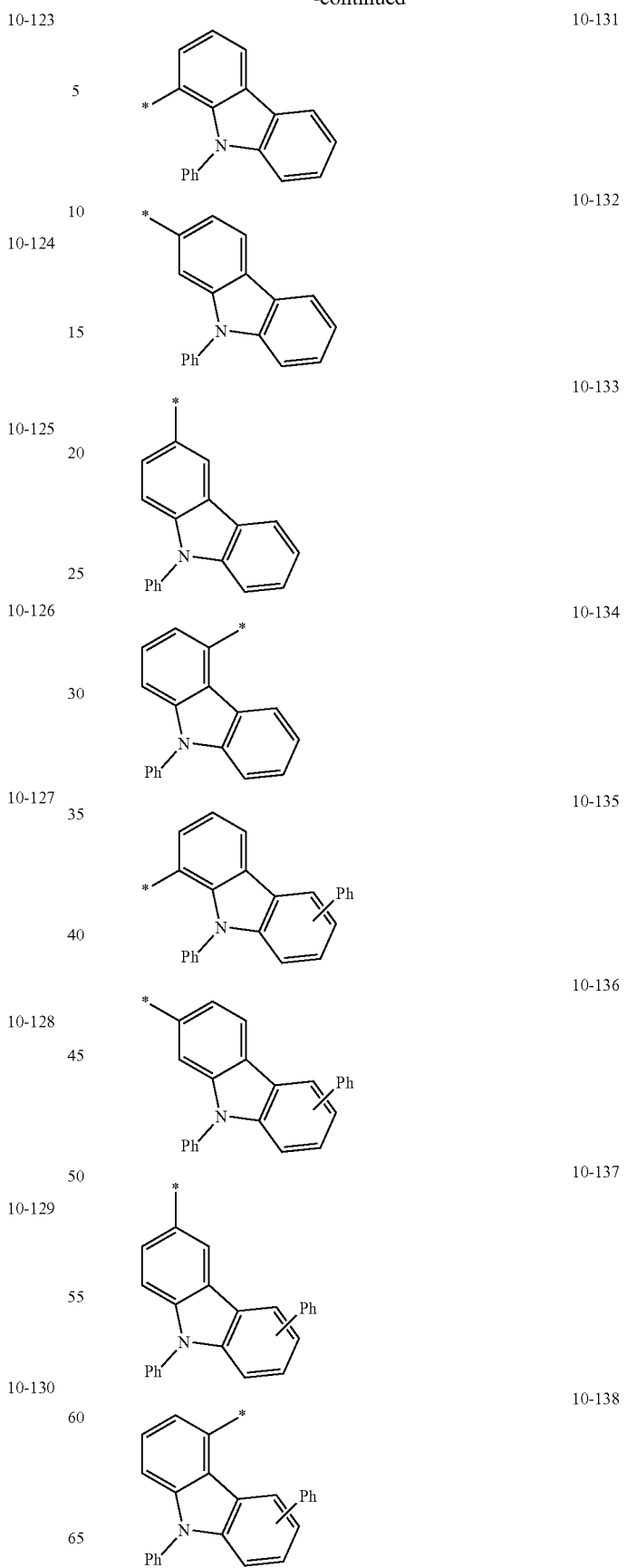

-continued
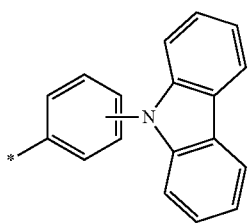
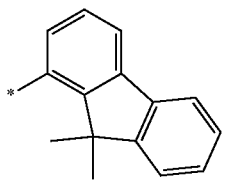
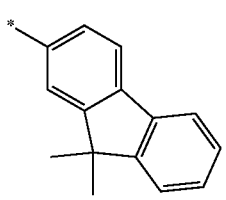
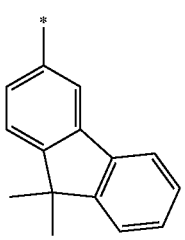
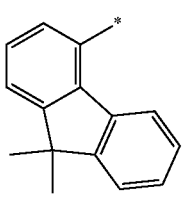
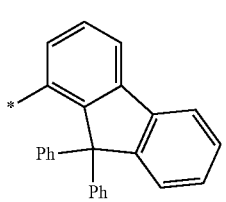
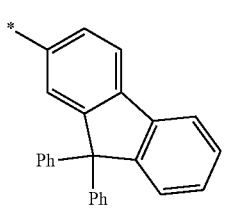
-continued
10-139
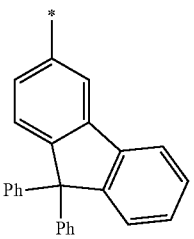
10-140
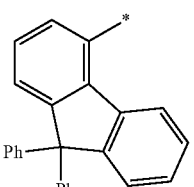
10-141
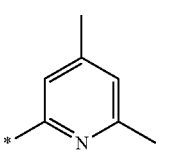
10-142
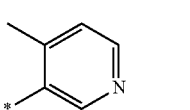
10-143
10-144
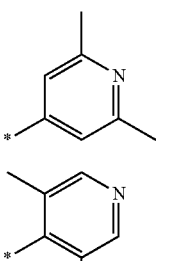
10-145
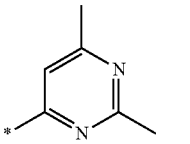
10-146
10-147
10-148
10-149
10-150
10-151
10-152
10-153
10-154
10-155
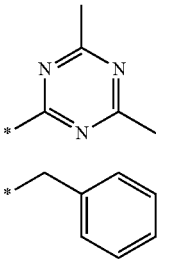

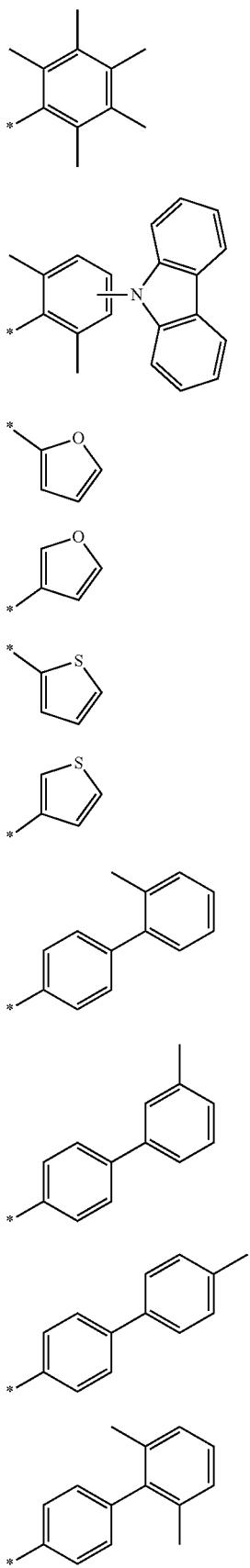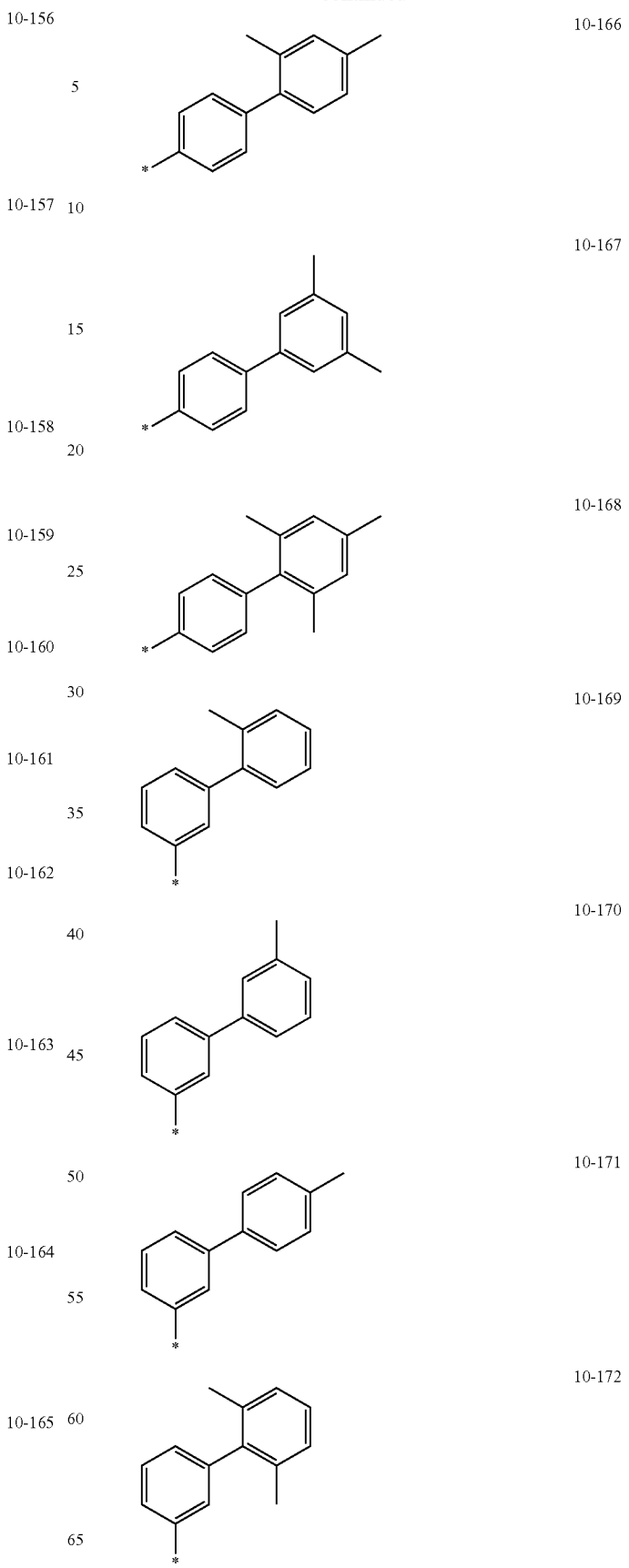

| | |
|---|---|
| | 10-173 |
| | 10-174 |
| | 10-175 |
| | 10-176 |
| | 10-177 |
| | 10-178 |
| | 10-179 |
| | 10-180 |

| | |
|---|---|
| | 10-181 |
| | 10-182 |
| | 10-183 |
| | 10-184 |
| | 10-185 |
| | 10-186 |
| | 10-187 |
| | 10-188 |
| | 10-189 |
| | 10-190 |
| | 10-191 |
| | 10-192 |
| | 10-193 |

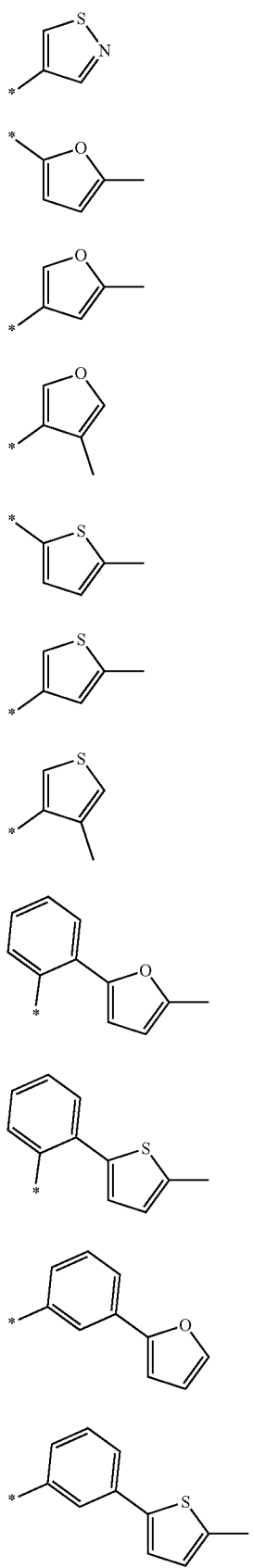
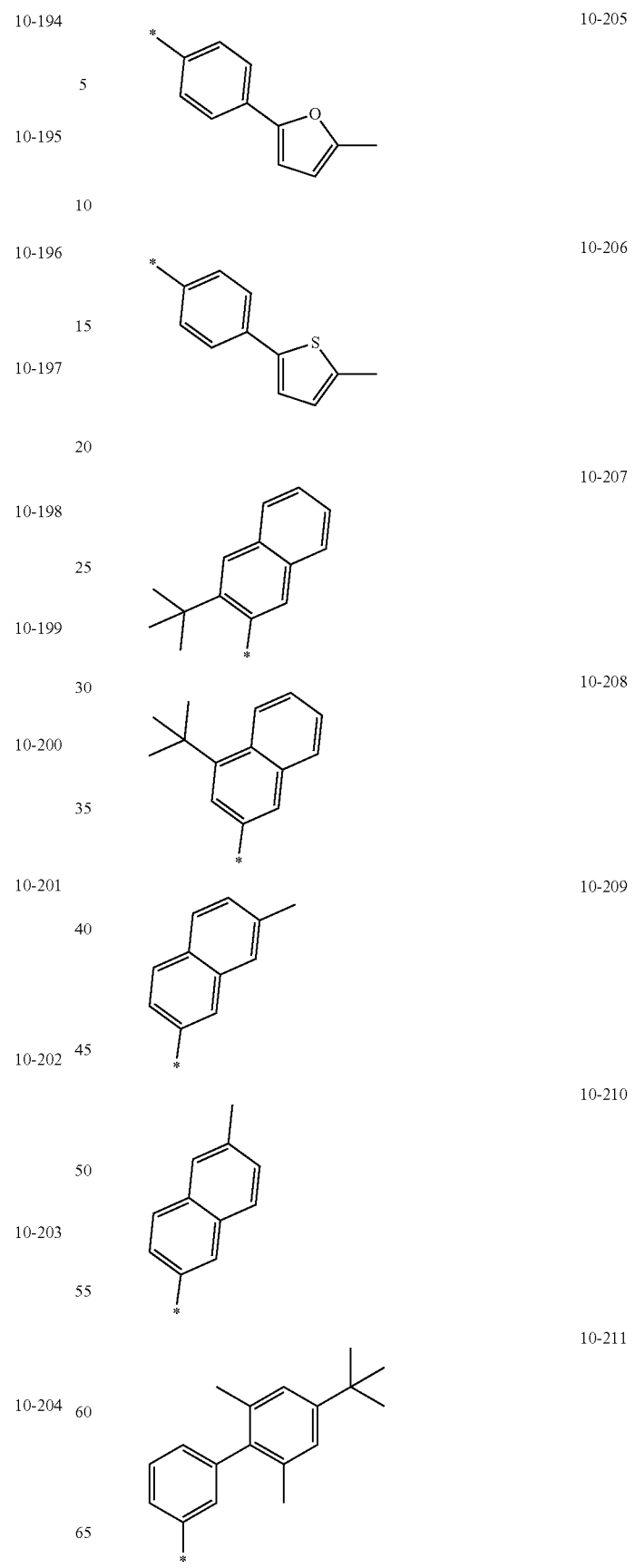

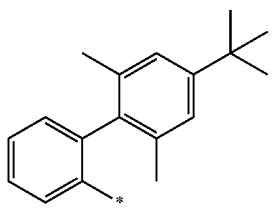
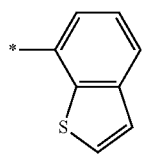
10-213
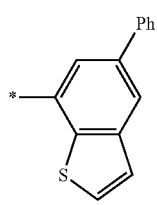
10-214
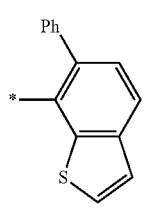
10-215
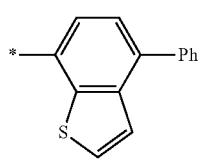
10-216
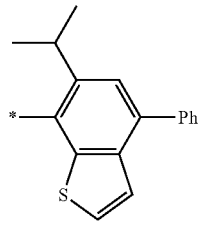
10-217
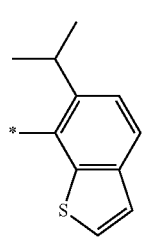
10-218
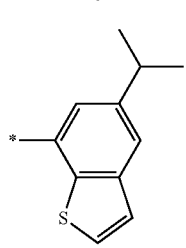
10-219
10-212
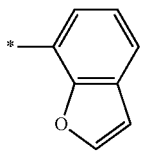
10-213
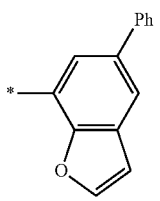
10-214
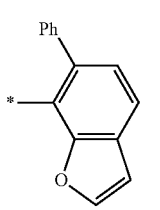
10-215
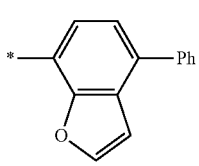
10-216
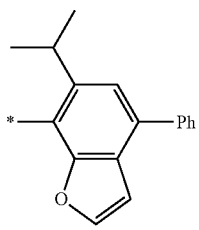
10-217
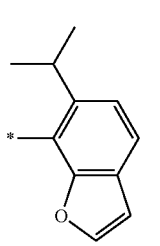
10-218
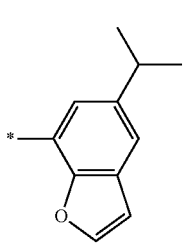
10-219
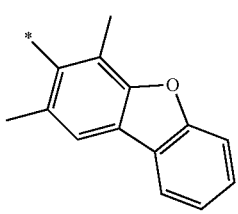
10-220
10-221
10-222
10-223
10-224
10-225
10-226
10-227

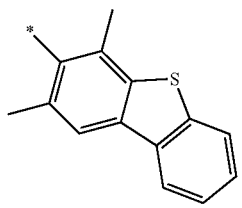

10-228

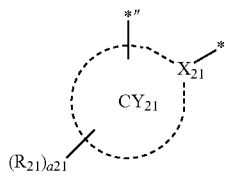

10-229

In Formulae 9-1 to 9-19 and 10-1 to 10-229, * indicates a binding site to a neighboring atom, Ph indicates a phenyl group, and TMS indicates a trimethylsilyl group.

In Formula 2, $R_4$ and $R_5$ may optionally be linked to form a $C_5$-$C_{30}$ carbocyclic group that is unsubstituted or substituted with $R_{10a}$ or a $C_1$-$C_{30}$ heterocyclic group that is unsubstituted or substituted with $R_{10a}$ (for example, a benzene group, a cyclopentane group, a cyclopentadiene group, a furan group, a thiophene group, a pyrrole group, a silole group, an indene group, a benzofuran group, a benzothiophene group, an indole group, or a benzosilole group, each unsubstituted or substituted with $R_{10a}$), a plurality of neighboring $R_{21}$ may optionally be linked to form a $C_5$-$C_{30}$ carbocyclic group that is unsubstituted or substituted with $R_{10a}$ or a $C_1$-$C_{30}$ heterocyclic group that is unsubstituted or substituted with $R_{10a}$ (for example, a benzene group, a cyclopentane group, a cyclopentadiene group, a furan group, a thiophene group, a pyrrole group, a silole group, an indene group, a benzofuran group, a benzothiophene group, an indole group or a benzosilole group, each unsubstituted or substituted with $R_{10a}$), and $R_{10a}$ may be the same as defined in connection with $R_{21}$. The $C_5$-$C_{30}$ carbocyclic group and the $C_1$-$C_{30}$ heterocyclic group may each independently be the same as described elsewhere herein.

In Formula 2, * and *' each indicate a binding site to M in Formula 1.

A group represented by

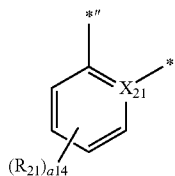

in Formula 2 may be a group represented by Formulae CY21-1 to CY21-31:

CY21-1

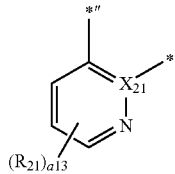

CY21-2

CY21-3

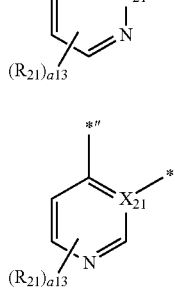

CY21-4

CY21-5

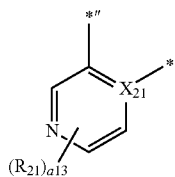

CY21-6

CY21-7

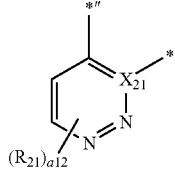

CY21-8

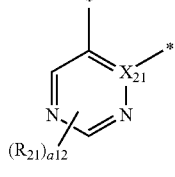

-continued
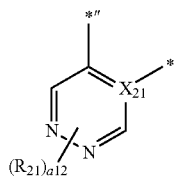
CY21-9
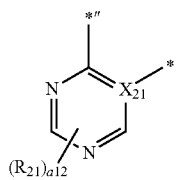
CY21-10
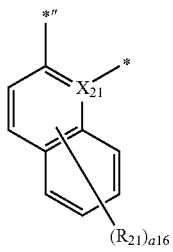
CY21-11
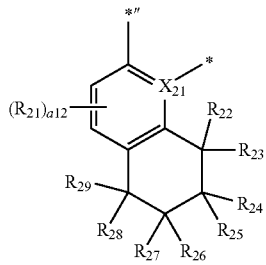
CY21-12
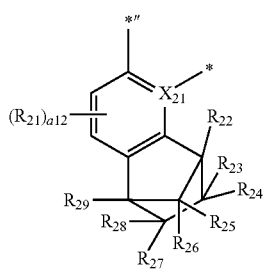
CY21-13
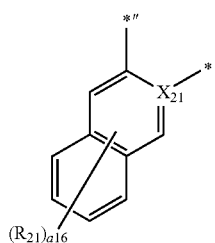
CY21-14
-continued
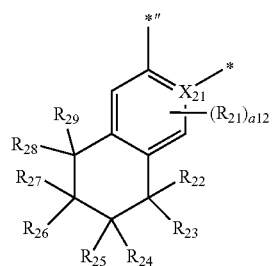
CY21-15
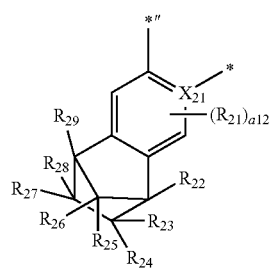
CY21-16
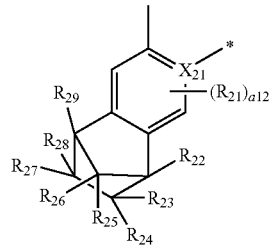
CY21-17
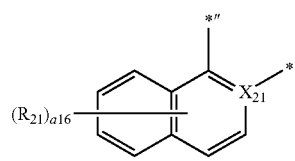
CY21-18
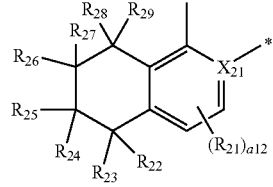
CY21-19
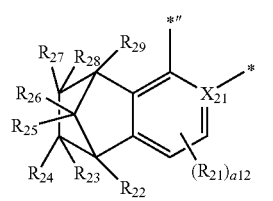
CY21-20
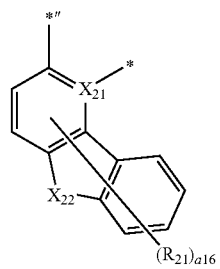

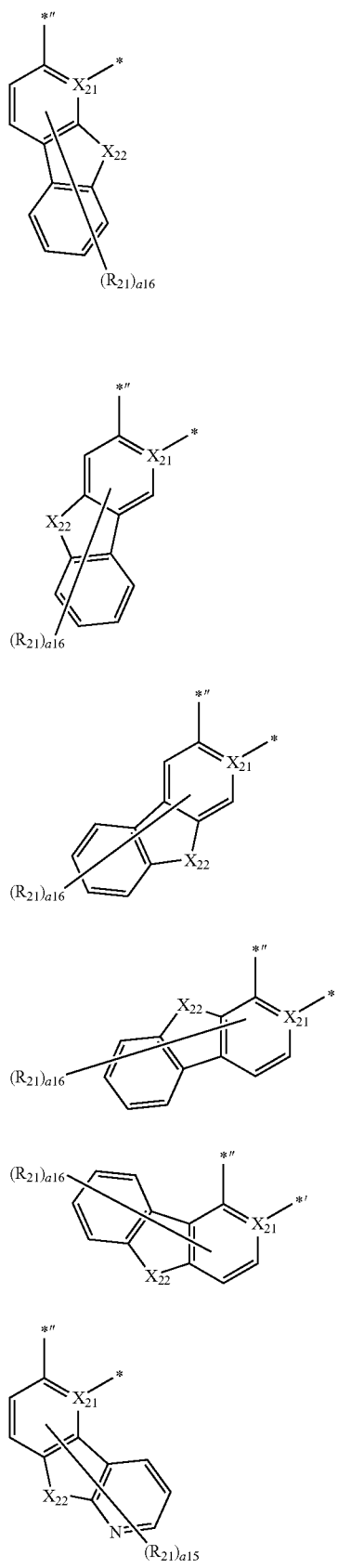

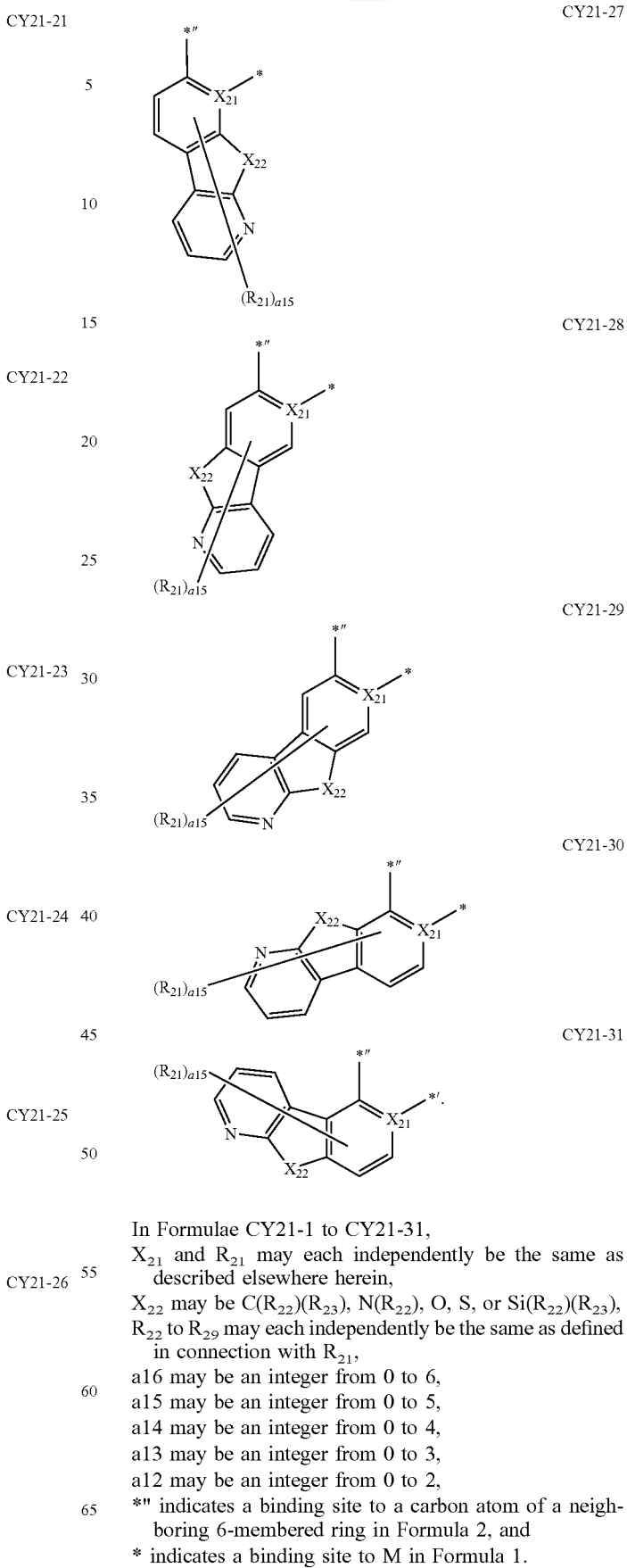

In Formulae CY21-1 to CY21-31,
$X_{21}$ and $R_{21}$ may each independently be the same as described elsewhere herein,
$X_{22}$ may be $C(R_{22})(R_{23})$, $N(R_{22})$, O, S, or $Si(R_{22})(R_{23})$,
$R_{22}$ to $R_{29}$ may each independently be the same as defined in connection with $R_{21}$,
a16 may be an integer from 0 to 6,
a15 may be an integer from 0 to 5,
a14 may be an integer from 0 to 4,
a13 may be an integer from 0 to 3,
a12 may be an integer from 0 to 2,
*″ indicates a binding site to a carbon atom of a neighboring 6-membered ring in Formula 2, and
* indicates a binding site to M in Formula 1.

In one embodiment, a group represented by (structure showing CY21 ring with *", *, X21, and (R21)a21 substituents)

in Formula 2 may be a group represented by Formulae CY21(1) to CY21(56) or a group represented by Formulae CY21-20 to CY21-31:

CY21(1)
CY21(2)
CY21(3)
CY21(4)
CY21(5)
CY21(6)
CY21(7)
CY21(8)
CY21(9)
CY21(10)
CY21(11)
CY21(12)
CY21(13)
CY21(14)

-continued
CY21(15)
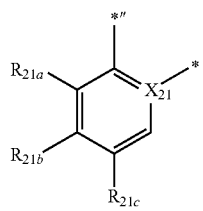
CY21(16)
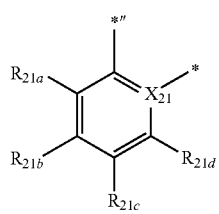
CY21(17)
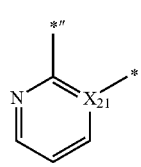
CY21(18)
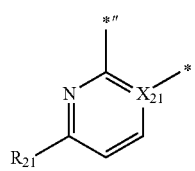
CY21(19)
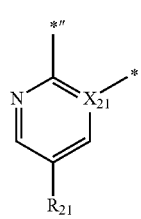
CY21(20)
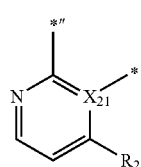
CY21(21)
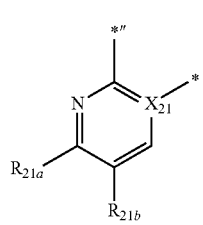
CY21(22)
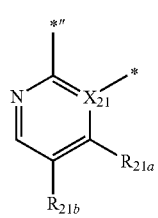
-continued
CY21(23)
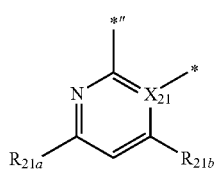
CY21(24)
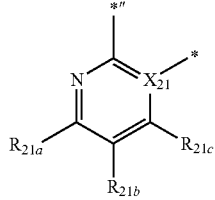
CY21(25)
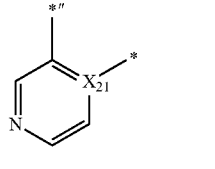
CY21(26)
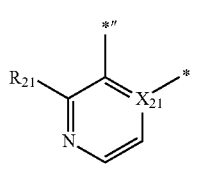
CY21(27)
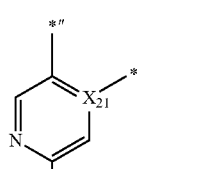
CY21(28)
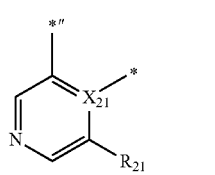
CY21(29)
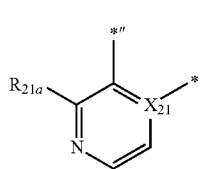
CY21(30)
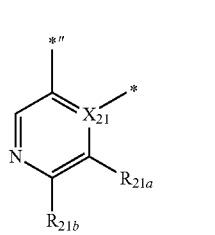

CY21(31) 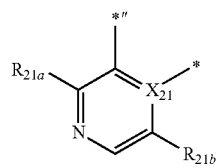
CY21(32) 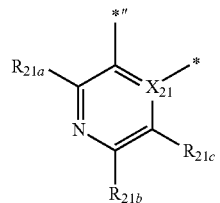
CY21(33) 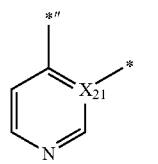
CY21(34) 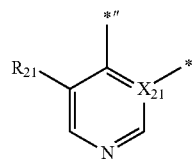
CY21(35) 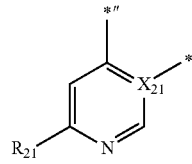
CY21(36) 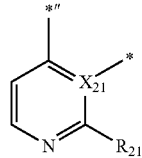
CY21(37) 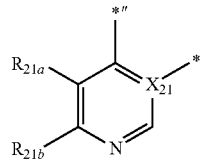
CY21(38) 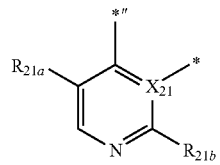
CY21(39) 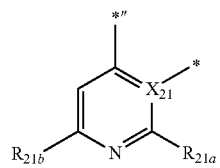
CY21(40) 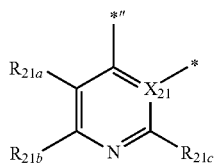
CY21(41) 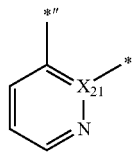
CY21(42) 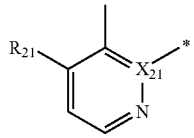
CY21(43) 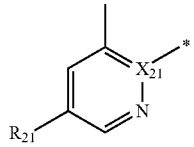
CY21(44) 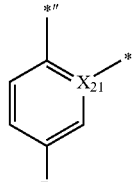
CY21(45) 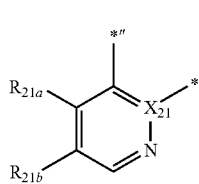
CY21(46) 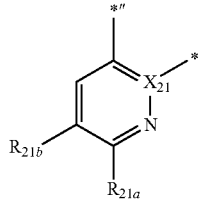
CY21(47) 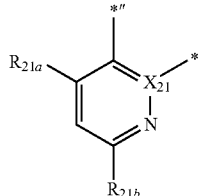

CY21(48)

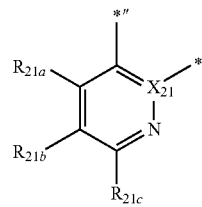

CY21(49)

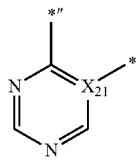

CY21(50)

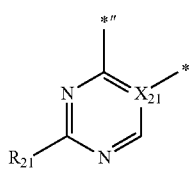

CY21(51)

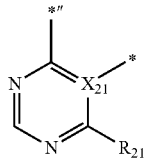

CY21(52)

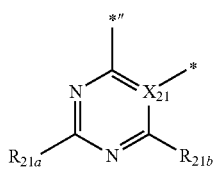

CY21(53)

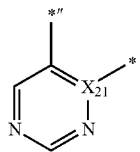

CY21(54)

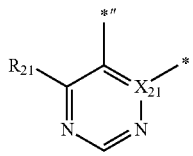

CY21(55)

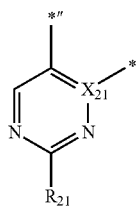

CY21(56)

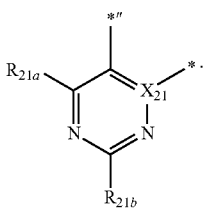

In Formulae CY21 (1) to CY21(56), $X_{21}$ and $R_{21}$ may each independently be the same as described herein, $R_{21a}$ to $R_{21d}$ may each independently be the same as defined in connection with $R_{21}$, wherein $R_{21}$ and $R_{21a}$ to $R_{21d}$ are not each independently hydrogen,

*''' indicates a binding site to a carbon atom of a neighboring 6-membered ring in Formula 2, and

* indicates a binding site to M in Formula 1.

In Formula 1, $L_2$ may be bidentate ligands each linked via M in Formula 1 and O, S, C, N, or P.

For example, in Formula 1, $L_2$ may be bidentate ligands each linked via M in Formula 1 and O, S, N, or P.

In one embodiment, in Formula 1, $L_2$ may be bidentate ligands linked via M in Formula 1 and O.

In one or more embodiments, in Formula 1, $L_2$ may be a monodentate ligand, for example, $I^-$, $Br^-$, $Cl^-$, sulfide ion, nitrate ion, azide ion, hydroxide ion, cyanate ion, isocyanate ion, thiocyanate ion, water, acetonitrile, pyridine, ammonia, carbon monoxide, $P(Ph)_3$, $P(Ph)_2CH_3$, $PPh(CH_3)_2$, or $P(CH_3)_3$, but embodiments of the present disclosure are not limited thereto.

In one or more embodiments, in Formula 1, $L_2$ may be a bidentate ligand, for example, oxalate ion, acetylacetonate ion, picolinic acid, 1,2-bis(diphenylphosphino)ethane, 1,1-bis(diphenylphosphino)methane, glycinate ion, or ethylenediamine, but embodiments of the present disclosure are not limited thereto.

In one or more embodiments, in Formula 1, $L_2$ may be a group represented by Formulae 3A to 3F:

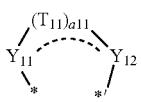

3A

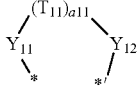

3B

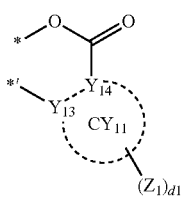

3C

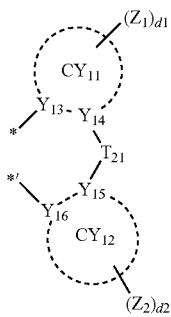
3D

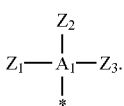
3E $$*-C\equiv C-Z_1$$

3F $$Z_1-\underset{\underset{*}{|}}{\overset{\overset{Z_2}{|}}{A_1}}-Z_3.$$

In Formulae 3A to 3F, $Y_{11}$ may be O, N, N($Z_1$), P($Z_1$)($Z_2$), or As($Z_1$)($Z_2$), $Y_{12}$ may be O, N, N($Z_3$), P($Z_3$)($Z_4$), or As($Z_3$)($Z_4$), $T_{11}$ may be a single bond, a double bond, *—C($Z_{11}$)($Z_{12}$)—*', *—C($Z_{11}$)=C($Z_{12}$)—*', *=C($Z_{11}$)—*', *—C($Z_{11}$)=*', *=C($Z_{11}$)—C($Z_{12}$)=C($Z_{13}$)—*', *—C($Z_{11}$)=C($Z_{12}$)—C($Z_{13}$)=*', *—N($Z_{11}$)—*', or a $C_5$-$C_{30}$ carbocyclic group that is unsubstituted or substituted with a $Z_{11}$, a11 may be an integer from 1 to 10, $Y_{13}$ to $Y_{16}$ may each independently be C or N, $T_{21}$ may be a single bond, a double bond, O, S, C($Z_{11}$)($Z_{12}$), Si($Z_{11}$)($Z_{12}$), or N($Z_{11}$), ring CY11 and ring $CY_{12}$ may each independently be a $C_3$-$C_{60}$ carbocyclic group or a $C_1$-$C_{60}$ heterocyclic group, $A_1$ may be P or As, $Z_1$ to $Z_4$ and $Z_{11}$ to $Z_{13}$ may each independently be the same as defined in connection with $R_{21}$, d1 and d2 may each independently be an integer from 0 to 10, and

* and *' each indicate a binding site to M in Formula 1.

In Formulae 3A to 3F, the $C_3$-$C_{60}$ carbocyclic group and the $C_1$-$C_{60}$ heterocyclic group may each independently be the same as described elsewhere herein. The rings $CY_{11}$ and $CY_{12}$ may each independently be the same as defined in connection with $CY_{21}$.

For example, in Formula 1, $L_2$ may be a group represented by Formulae 3-1 to 3-125, but embodiments of the present disclosure are not limited thereto:

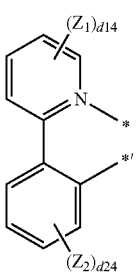
3-1

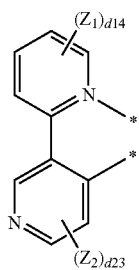
3-2

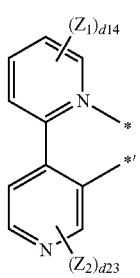
3-3

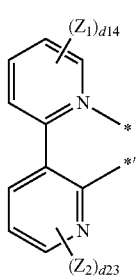
3-4

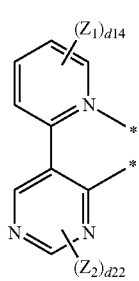
3-5

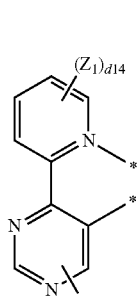
3-6

3-7 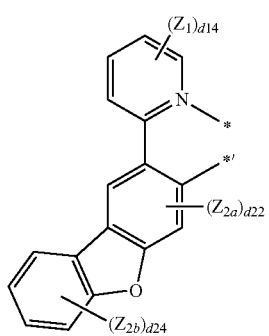
3-8 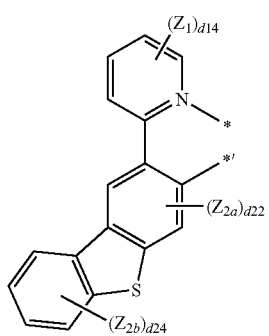
3-9 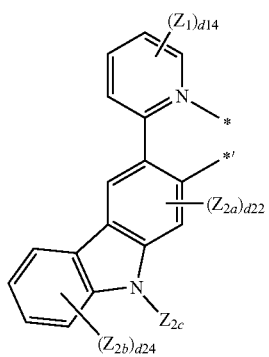
3-10 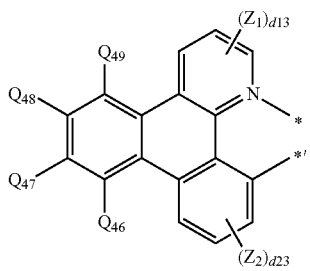
3-11 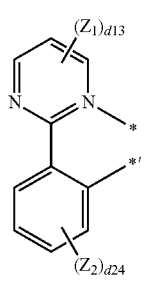
3-12 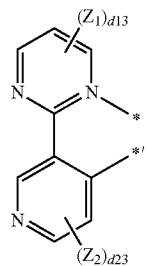
3-13 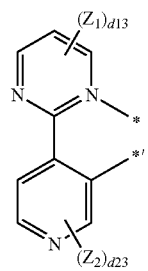
3-14 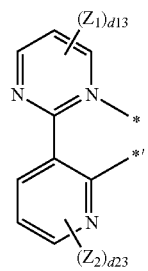
3-15 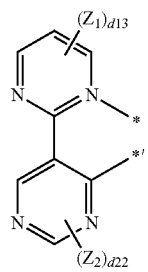
3-16 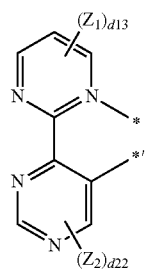

3-17 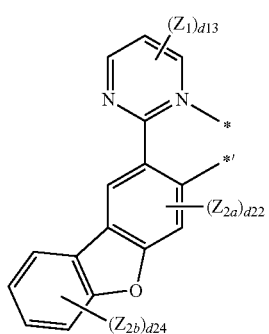
3-18 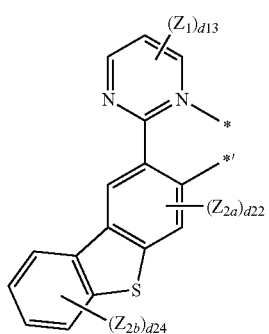
3-19 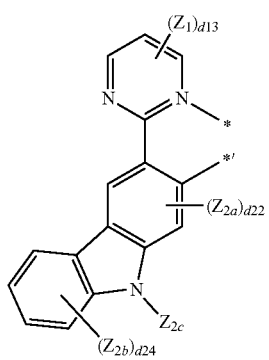
3-20 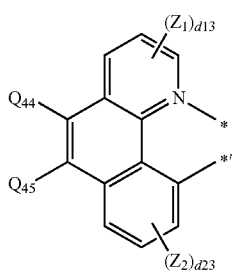
3-21 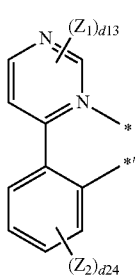
3-22 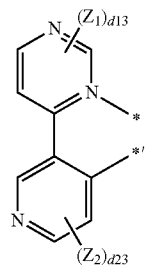
3-23 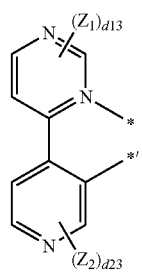
3-24 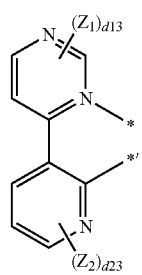
3-25 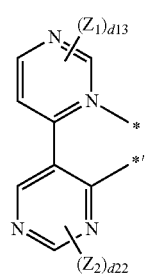
3-26 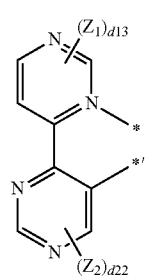

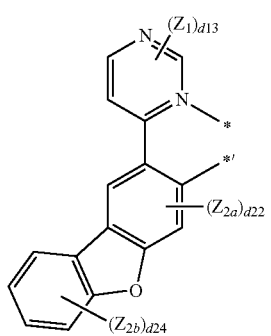
3-27
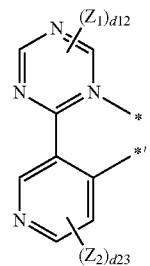
3-32
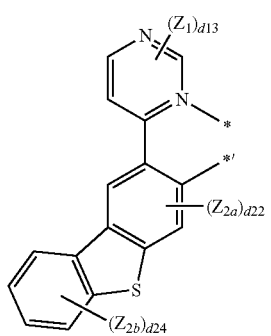
3-28
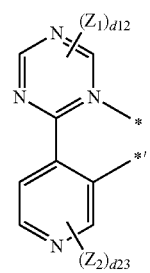
3-33
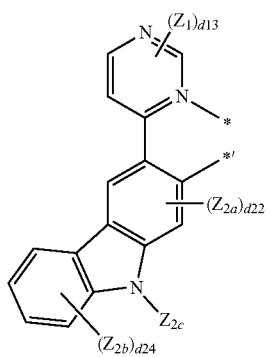
3-29
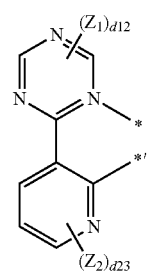
3-34
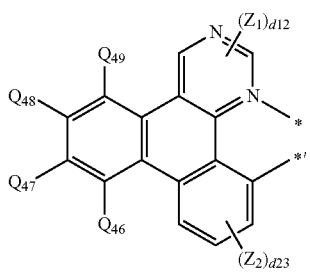
3-30
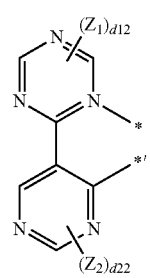
3-35
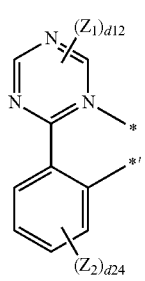
3-31
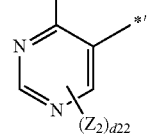
3-36

3-37 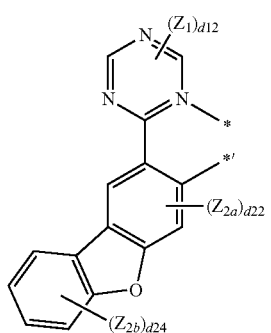
3-38 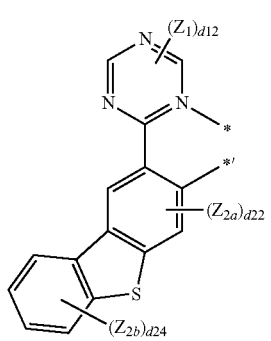
3-39 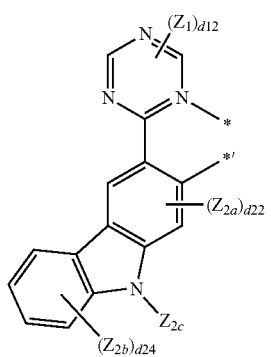
3-40 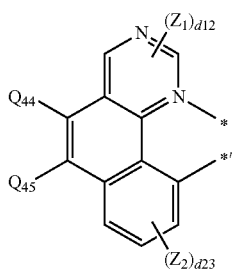
3-41 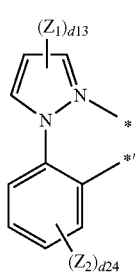
3-42 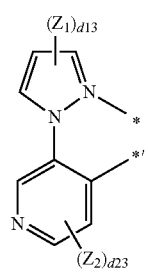
3-43 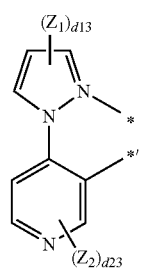
3-44 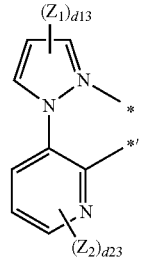
3-45 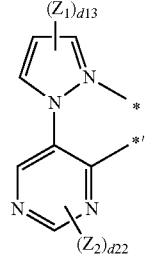
3-46 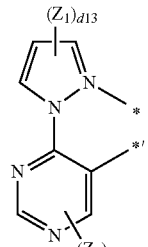

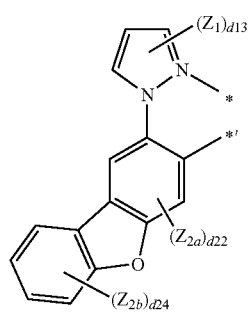
3-47
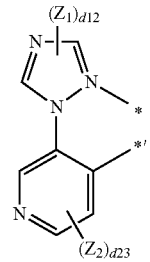
3-52
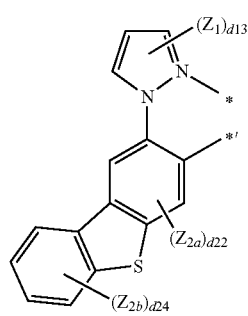
3-48
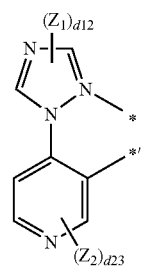
3-53
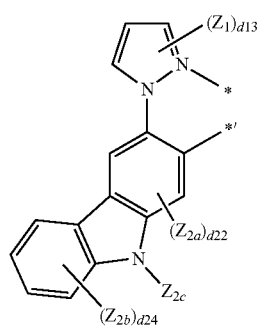
3-49
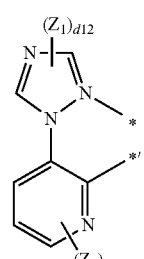
3-54
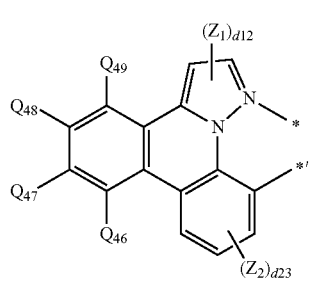
3-50
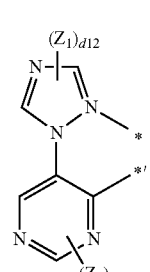
3-55
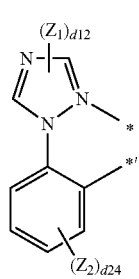
3-51
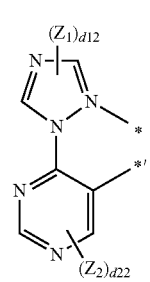
3-56

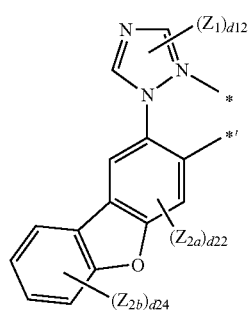
3-57
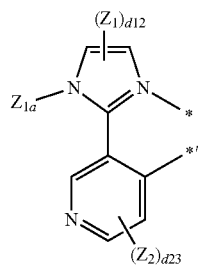
3-62
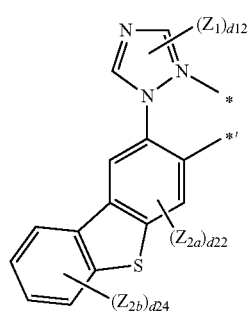
3-58
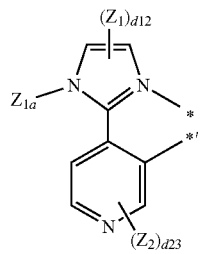
3-63
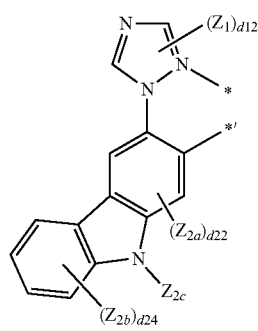
3-59
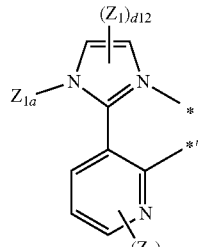
3-64
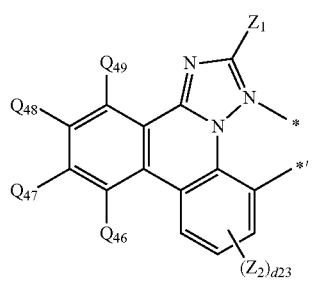
3-60
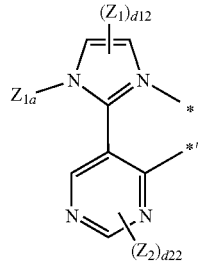
3-65
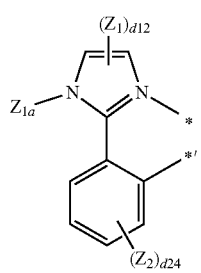
3-61
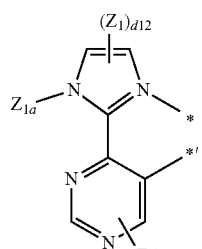
3-66

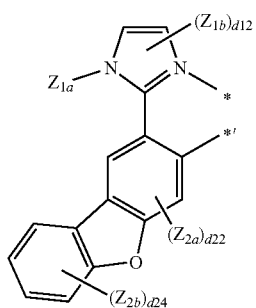
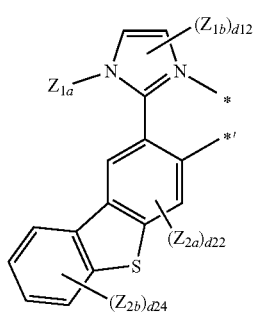
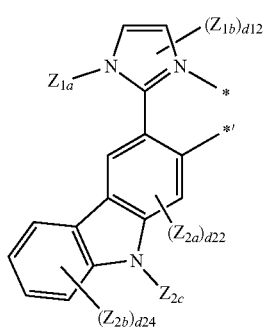
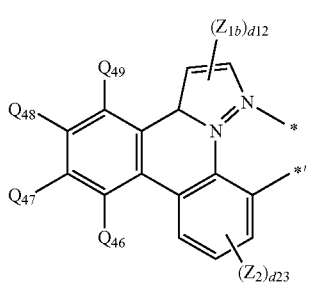
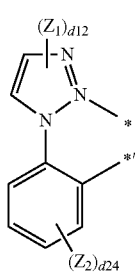
3-67
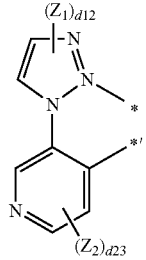
3-68
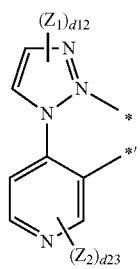
3-68
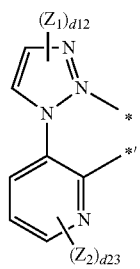
3-69
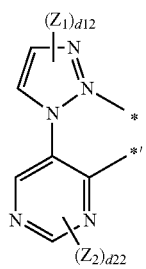
3-71
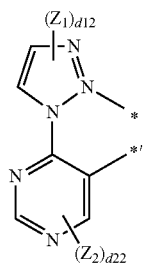
3-72
3-73
3-74
3-75
3-76
3-77
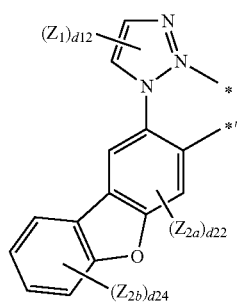

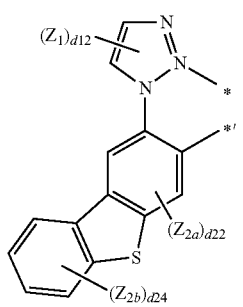
3-78
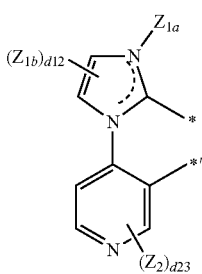
3-83
3-79
3-84
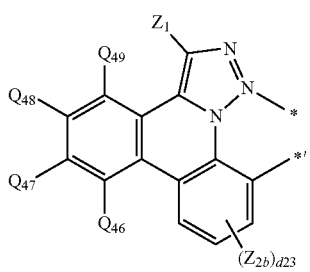
3-80
3-85
3-81
3-86
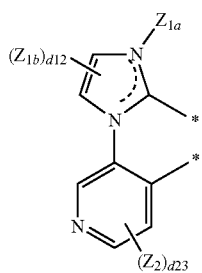
3-82
3-87

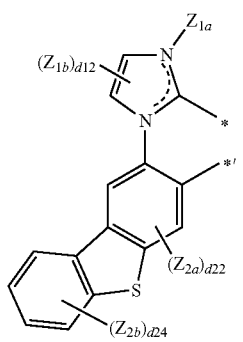
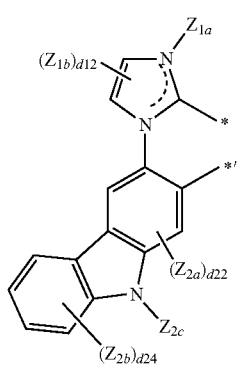
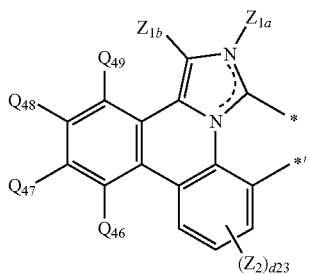
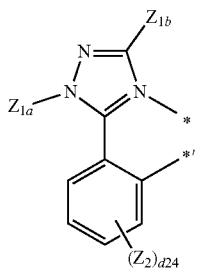
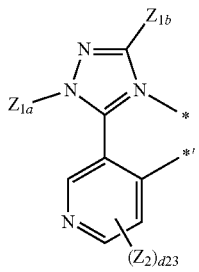
3-88
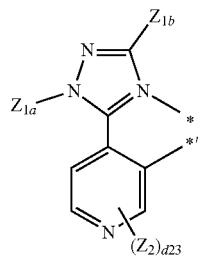
3-89
3-90
3-91
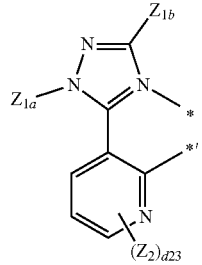
3-92
3-93
3-94
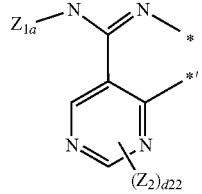
3-95
3-96
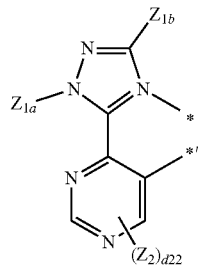
3-97
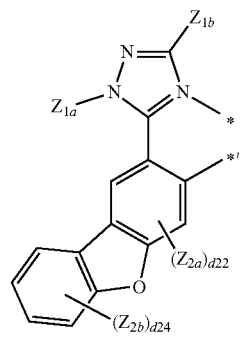

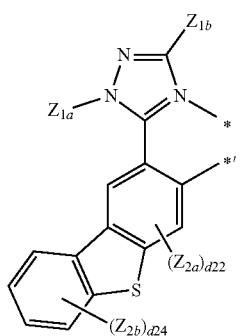
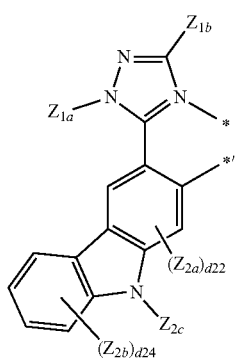
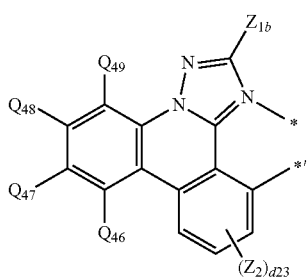
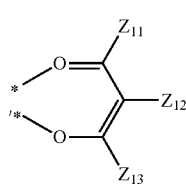
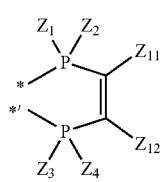
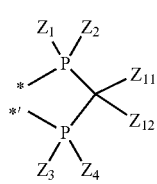
3-98
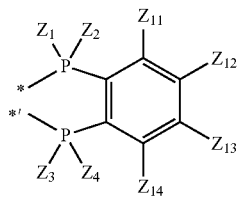
3-99
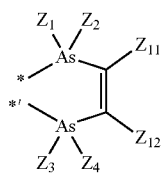
3-100
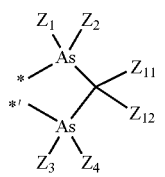
3-111
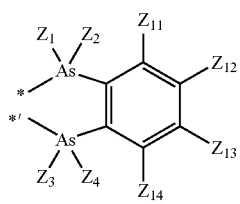
3-112
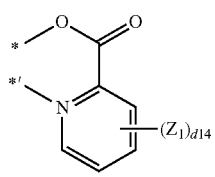
3-113
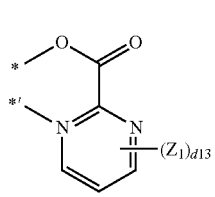
3-114
3-115
3-116
3-117
3-118
3-119
3-120
3-121

-continued

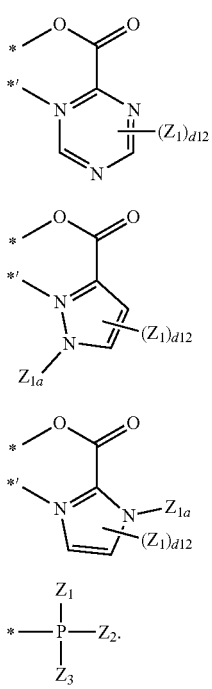

In Formulae 3-1 to 3-125,
$Z_1$ to $Z_4$, $Z_1a$, $Z_1b$, $Z_2a$ to $Z_2c$, and $Z_{11}$ to $Z_{14}$ may each independently be the same as defined in connection with $R_{21}$,
d14 and d24 may each independently be an integer from 0 to 4,
d13 and d23 may each independently be an integer from 0 to 3,
d12 and d22 may each independently be an integer from 0 to 2, and
* and *' each indicate a binding site to M in Formula 1.

For example, in Formula 1, n2 may be 1 or 2, and $L_2$ may be a group represented by Formulae 3-111 to 3-125, but embodiments of the present disclosure are not limited thereto.

The organometallic compound represented by Formula 1 may emit red light, for example, red light having a maximum emission wavelength in a range of about 550 nanometers (nm) or more, for example, about 550 nm to about 900 nm (in one embodiment, a maximum emission wavelength in a range of about 575 nm to about 650 nm).

In the present specification, the terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" as used herein each refer to a hetero ring having the same backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group", respectively, in which carbon atoms constituting the foregoing rings is substituted with a nitrogen.

The organometallic compound represented by Formula 1 may be, for example, one of Compounds 1 to 78, but embodiments of the present disclosure are not limited thereto:

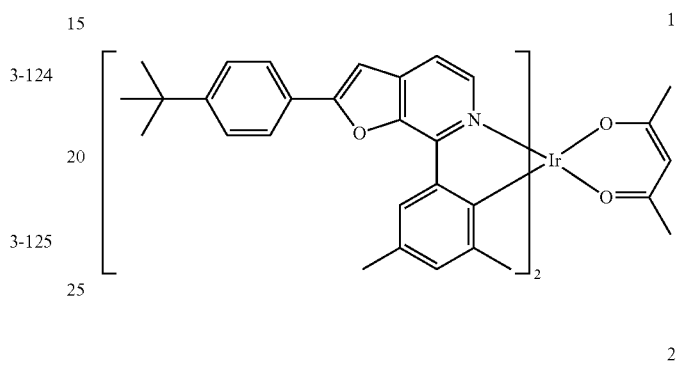

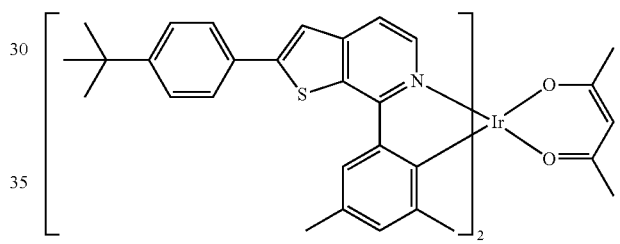

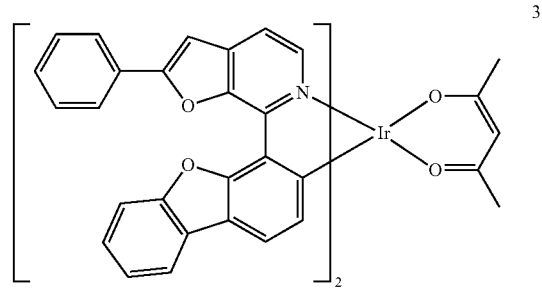

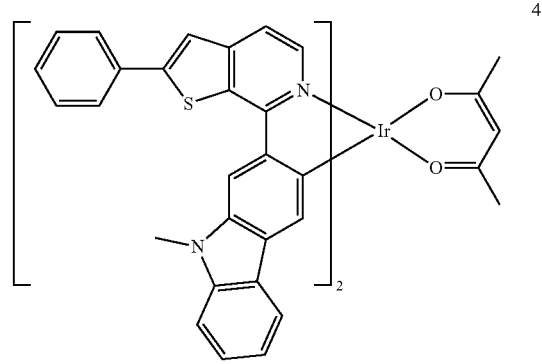

5
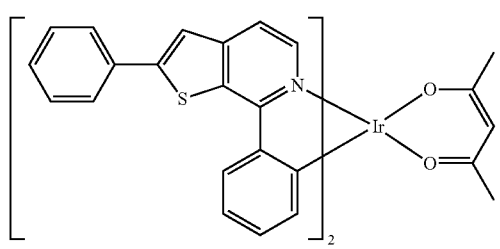
6
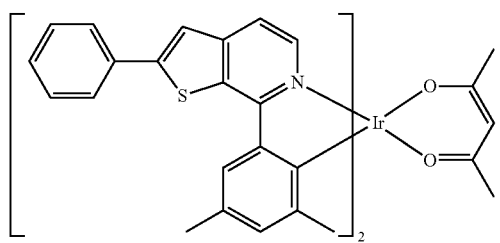
7
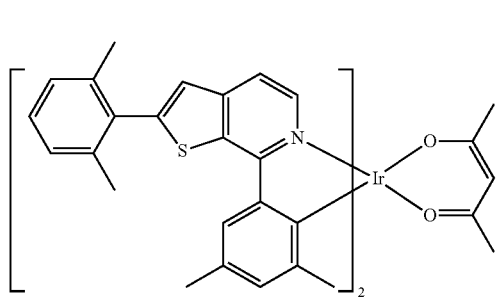
8
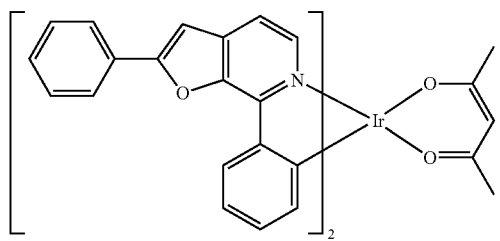
9
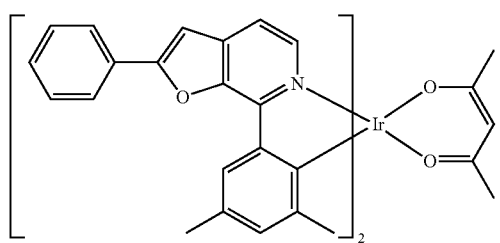
10
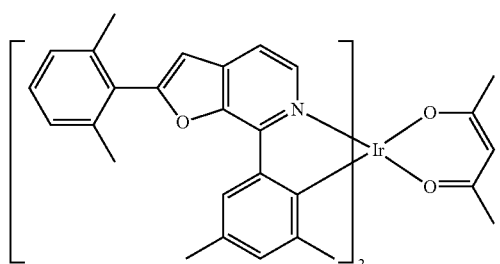
11
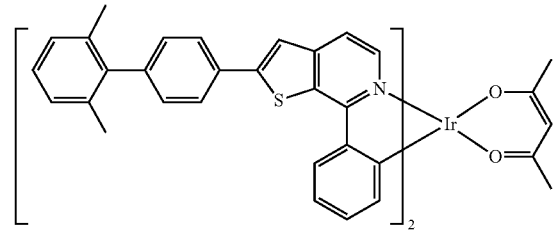
12
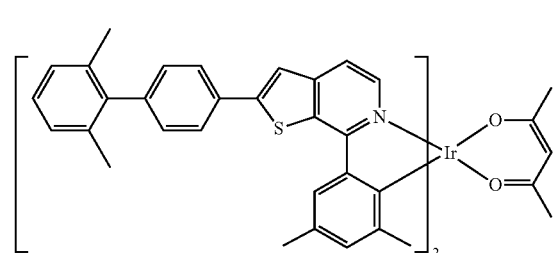
13
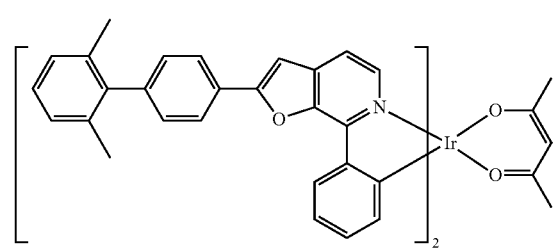
14
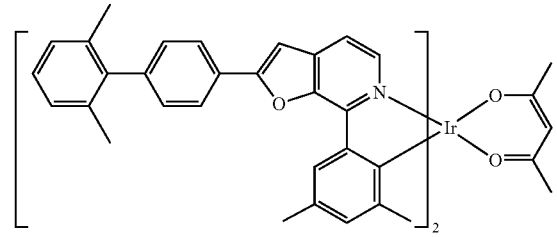
15
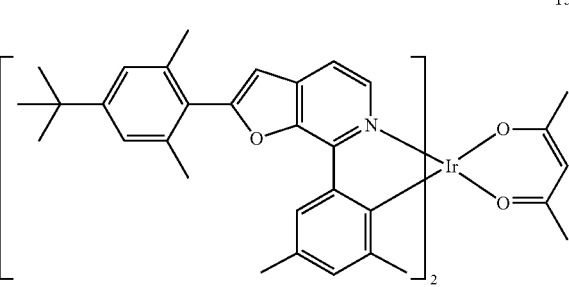
16
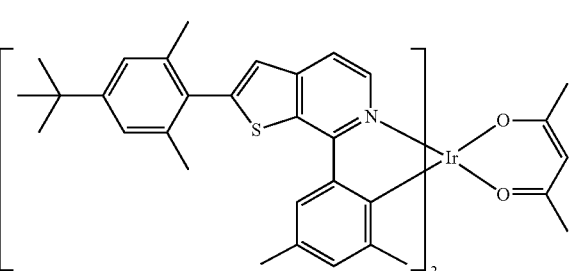

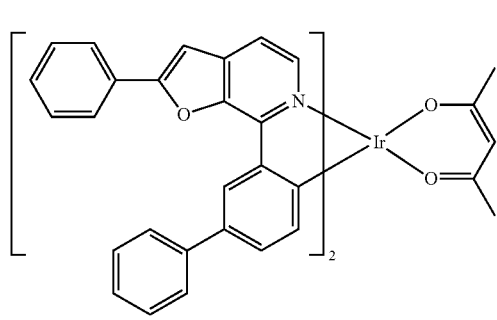
17
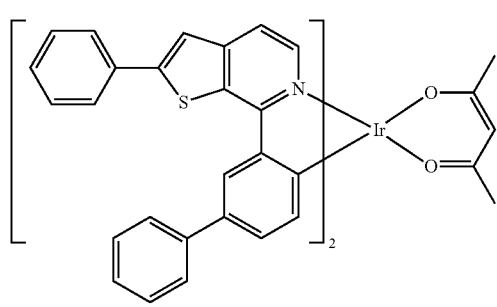
18
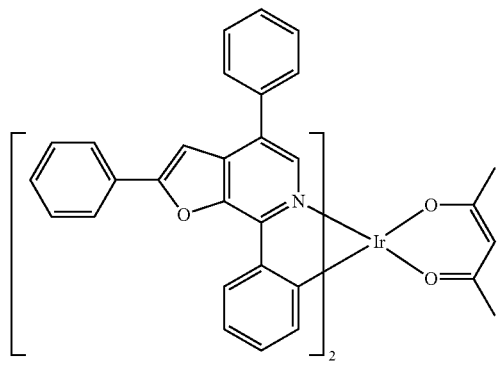
19
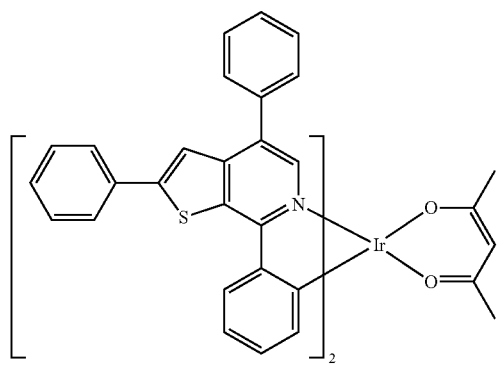
20
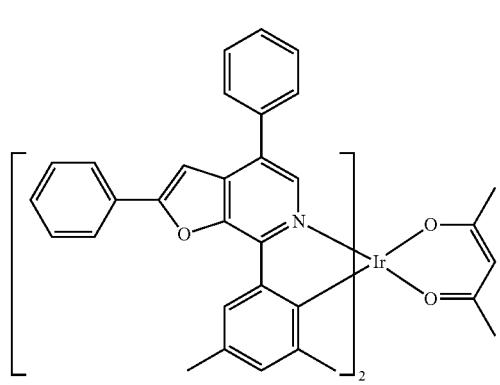
21
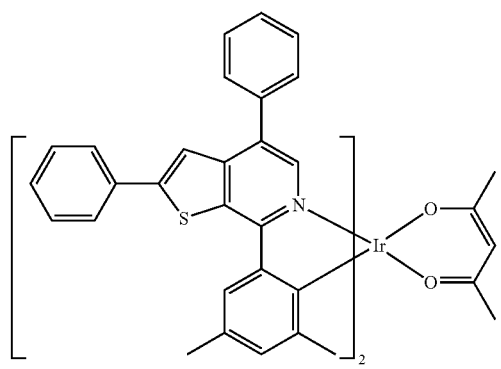
22
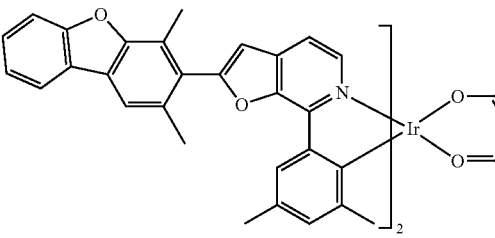
23
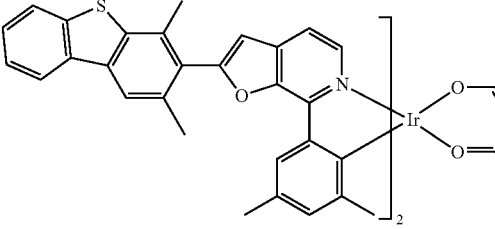
24
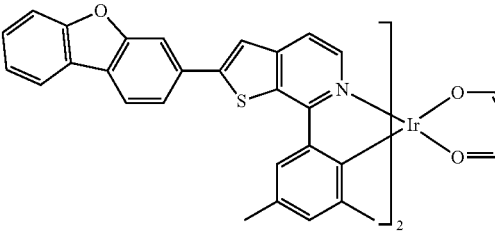
25

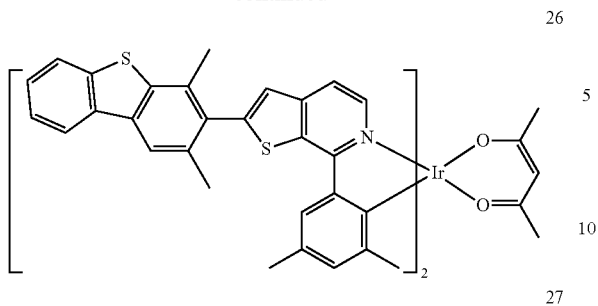
26
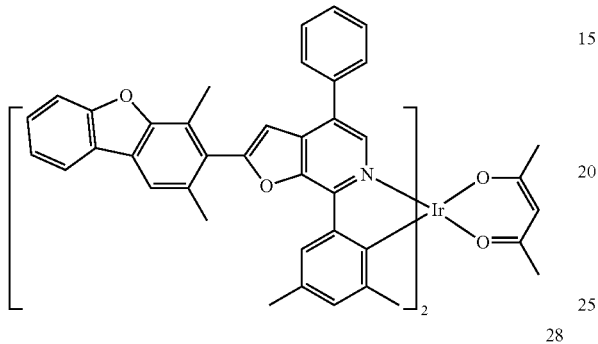
27
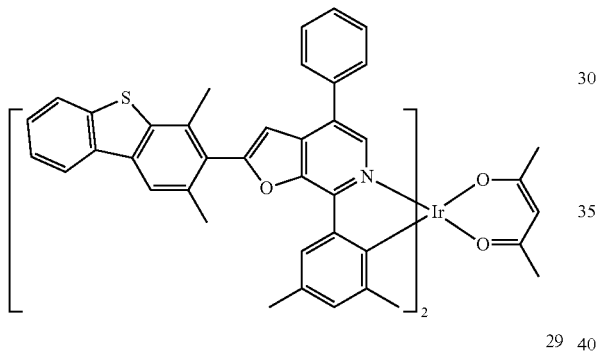
28
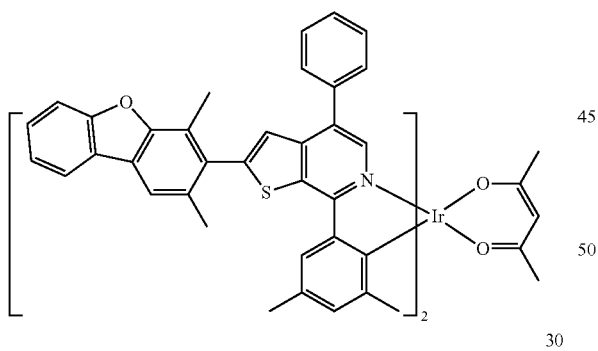
29
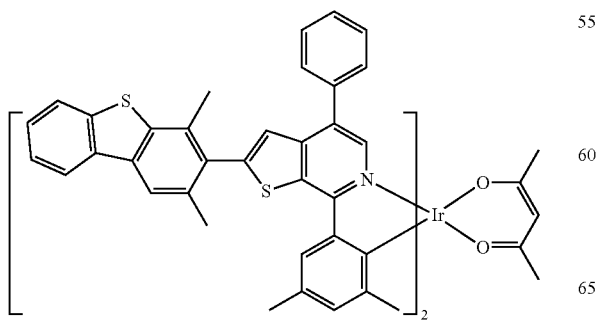
30
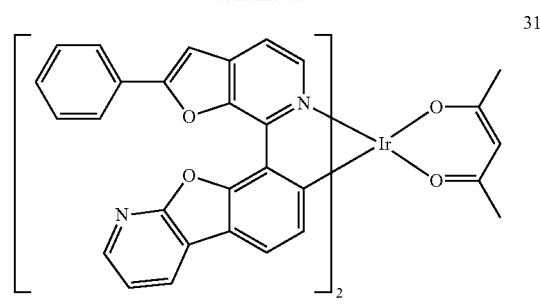
31
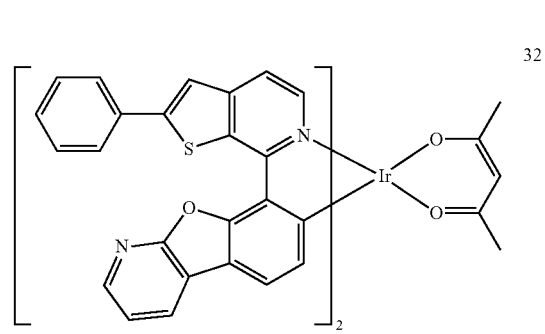
32
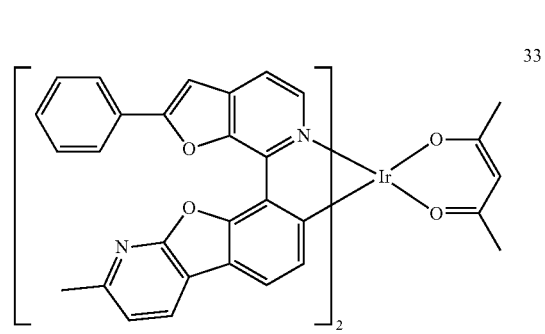
33
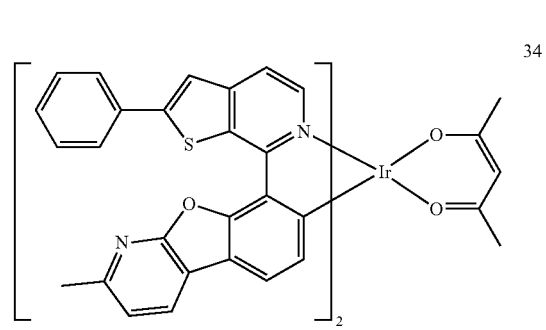
34
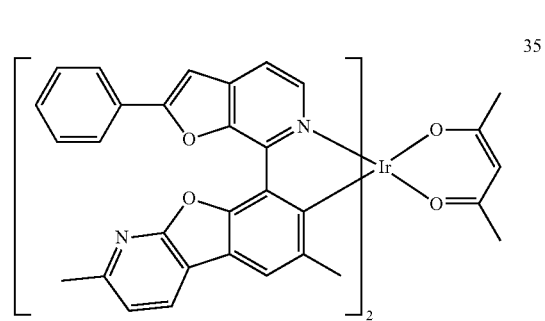
35

36
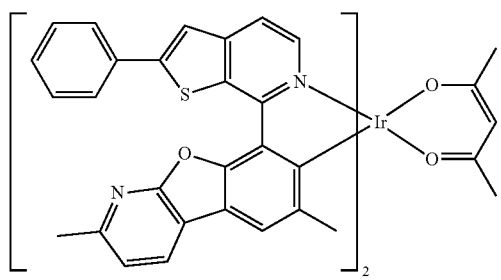
37
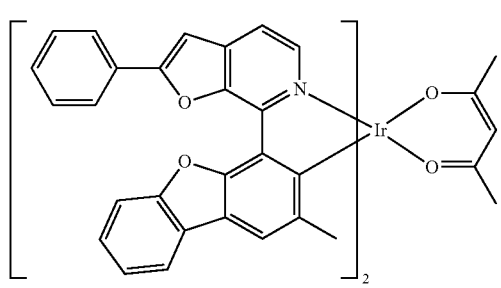
38
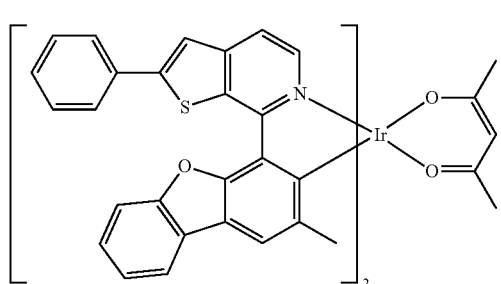
39
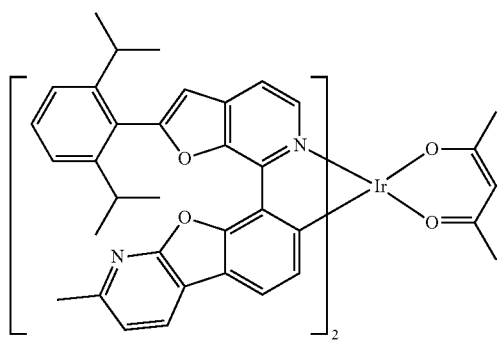
40
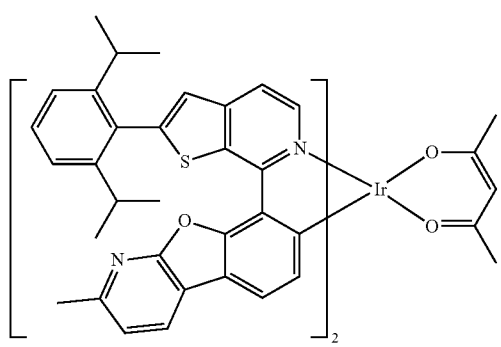
41
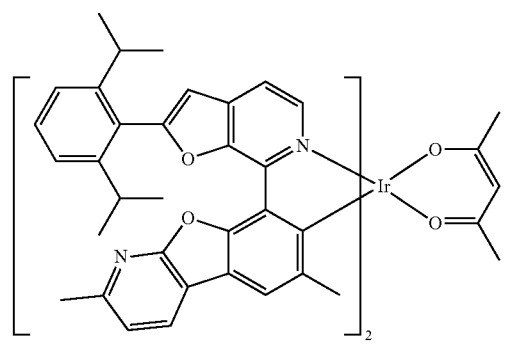
42
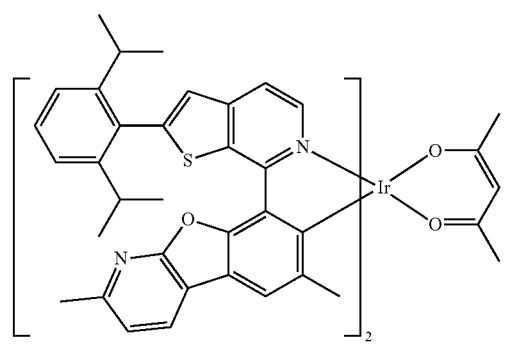
43
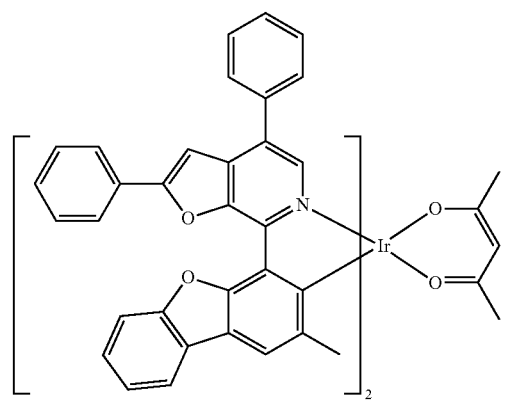
44
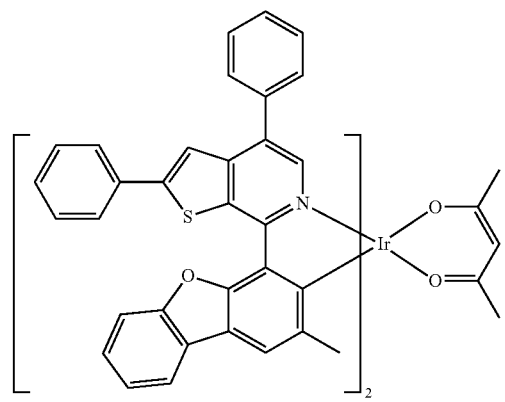

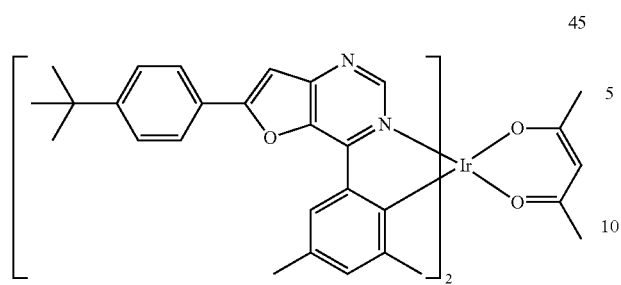
45
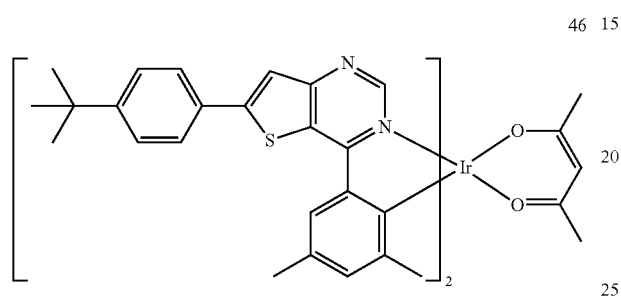
46
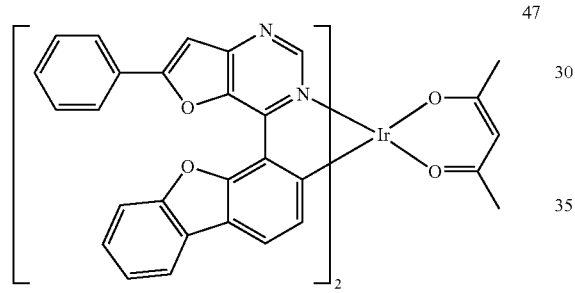
47
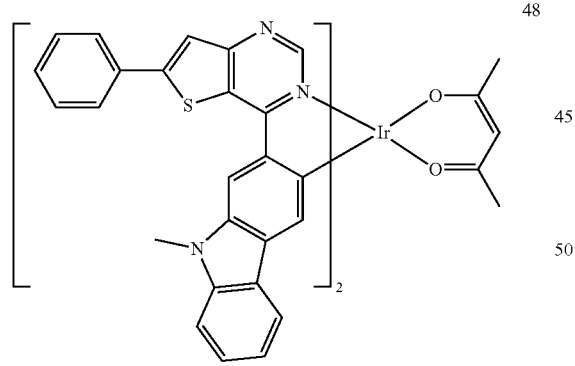
48
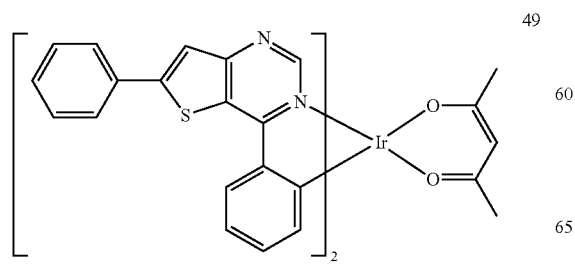
49
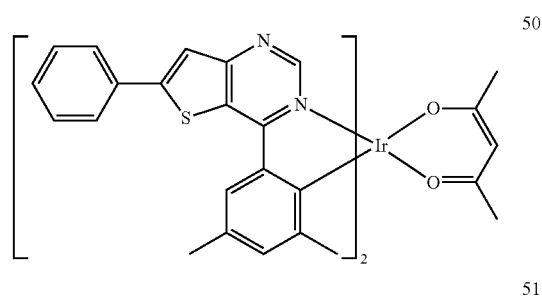
50
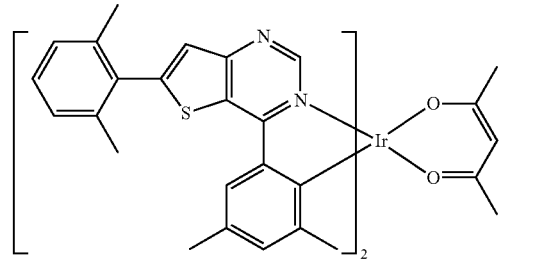
51
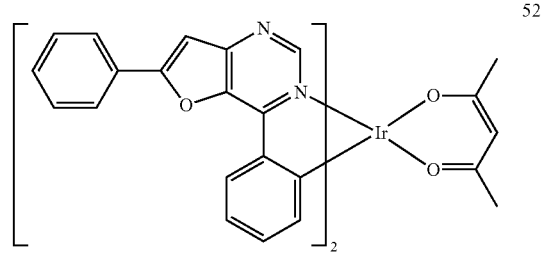
52
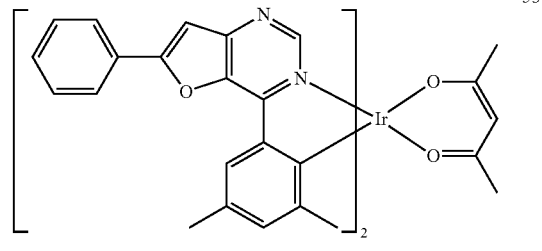
53
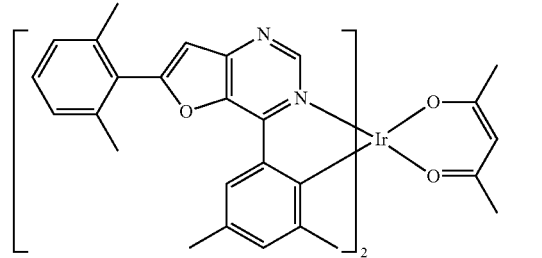
54
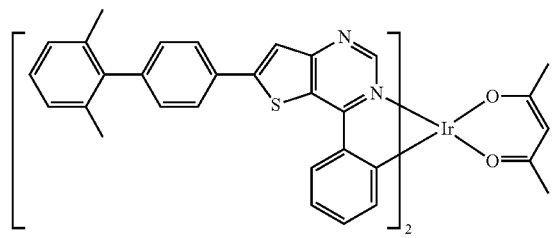
55

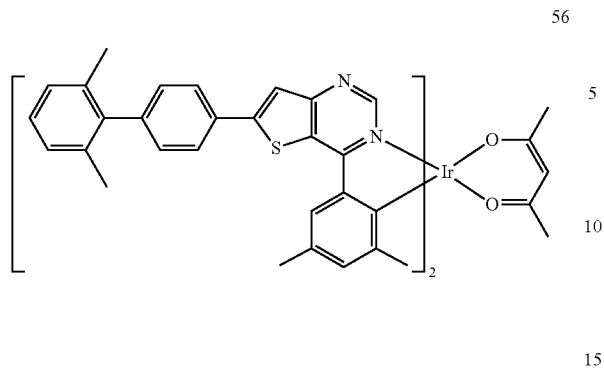
56
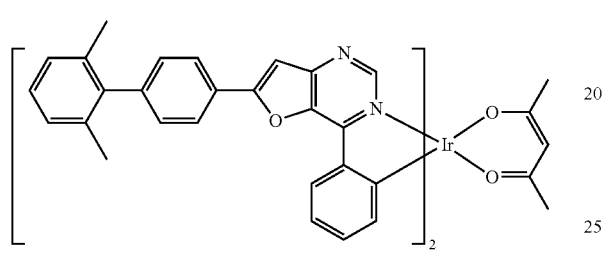
57
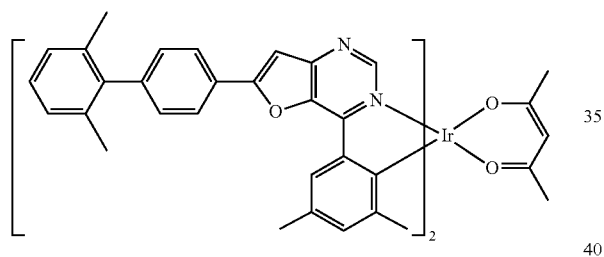
58
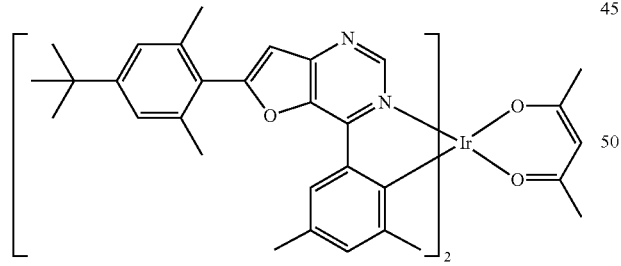
59
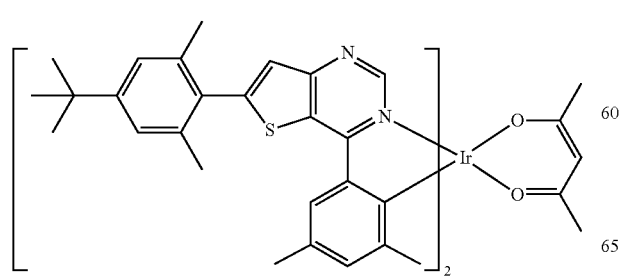
60
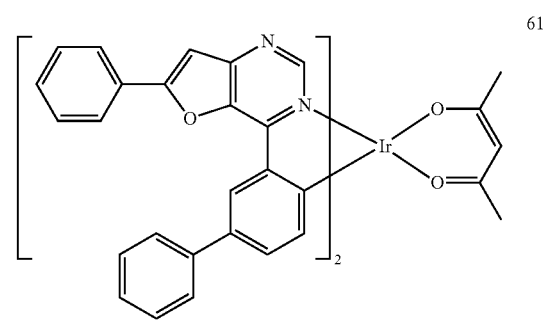
61
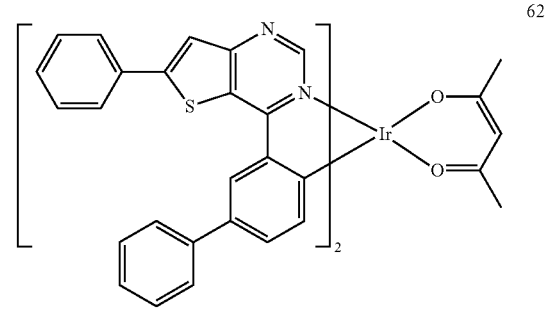
62
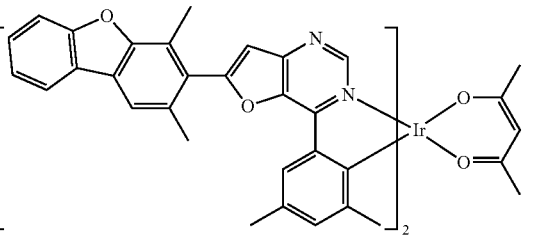
63
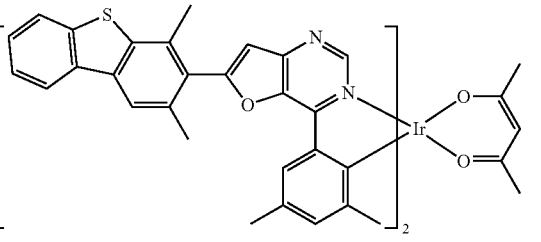
64
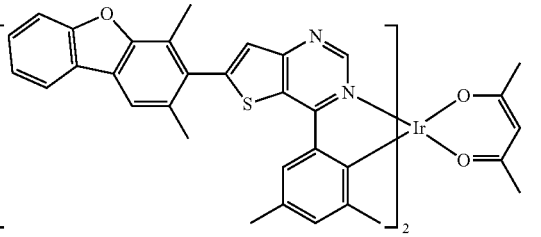
65

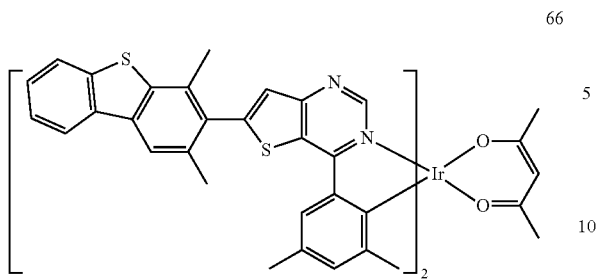
66
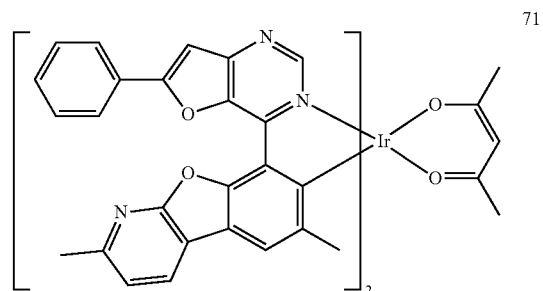
71
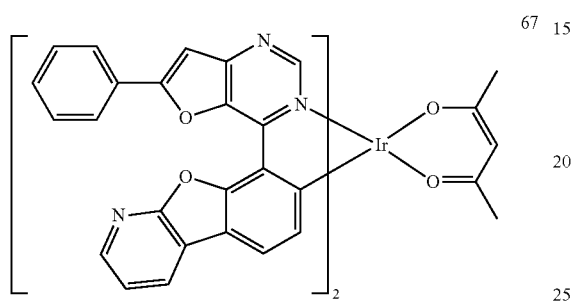
67
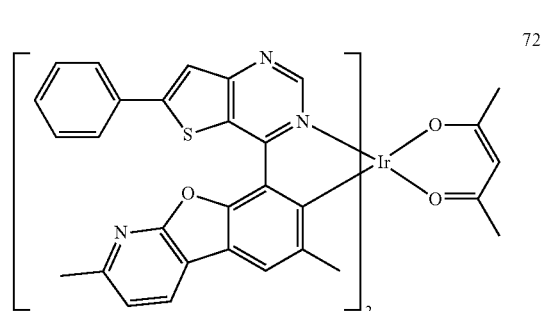
72
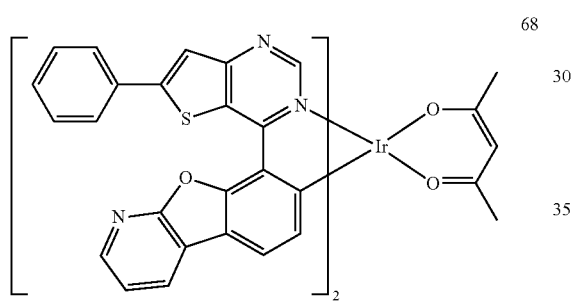
68
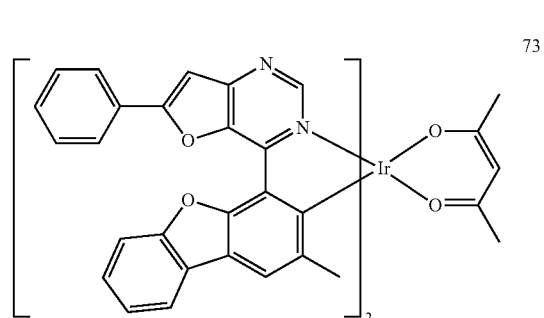
73
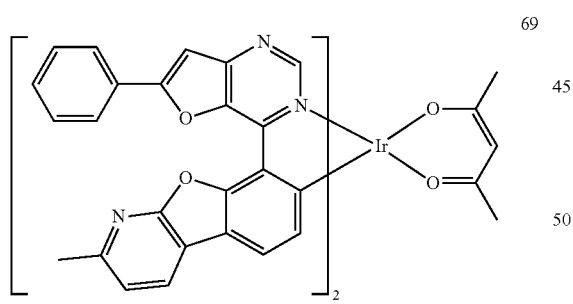
69
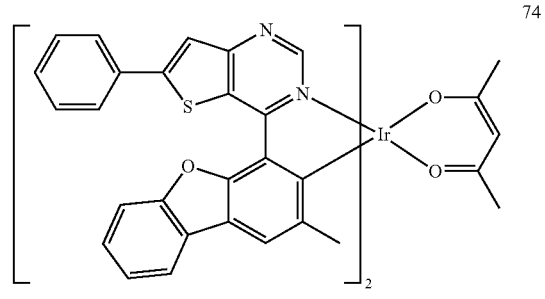
74
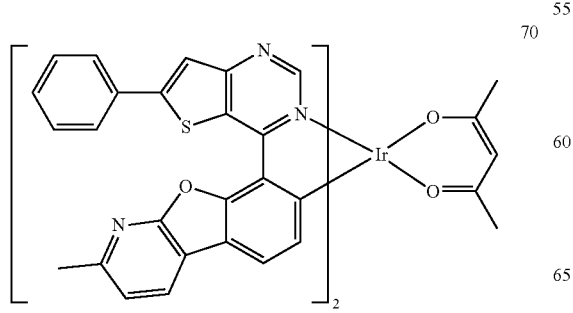
70
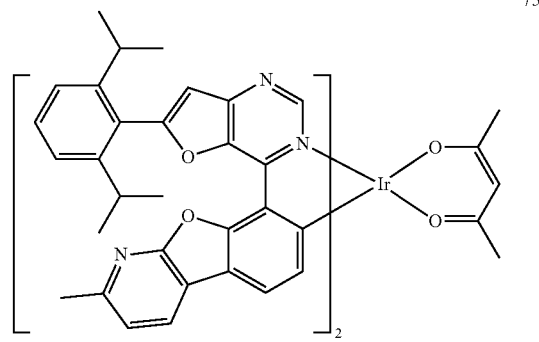
75

-continued

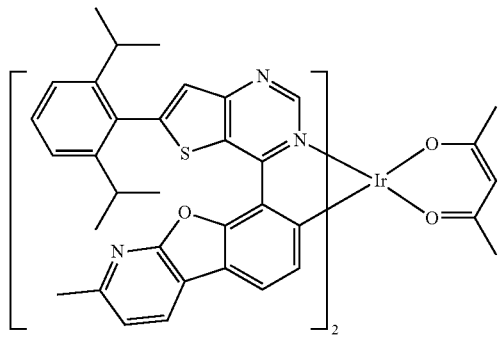

76

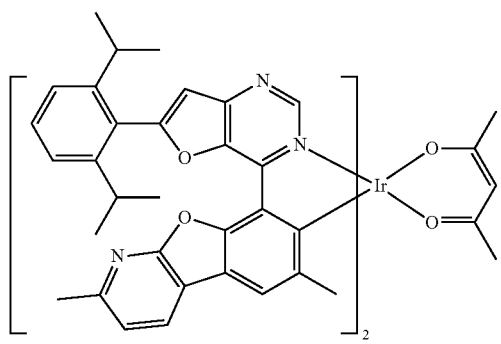

77

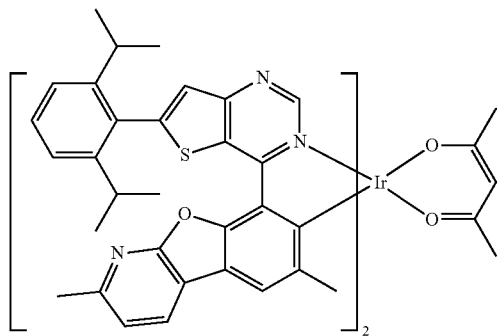

78

In the organometallic compound represented by Formula 1, $L_1$ is a group represented by Formula 2, the number n1 of $L_1$ is 1, 2, or 3. That is, the organometallic compound is a ligand linked to a metal M and includes a group represented by Formula 2.

The group represented by Formula 2 includes ring $CY_1$, and $X_3$ of the 5-membered ring in the group represented by Formula 2 is present at a position illustrated in Formula 2. Therefore, the transition dipole may be increased in a direction of an orientation axis of Formula 1, and the orientation of the organometallic compound represented by Formula 1 may be improved, thereby increasing luminescent efficiency of an electronic device, for example, an organic light-emitting device, which includes the organometallic compound represented by Formula 1.

In Formula 2, ring $CY_1$ and $R_2$ are not linked to each other, and $R_1$ and $R_2$ are not linked to each other. Therefore, it is possible to prevent the transition dipole of Formula 1 from being distorted in a direction other than the orientation axis of Formula 1, thereby increasing luminescent efficiency of an electronic device, for example, an organic light-emitting device, which includes the organometallic compound represented by Formula 1.

Furthermore, in Formula 2, the 5-membered ring does not include *=N—*' (* and *' each indicate a binding site to a neighboring atom) as a ring-forming atom. Therefore, it is possible to prevent a reduction in the inter-molecular bonding force of the organometallic compound represented by Formula 1, thereby preventing a reduction in lifespan of an electronic device, for example, an organic light-emitting device, which includes the organometallic compound represented by Formula 1.

The highest occupied molecular orbital (HOMO), lowest unoccupied molecular orbital (LUMO), and triplet ($T_1$) energy levels of some of the compounds in the organometallic compound represented by Formula 1 were evaluated by using Gaussian 09 program accompanied by molecular structure optimization by a density functional theory (DFT) based on B3LYP, and evaluation results thereof are shown in Table 1.

TABLE 1

| Compound No. | HOMO (eV) | LUMO (eV) | $T_1$ (eV) |
| --- | --- | --- | --- |
| 1 | −4.461 | −1.667 | 2.061 |
| 2 | −4.520 | −1.729 | 2.055 |
| 5 | −4.726 | −1.796 | 2.176 |
| 6 | −4.566 | −1.793 | 2.040 |
| 7 | −4.571 | −1.530 | 2.174 |
| 8 | −4.669 | −1.746 | 2.172 |
| 9 | −4.513 | −1.747 | 2.039 |
| 10 | −4.500 | −1.511 | 2.162 |

From Table 1, it is confirmed that the organometallic compound represented by Formula 1 has such electric characteristics that are suitable for use in an electronic device, for example, for use as a dopant for an organic light-emitting device.

Spin densities of Compounds 1 to 10 and Compounds B to D were measured by using the Gaussian 09 program accompanied by molecular structure optimization by a DFT based on B3LYP, and results thereof are shown in Table 2.

TABLE 2

| Compound No. | Spin density |
| --- | --- |
| 1 | 0.483 |
| 2 | 0.477 |
| 3 | 0.347 |
| 4 | 0.339 |
| 5 | 0.528 |
| 6 | 0.477 |
| 7 | 0.396 |
| 8 | 0.530 |
| 9 | 0.484 |
| 10 | 0.481 |
| B | 0.286 |
| C | 0.174 |
| D | 0.303 |

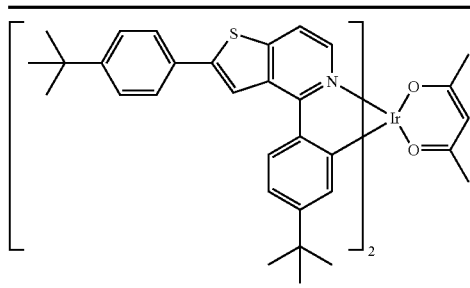

B

TABLE 2-continued

| Compound No. | Spin density |
|---|---|
| 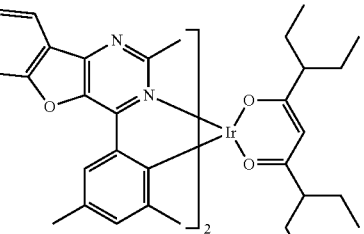 C | |
| 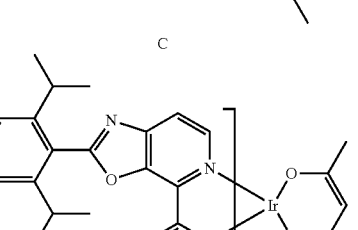 D | |

From Table 2, it is confirmed that the organometallic compound represented by Formula 1 has a high spin density (for example, 0.33 or more, for example, 0.33 to 1.0), as compared with Compounds B to D, thereby obtaining spin orbital coupling with relative high probability. Therefore, an electronic device, for example, an organic light-emitting device, which includes the organometallic compound represented by Formula 1, may have high luminescent efficiency.

Synthesis methods of the organometallic compound represented by Formula 1 may be understood by one of ordinary skill in the art by referring to Synthesis Examples provided below.

The organometallic compound represented by Formula 1 is suitable for use in an organic layer of an organic light-emitting device, for example, for use as a dopant in an emission layer of the organic layer. Thus, another aspect provides an organic light-emitting device that includes: a first electrode; a second electrode; and an organic layer that is disposed between the first electrode and the second electrode and includes an emission layer and the organometallic compound represented by Formula 1.

The organic light-emitting device may have, due to the inclusion of an organic layer including the organometallic compound represented by Formula 1, a low driving voltage, high efficiency, high power, high quantum efficiency, a long lifespan, a low roll-off ratio, excellent color purity, or a combination thereof.

The organometallic compound represented by Formula 1 may be used between a pair of electrodes of the organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host). The emission layer may emit red light, for example, red light having a maximum emission wavelength of about 550 nm or more (for example, in a range of about 550 nm to about 900 nm).

The expression "(an organic layer) includes organometallic compounds" used herein may include a case in which "(an organic layer) includes one organometallic compound represented by Formula 1" and a case in which "(an organic layer) includes two or more different organometallic compounds represented by Formula 1."

For example, the organic layer may include, as the organometallic compound, only Compound 1. In this regard, Compound 1 may exist in an emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 all may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

In one embodiment, in the organic light-emitting device, the first electrode is an anode, and the second electrode is a cathode, and the organic layer further includes a hole transport region between the first electrode and the emission layer and an electron transport region between the emission layer and the second electrode, and the hole transport region includes a hole injection layer, a hole transport layer, an electron blocking layer, a buffer layer, or any combination thereof, and the electron transport region includes a hole blocking layer, an electron transport layer, an electron injection layer, or any combination thereof.

The term "organic layer" as used herein refers to a single layer and/or a plurality of layers between the first electrode and the second electrode of the organic light-emitting device. The "organic layer" may include, in addition to an organic compound, an organometallic complex including metal.

FIGURE a schematic view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be materials with a high work function to facilitate hole injection. The first electrode 11 may be a reflective electrode, a semi-transmissive electrode, or a transmissive electrode. The material for forming the first electrode may be, for example, indium tin oxide (ITO), indium zinc oxide (IZO), tin oxide ($SnO_2$), or zinc oxide (ZnO). In one or more embodiments, magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 110 is not limited thereto.

The organic layer 15 may be disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

A hole injection layer may be formed on the first electrode 11 by using one or more suitable methods such as vacuum deposition, spin coating, casting, or Langmuir-Blodgett (LB) deposition.

When a hole injection layer is formed by vacuum deposition, the deposition conditions may vary according to a compound that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 (angstroms per second) Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or a combination thereof:

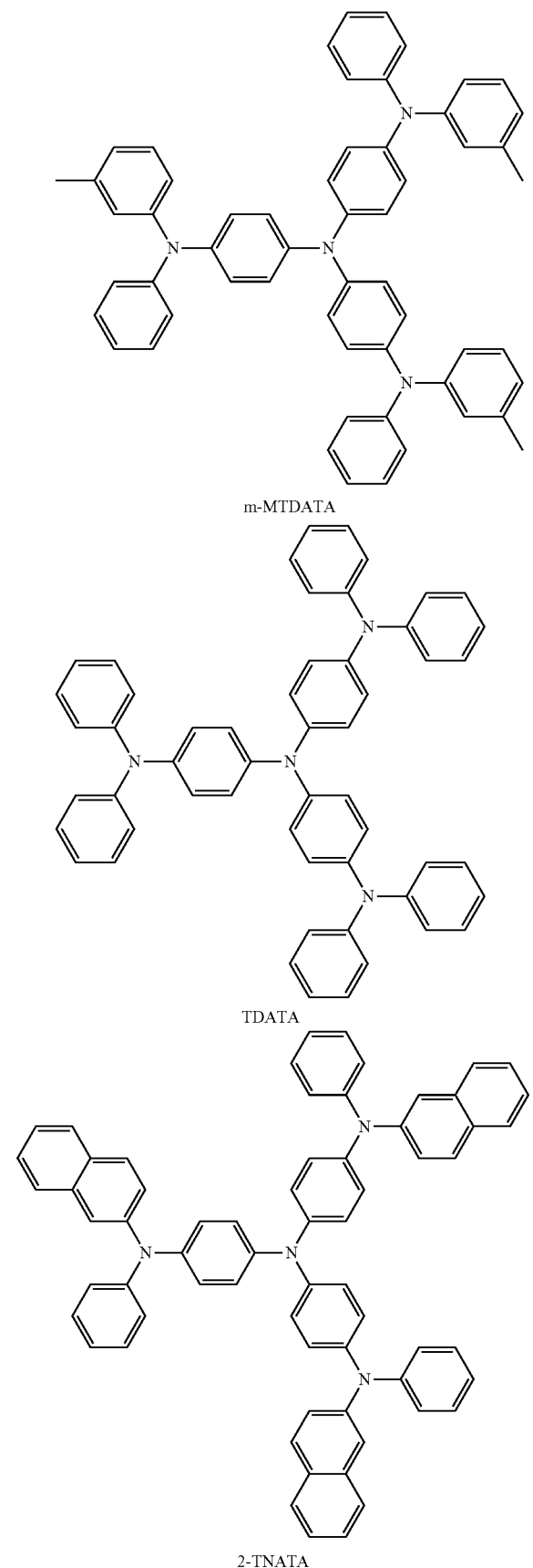

m-MTDATA

TDATA

2-TNATA

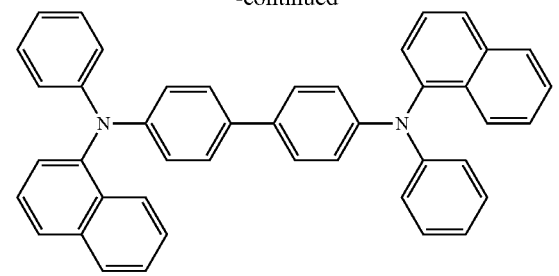

NPB

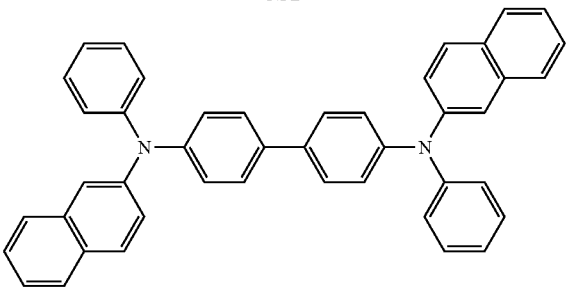

β-NPB

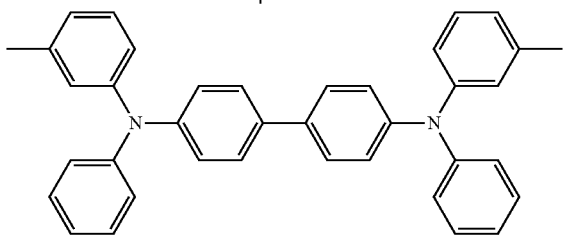

TPD

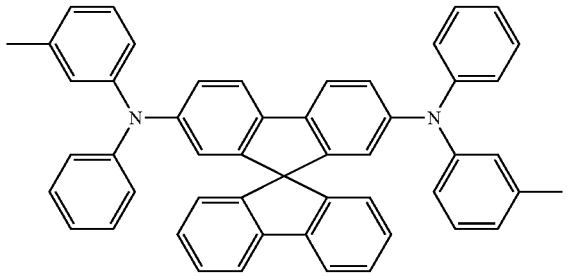

Spiro-TPD

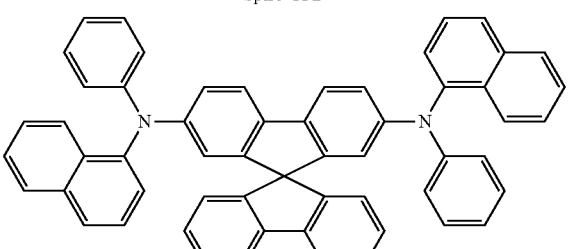

Spiro-NPB

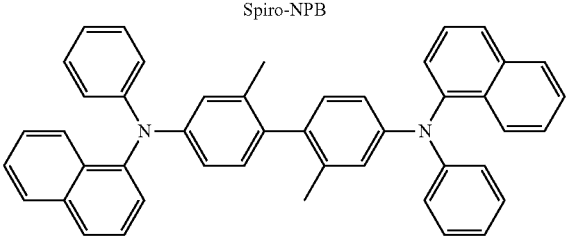

methylated NPB

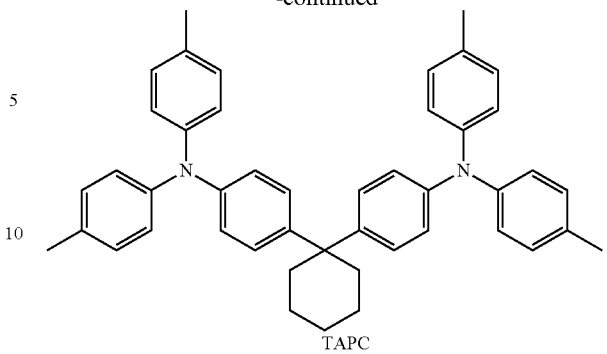

TAPC

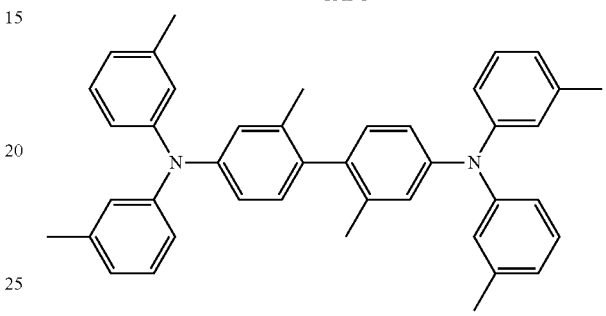

HMTPD

Formula 201

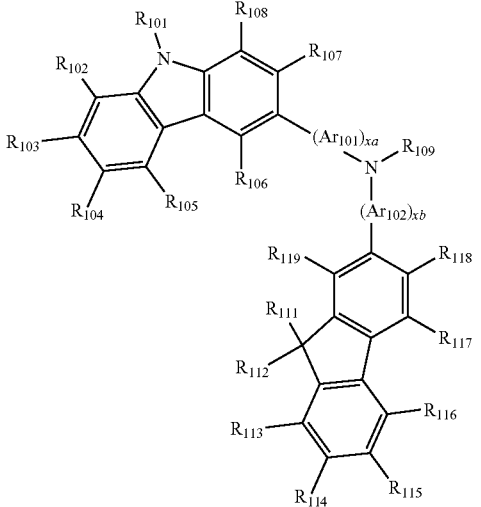

Formula 202

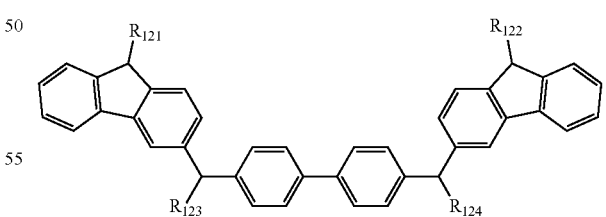

$Ar_{101}$ and $Ar_{102}$ in Formula 201 may each independently be:
a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

In Formula 201, xa and xb may each independently be an integer from 0 to 5, or may be 0, 1, or 2. For example, xa may be 1 and xb may be 0, but xa and xb are not limited thereto.

$R_{101}$ to $R_{108}$, $R_{111}$ to $R_{119}$, and $R_{121}$ to $R_{124}$ in Formulae 201 and 202 may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), or a $C_1$-$C_{10}$ alkoxy group (for example, a methoxy group, an ethoxy group, a propoxy group, a butoxy group, or a pentoxy group, and so on);

a $C_1$-$C_{10}$ alkyl group or a $C_1$-$C_{10}$ alkoxy group, each substituted with a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, or a phosphoric acid group or a salt thereof;

a phenyl group, a naphthyl group, an anthracenyl group, a fluorenyl group, or a pyrenyl group; or a phenyl group, a naphthyl group, an anthracenyl group, a fluorenyl group, and a pyrenyl group, each substituted with a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, or a $C_1$-$C_{10}$ alkoxy group, but embodiments of the present disclosure are not limited thereto.

$R_{109}$ in Formula 201 may be:
a phenyl group, a naphthyl group, an anthracenyl group, or a pyridinyl group; or
a phenyl group, a naphthyl group, an anthracenyl group, and a pyridinyl group, each substituted with a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, or a pyridinyl group.

In one embodiment, the compound represented by Formula 201 may be represented by Formula 201A, but embodiments of the present disclosure are not limited thereto:

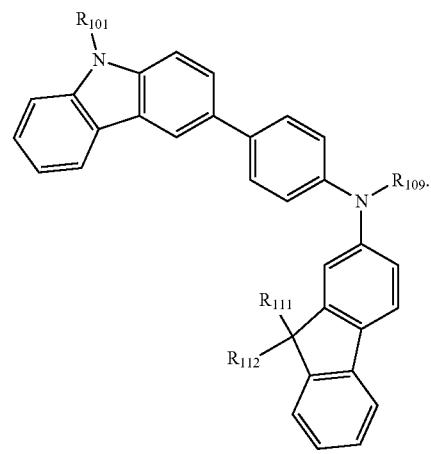

Formula 201A $R_{101}$, $R_{111}$, $R_{112}$, and $R_{109}$ in Formula 201A may be understood by referring to the description provided herein.

For example, the compound represented by Formula 201, and the compound represented by Formula 202 may include compounds HT1 to HT20 illustrated below, but are not limited thereto:

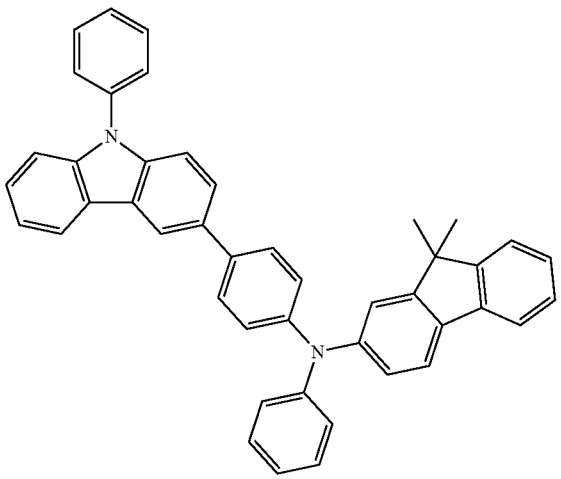

HT1

HT2
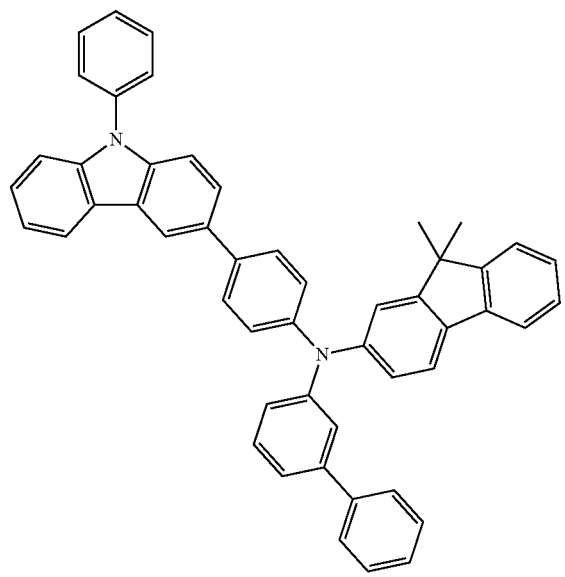
HT4
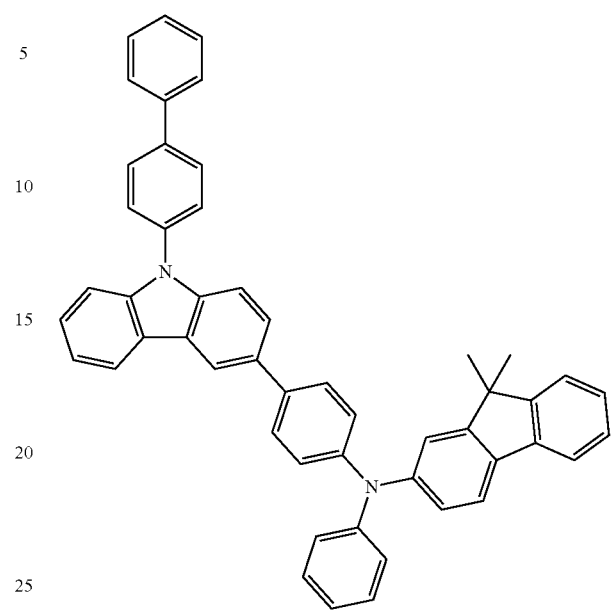
HT3
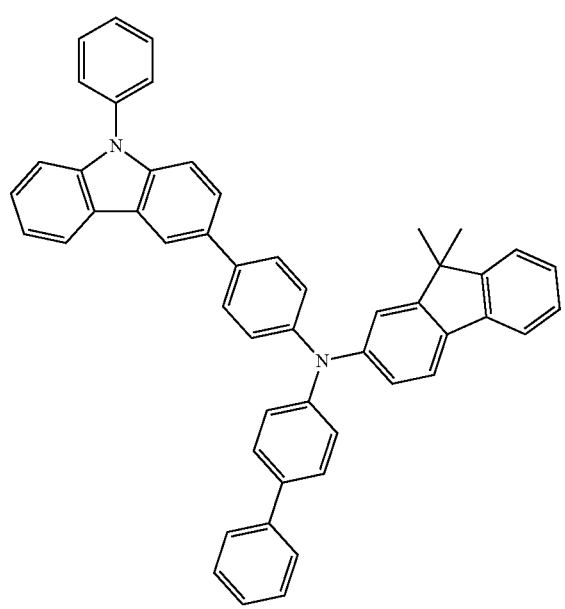
HT5
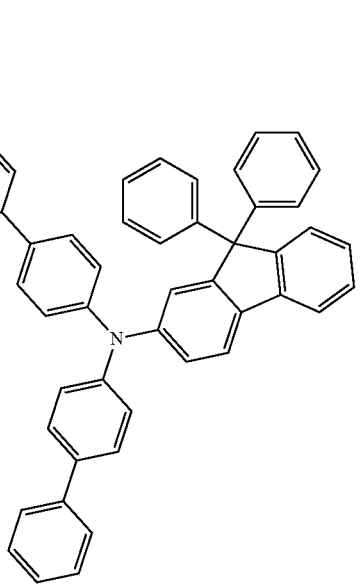

HT6
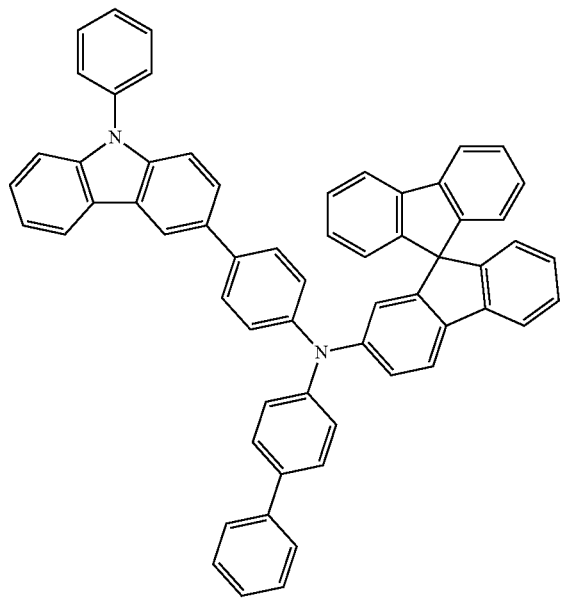
HT7
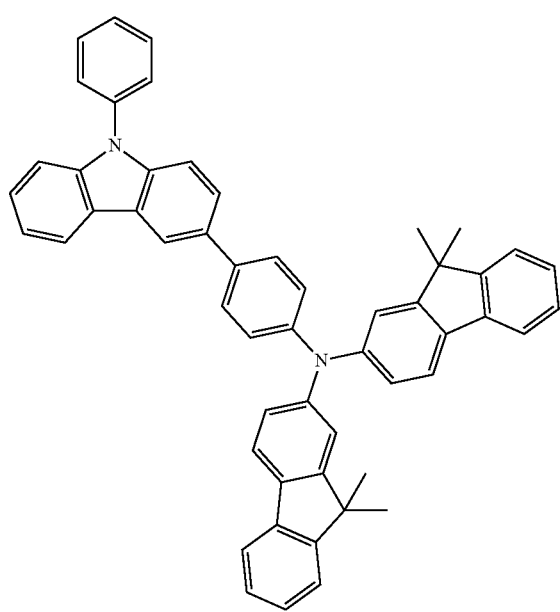
HT8
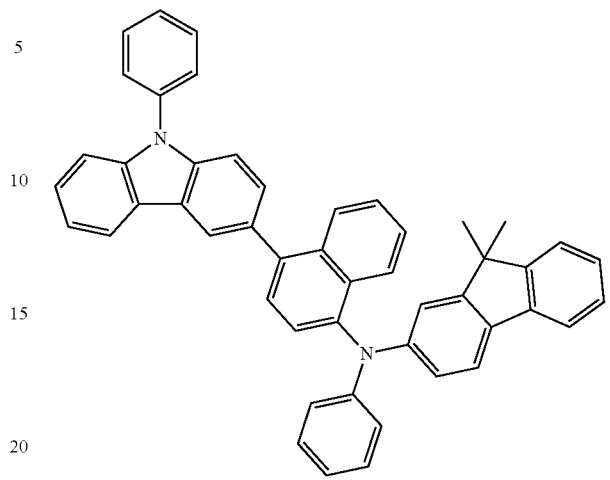
HT9
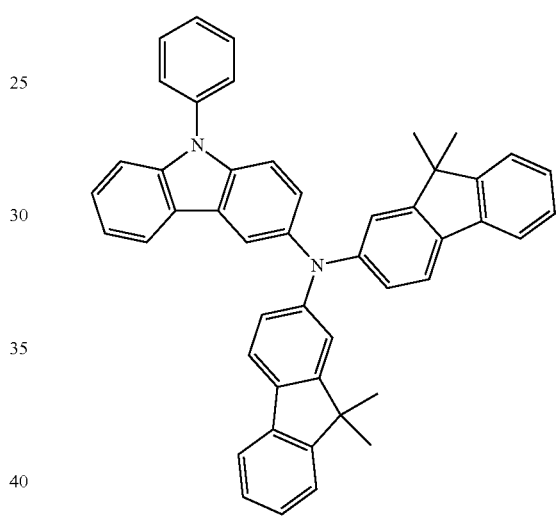
HT10
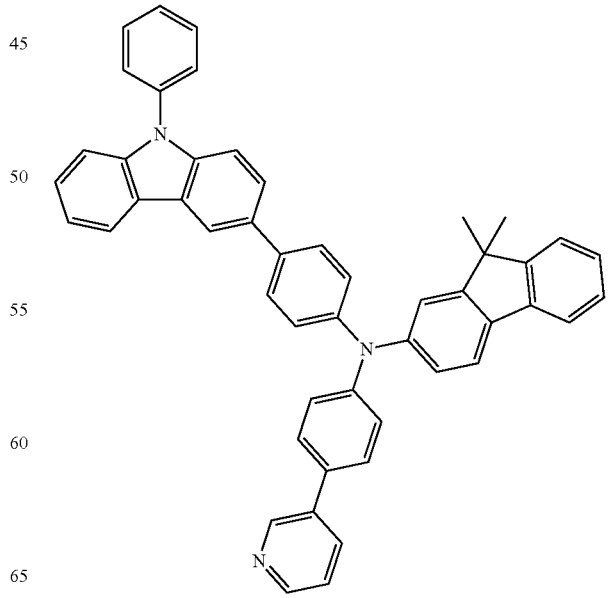

HT11
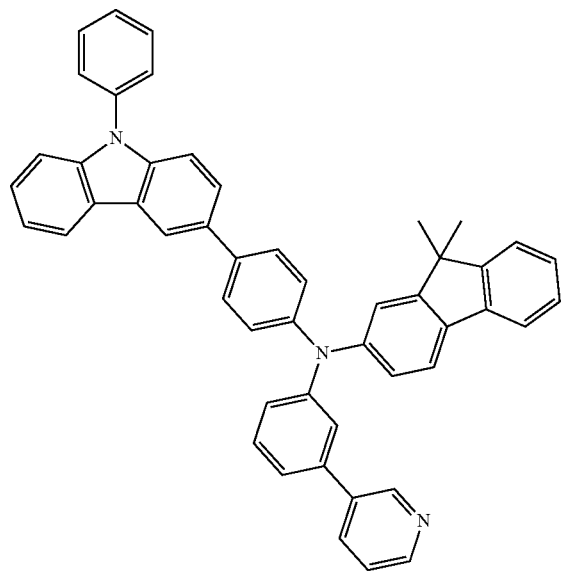
HT14
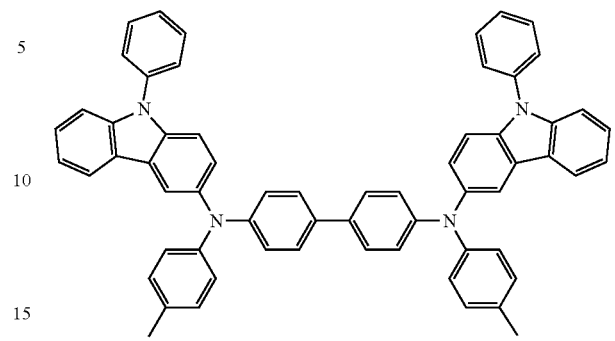
HT12
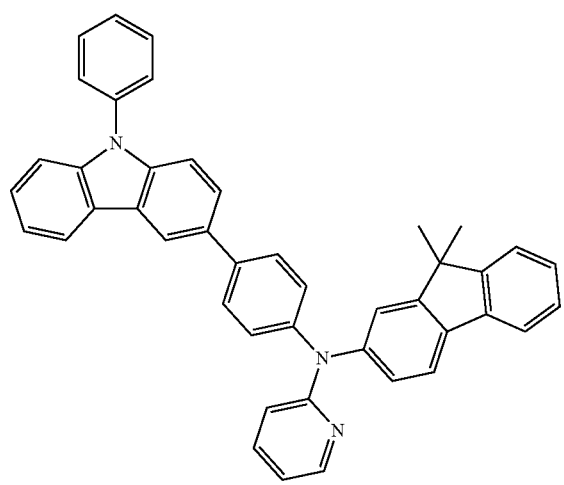
HT15
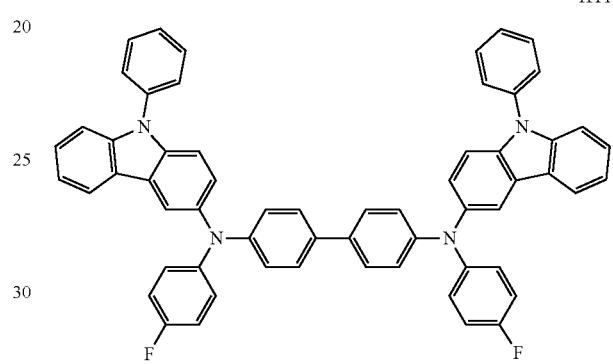
HT16
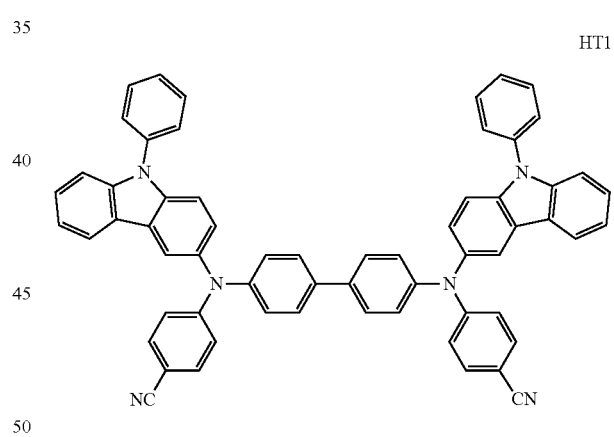
HT13
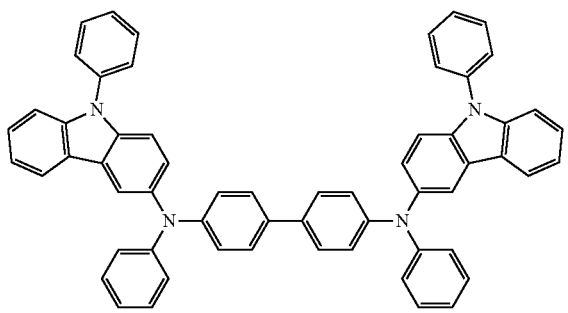
HT17
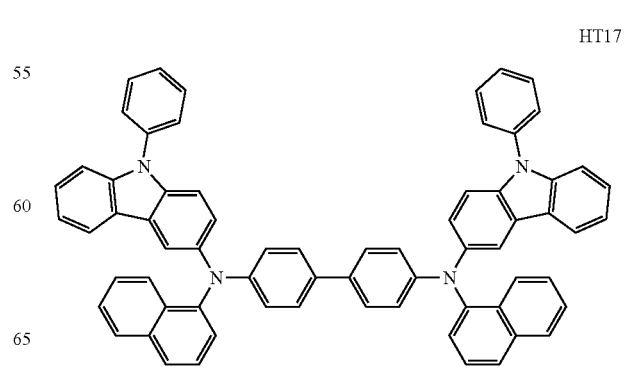

-continued

HT18

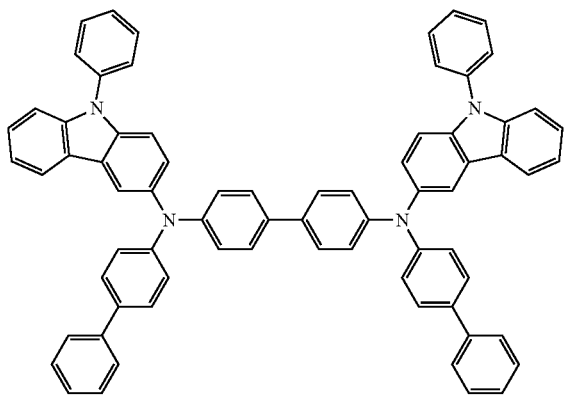

HT19

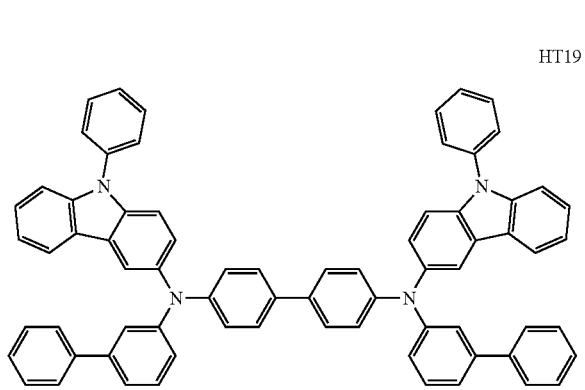

HT20

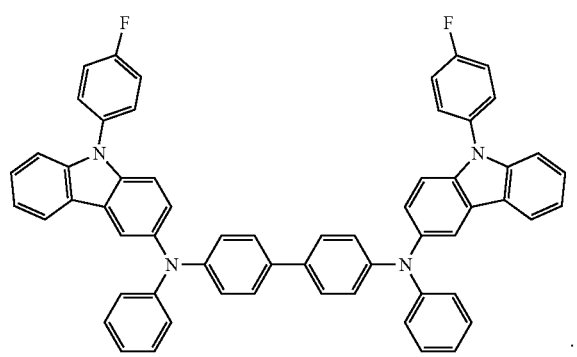

A thickness of the hole transport region may be in a range of about 100 angstroms (Å) to about 10,000 Å, for example, about 100 Å to about 1,000 Å. When the hole transport region includes at least one of a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, or a cyano group-containing compound, but embodiments of the present disclosure are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; a cyano group-containing compound, such as Compound HT-D1 below, or a combination thereof but are not limited thereto:

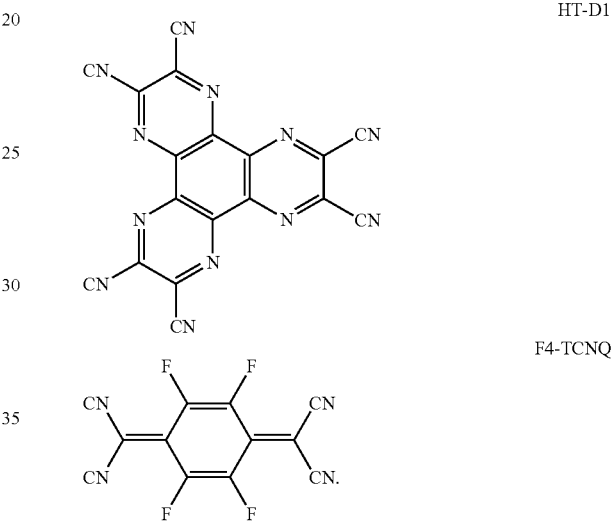

The hole transport region may include a buffer layer.

Also, the buffer layer may compensate for an optical resonance distance according to a wavelength of light emitted from the emission layer, and thus, efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be the same as or similar to those applied in forming the hole injection layer, although the deposition or coating conditions may vary according to a compound that is used to form the emission layer.

When the hole transport region includes an electron blocking layer, a material for the electron blocking layer may be a material for the hole transport region described above and materials for a host to be described below. However, the material for the electron blocking layer is not limited thereto. For example, when the hole transport region includes an electron blocking layer, a material for the electron blocking layer may be mCP shown below.

The emission layer may include a host and a dopant, and the dopant may include the organometallic compound represented by Formula 1.

The host may include TPBi, TBADN, ADN (also referred to as "DNA"), CBP, CDBP, TCP, mCP, Compounds H50 to H52, or a combination thereof as shown below:

TPBi
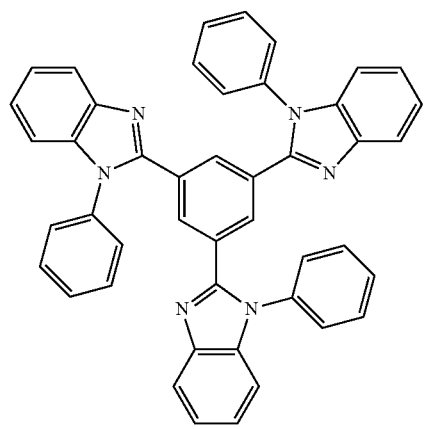
TBADN
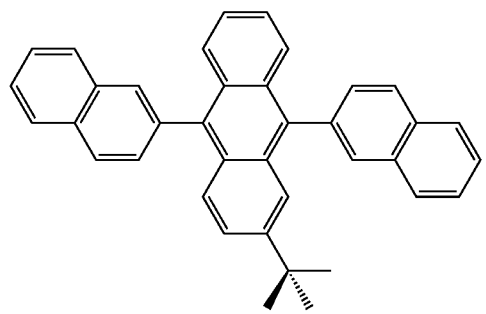
ADN
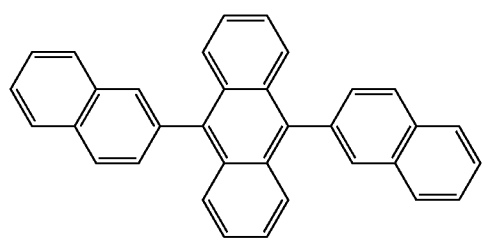
CBP
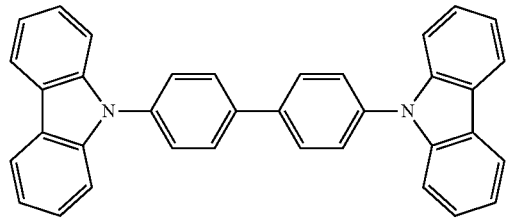
CDBP
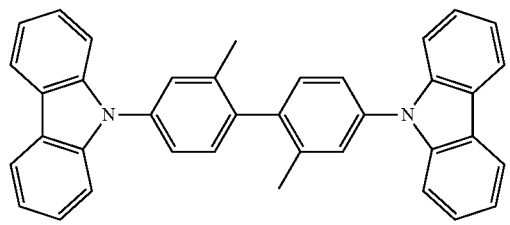
TCP
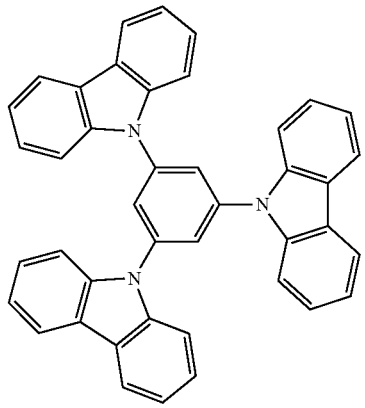
mCP
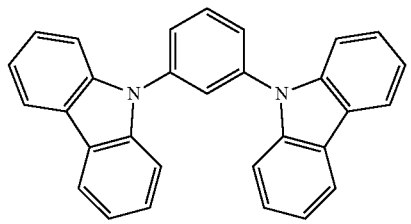
H50
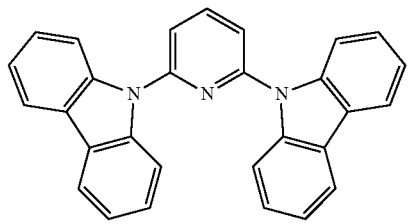
H51
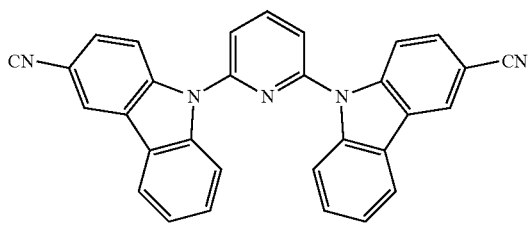
H52
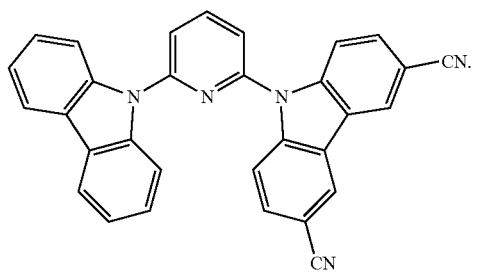

In one or more embodiments, the host may further include a compound represented by Formula 301:

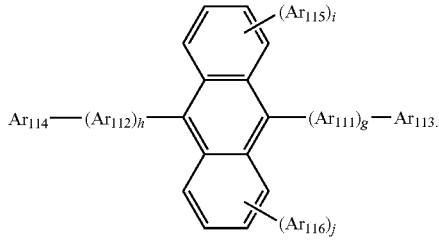

Formula 301

$Ar_{111}$ and $Ar_{112}$ in Formula 301 may each independently be:

- a phenylene group, a naphthylene group, a phenanthrenylene group, or a pyrenylene group; or
- a phenylene group, a naphthylene group, a phenanthrenylene group, or a pyrenylene group, each substituted with a phenyl group, a naphthyl group, or an anthracenyl group.

$Ar_{113}$ to $Ar_{116}$ in Formula 301 may each independently be:

- a $C_1$-$C_{10}$ alkyl group, a phenyl group, a naphthyl group, a phenanthrenyl group, or a pyrenyl group; or
- a phenyl group, a naphthyl group, a phenanthrenyl group, or a pyrenyl group, each substituted with a phenyl group, a naphthyl group, or an anthracenyl group.

In Formula 301, g, h, i, and j may each independently be an integer from 0 to 4, and may be, for example, 0, 1, or 2.

$Ar_{113}$ to $Ar_{116}$ in Formula 301 may each independently be:

- a $C_1$-$C_{10}$ alkyl group, the substituted with a phenyl group, a naphthyl group, or an anthracenyl group;
- a phenyl group, a naphthyl group, an anthracenyl group, a pyrenyl, a phenanthrenyl group, or a fluorenyl group;
- a phenyl group, a naphthyl group, an anthracenyl group, a pyrenyl group, a phenanthrenyl group, or a fluorenyl group, each substituted with a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, or a fluorenyl group; or

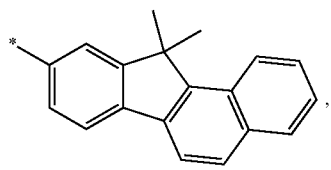 [SMILES: *c1ccc2c(c1)C(C)(C)c1c-2ccc2ccccc12]

but embodiments of the present disclosure are not limited thereto.

In one or more embodiments, the host may include a compound represented by Formula 302 below:

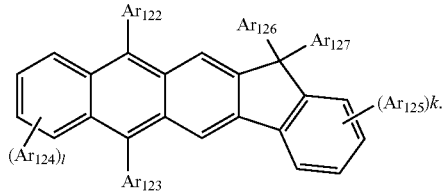

Formula 302

$Ar_{122}$ to $Ar_{125}$ in Formula 302 may each independently be the same as defined in connection with $Ar_{113}$ in Formula 301.

$Ar_{126}$ and $Ar_{127}$ in Formula 302 may each independently be a $C_1$-$C_{10}$ alkyl group (for example, a methyl group, an ethyl group, or a propyl group).

In Formula 302, k and l may each independently be an integer from 0 to 4. For example, k and l may be 0, 1, or 2.

When the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

Then, an electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, Bphen, BAlq, or a combination thereof but embodiments of the present disclosure are not limited thereto:

BCP

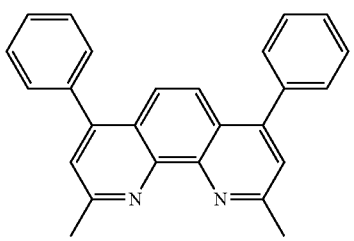

Bphen

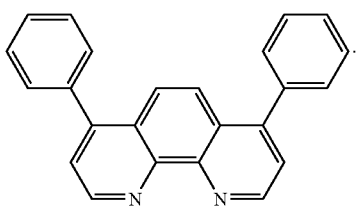

A thickness of the hole blocking layer may be in a range of about 20 Å to about 1,000 Å, for example, about 30 Å to about 300 Å. When the thickness of the hole blocking layer is within these ranges, the hole blocking layer may have improved hole blocking ability without a substantial increase in driving voltage.

The electron transport layer may include BCP, Bphen, Alq$_3$, BAlq, TAZ, NTAZ, or a combination thereof:

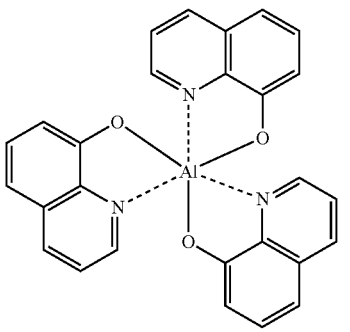

Alq$_3$

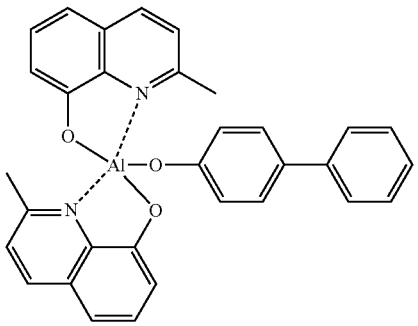

BAlq

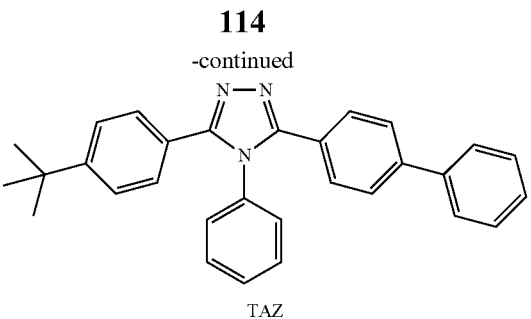

TAZ

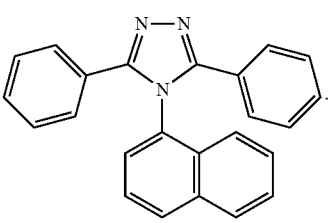

NTAZ

In one or more embodiments, the electron transport layer may include ET1 to ET25, but are not limited thereto:

ET1

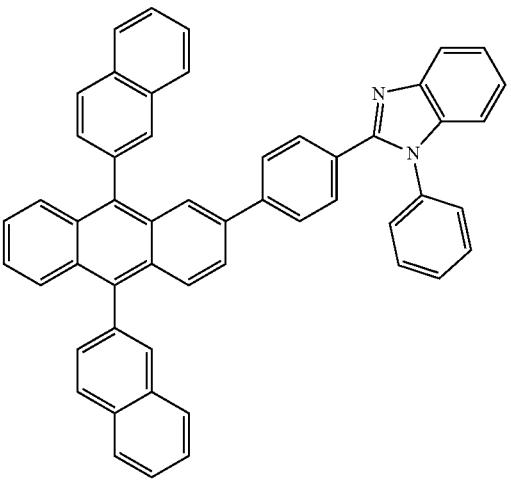

ET2

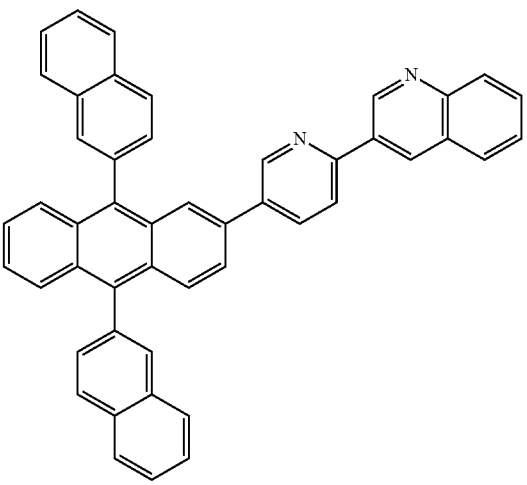

ET3
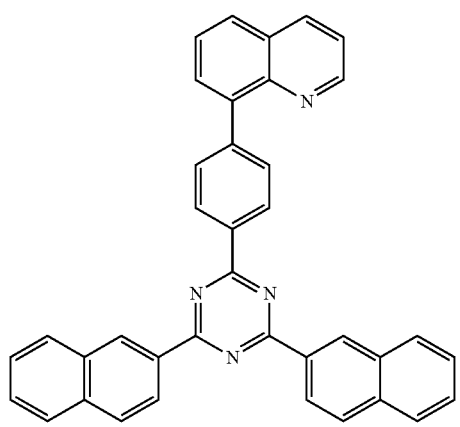
ET6
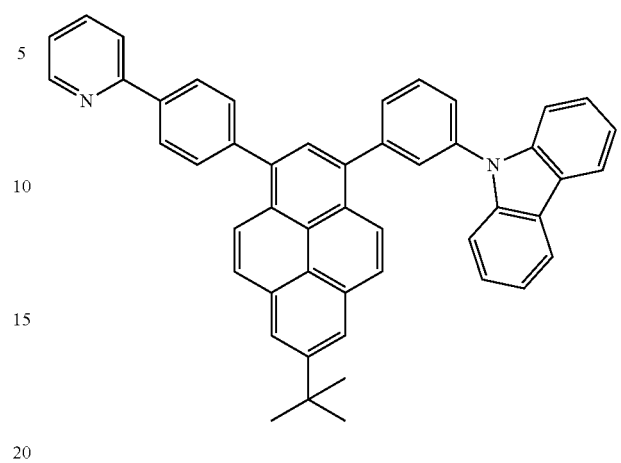
ET4
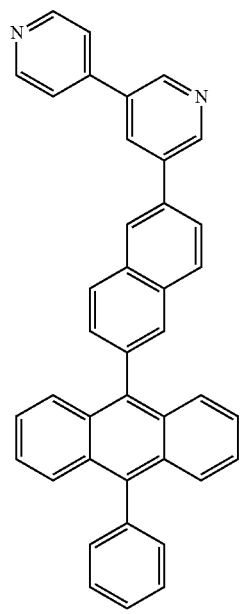
ET7
ET5
ET8
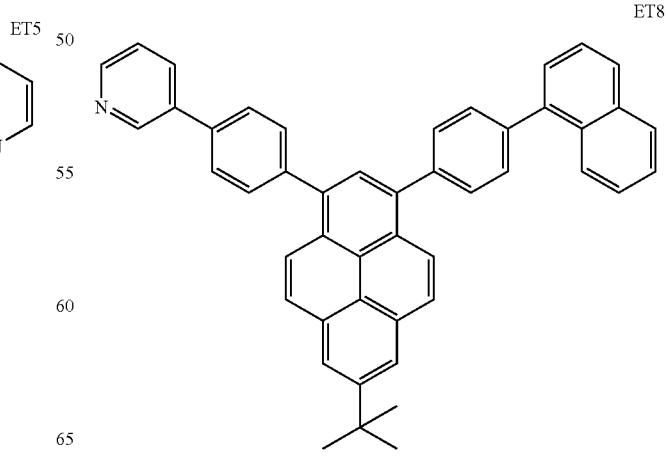

ET9
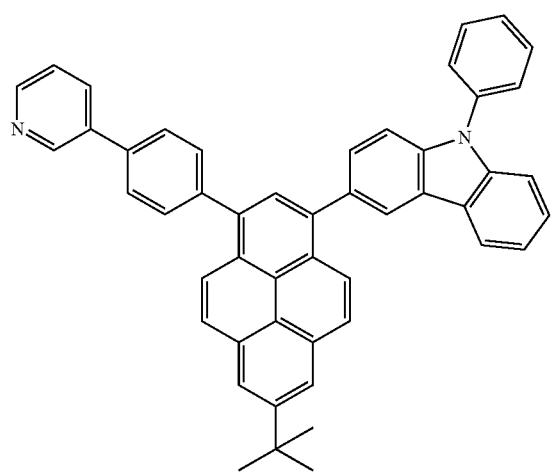
ET10
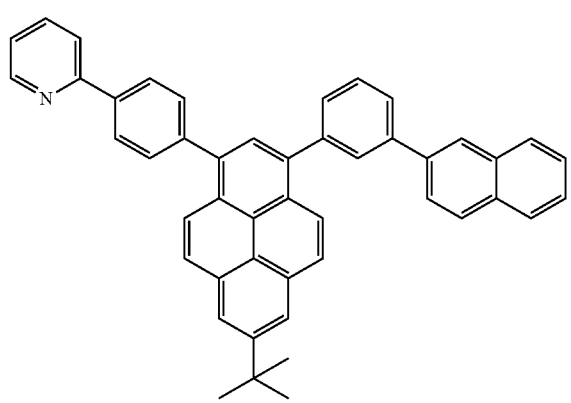
ET11
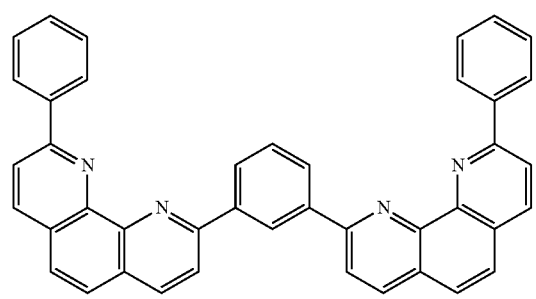
ET12
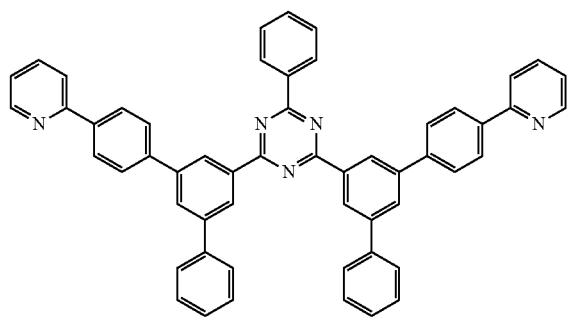
ET13
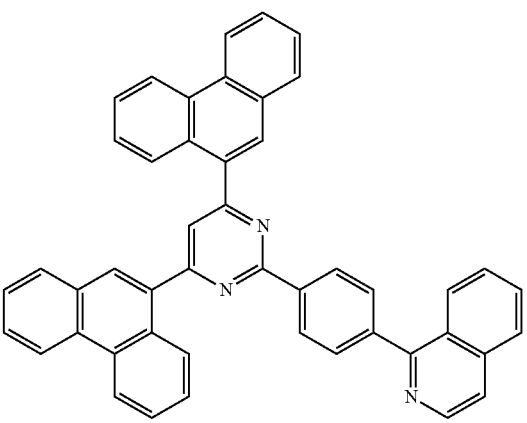
ET14
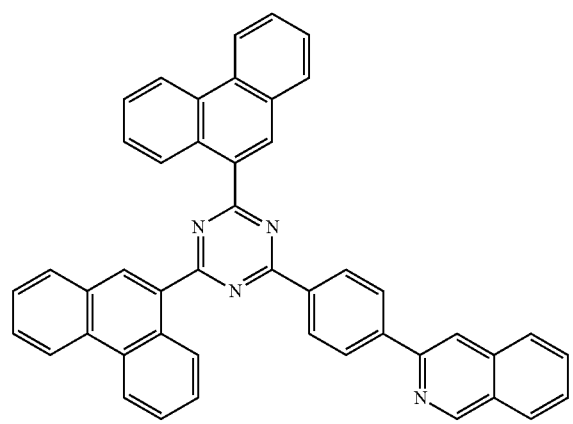
ET15
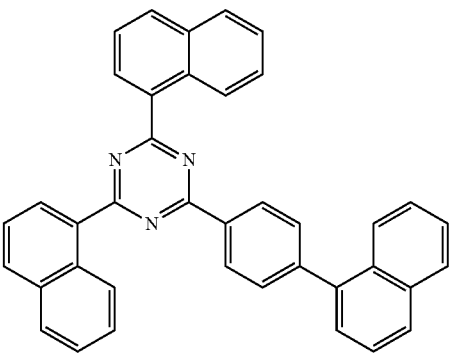

-continued
ET16
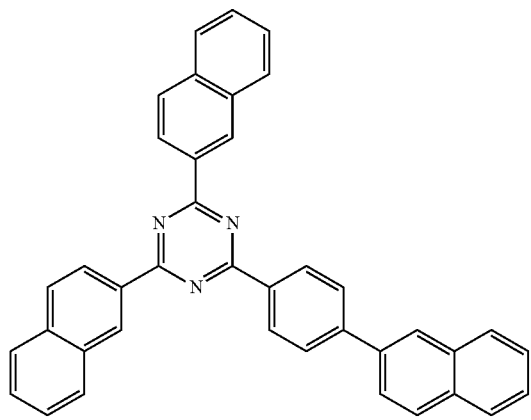
ET17
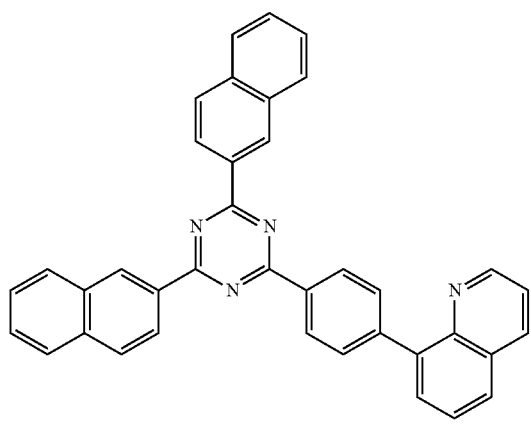
ET18
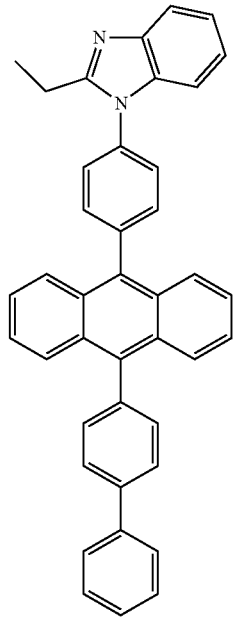
-continued
ET19
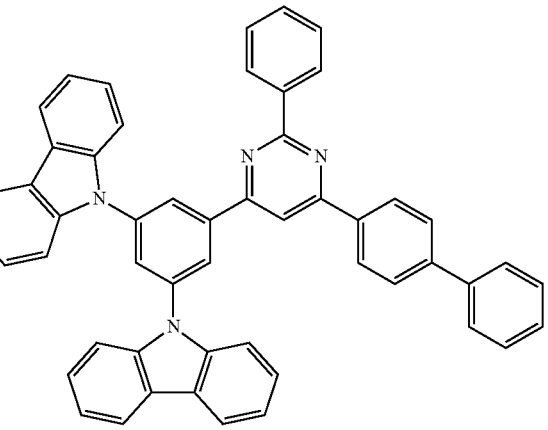
ET20
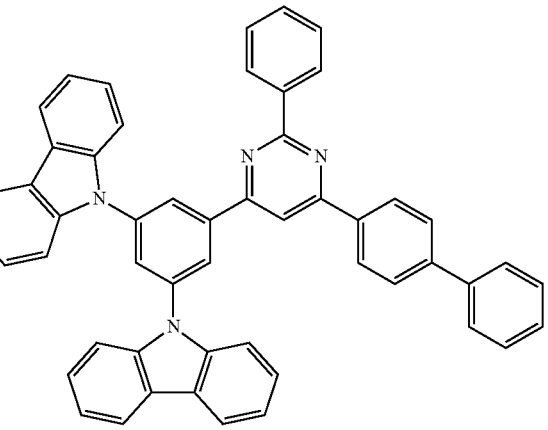
ET21
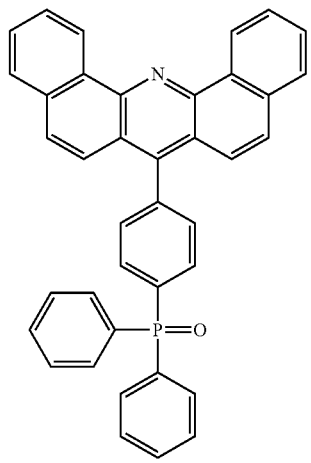

ET22

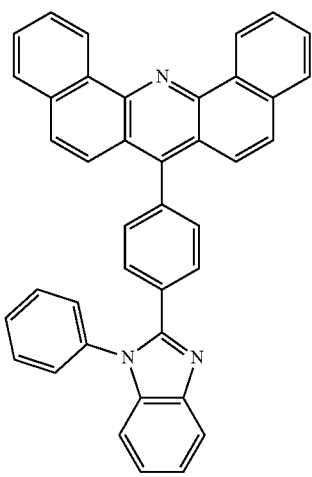

ET23

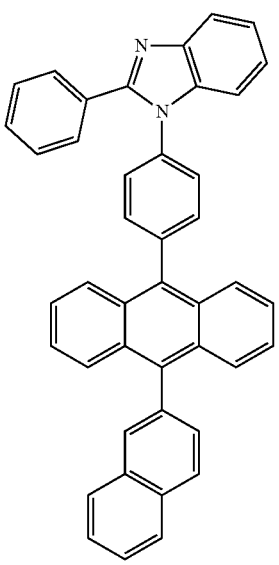

ET24

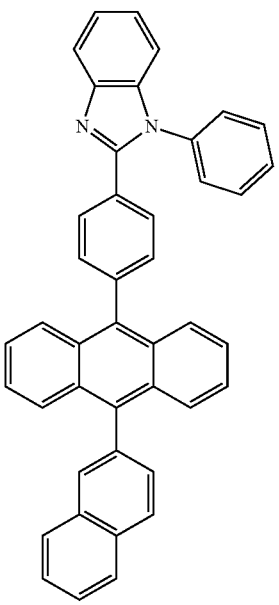

ET25

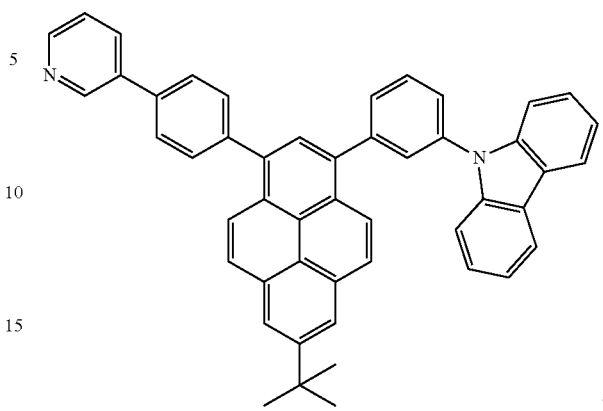

A thickness of the electron transport layer may be in a range of about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2:

ET-D1

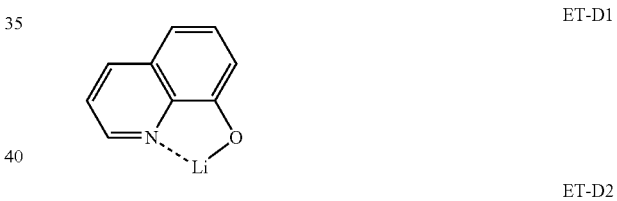

ET-D2

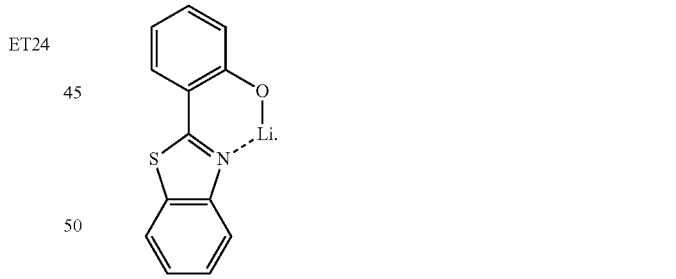

The electron transport region may include an electron injection layer that promotes flow of electrons from the second electrode 19 thereinto.

The electron injection layer may include LiF, NaCl, CsF, Li$_2$O, BaO, or a combination thereof.

A thickness of the electron injection layer may be in a range of about 1 Å to about 100 Å, for example, about 3 Å to about 90 Å. When the thickness of the electron injection layer is within the range described above, the electron injection layer may have satisfactory electron injection characteristics without a substantial increase in driving voltage.

The second electrode 19 may be disposed on the organic layer 15. The second electrode 19 may be a cathode. A material for forming the second electrode 19 may be a metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as a material for forming the second electrode 19. In one or more embodiments, to manufacture a top-emission type light-emitting device, a transmissive electrode formed using ITO or IZO may be used as the second electrode 19.

Hereinbefore, the organic light-emitting device has been described with reference to the FIGURE, but embodiments of the present disclosure are not limited thereto.

Another aspect of the present disclosure provides a diagnostic composition including at least one organometallic compound represented by Formula 1.

The organometallic compound represented by Formula 1 may provide high luminescent efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and non-limiting examples thereof include a methoxy group, an ethoxy group, and an isopropoxy group.

The term "$C_2$-$C_{60}$ alkenyl group" as used herein refers to a hydrocarbon group formed by substituting a double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting a triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having a heteroatom N, O, P, Si, or S as a ring-forming atom and 1 to 10 carbon atoms, and non-limiting examples thereof include a tetrahydrofuranyl group, and a tetrahydrothiophenyl group. The term "$C_1$-$C_{10}$ heterocycloalkylene group" as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and a double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has a heteroatom N, O, P, Si, or S as a ring-forming atom, 1 to 10 carbon atoms, and a double bond in its ring. Examples of the $C_1$-$C_{10}$ heterocycloalkenyl group are a 2,3-dihydrofuranyl group, and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has a heteroatom N, O, P, Si, or S as a ring-forming atom, and 1 to 60 carbon atoms. The term "$C_1$-$C_{60}$ heteroarylene group" as used herein refers to a divalent group having a heterocyclic aromatic system that has a heteroatom N, O, P, Si, or S as a ring-forming atom, and 1 to 60 carbon atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" used herein indicates —$OA_{102}$ (wherein $A_{102}$ is the $C_6$-$C_{60}$ aryl group), and a $C_6$-$C_{60}$ arylthio group used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom N, O, P, Si, or S, other than carbon atoms, as a ring-forming atom, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_3$-$C_{60}$ carbocyclic group (or, $C_5$-$C_{30}$ carbocyclic group)" as used herein refers to a saturated or unsaturated cyclic group having, as a ring-forming atom, 3 to 60 carbon atoms (or, 5 to 30 carbon atoms) only. The $C_3$-$C_{60}$ carbocyclic group (or, $C_5$-$C_{30}$ carbocyclic group) may be a monocyclic group or a polycyclic group.

The term "$C_1$-$C_{60}$ heterocyclic group (or, $C_1$-$C_{30}$ heterocyclic group)" as used herein refers to a saturated or unsaturated cyclic group having, as a ring-forming atom, a heteroatom N, O, Si, P, and S other than 1 to 60 carbon atoms (or, 1 to 30 carbon atoms). The $C_1$-$C_{60}$ heterocyclic group (or, $C_1$-$C_{30}$ heterocyclic group) may be a monocyclic group or a polycyclic group.

A substituent of a substituted $C_3$-$C_{60}$ carbocyclic group (or, $C_5$-$C_{30}$ carbocyclic group), a substituted $C_1$-$C_{60}$ heterocyclic group (or, $C_1$-$C_{30}$ heterocyclic group), a substituted $C_1$-$C_{60}$ alkyl group, a substituted $C_2$-$C_{60}$ alkenyl group, a substituted $C_2$-$C_{60}$ alkynyl group, a substituted $C_1$-$C_{60}$ alkoxy group, a substituted $C_3$-$C_{10}$ cycloalkyl group, a substituted $C_1$-$C_{10}$ heterocycloalkyl group, a substituted $C_3$-$C_{10}$ cycloalkenyl group, a substituted $C_1$-$C_1$ heterocycloalkenyl group, a substituted $C_6$-$C_{60}$ aryl group, a substituted $C_6$-$C_{60}$ aryloxy group, a substituted $C_6$-$C_{60}$ arylthio group, a substituted $C_1$-$C_{60}$ heteroaryl group, a substituted monovalent non-aromatic condensed polycyclic group, or a substituted monovalent non-aromatic condensed heteropolycyclic group may be:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or a combination thereof;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{11}$)($Q_{12}$), —Si($Q_{13}$)($Q_{14}$)($Q_{15}$), —B($Q_{16}$)($Q_{17}$), —P(=O)($Q_{18}$)($Q_{19}$), or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or a combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —N($Q_{21}$)($Q_{22}$), —Si($Q_{23}$)($Q_{24}$)($Q_{25}$), —B($Q_{26}$)($Q_{27}$), —P(=O)($Q_{28}$)($Q_{29}$), or a combination thereof; or —N($Q_{31}$)($Q_{32}$), —Si($Q_{33}$)($Q_{34}$)($Q_{35}$), —B($Q_{36}$)($Q_{37}$)-P(=O)($Q_{38}$)($Q_{39}$), or a combination thereof, and $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group, or a combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1: Synthesis of Compound 1

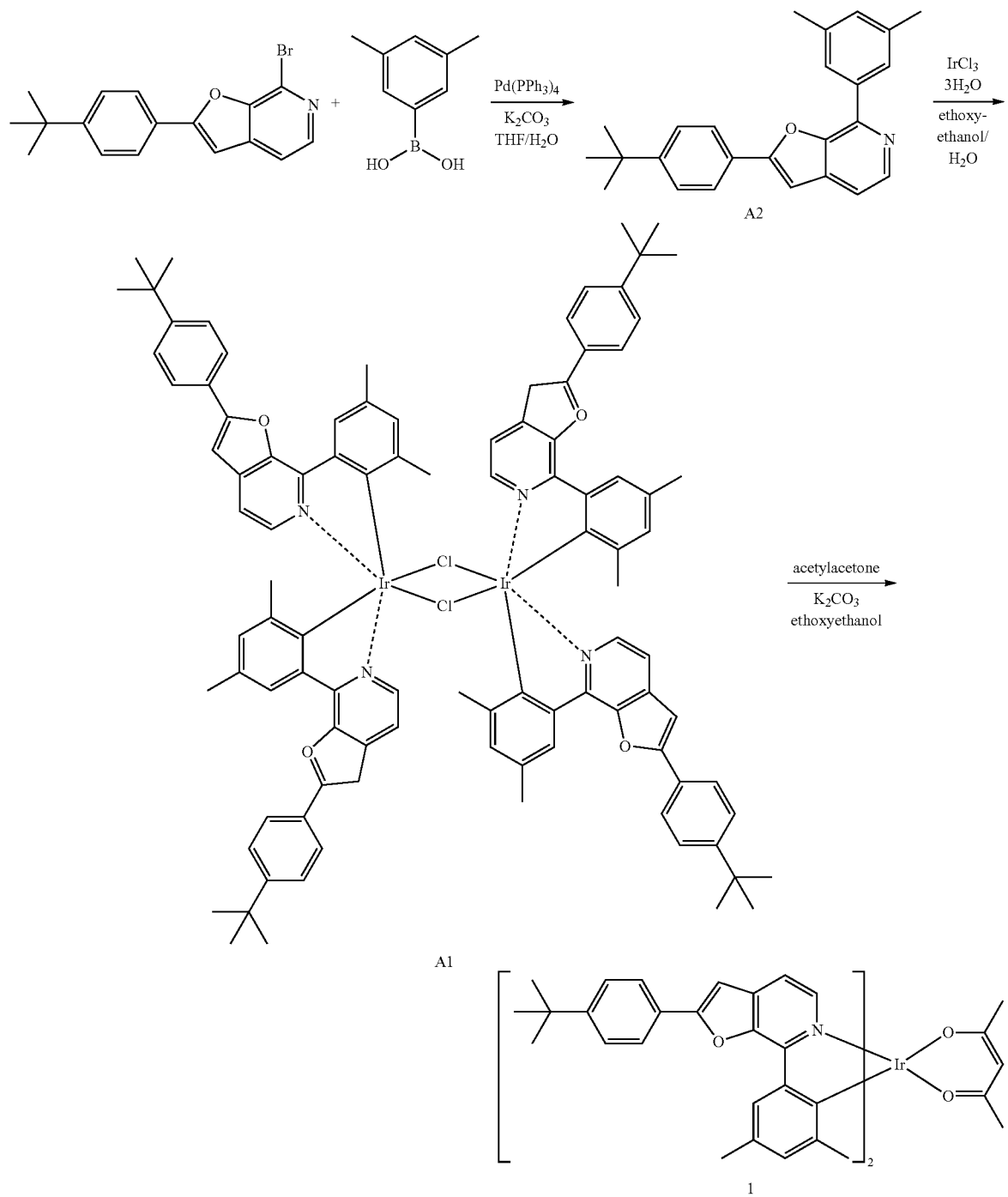

Synthesis of Intermediate A2

7-bromo-2-(4-(tert-butyl)phenyl)furo[2,3-c]pyridine (2.32 g, 7.03 mmol), 3,5-dimethylphenylboronic acid (1.16 g, 7.74 mmol), Pd(PPh$_3$)$_4$ (0.46 g, 0.49 mmol), and K$_2$CO$_3$ (1.46 g, 10.6 mmol) were mixed with 30 mL of tetrahydrofuran (THF) and 15 mL of distilled water, stirred at a temperature of 75° C. for 5 hours, and then cooled to room temperature. An organic layer was extracted therefrom by using ethyl acetate, dried by using anhydrous magnesium sulfate (MgSO$_4$), and then filtered to obtain a filtrate. Then, a residue obtained by concentrating the filtrate was purified by column chromatography f eluting with ethyl acetate: hexane=1:5 to obtain 1.92 g (77%) of Intermediate A2. The obtained compound was identified by LCMS and $^1$H NMR.

1H-NMR (CDCl$_3$) δ8.40 (d, 1H), 8.09 (s, 2H), 7.80 (d, 1H), 7.72 (m, 2H), 7.30 (m, 3H), 6.61 (s, 1H), 2.30 (s, 6H), 1.29 (s, 9H).

MS: m/z 356.25 [(M+1)+].

Synthesis of Intermediate A1

Intermediate A2 (1.92 g, 5.41 mmol) and iridium chloride hydrate (0.94 g, 2.67 mmol) were mixed with 21 mL of ethoxyethanol and 7 mL of distilled water, stirred at a temperature of 120° C. for 12 hours, and then cooled to room temperature. A precipitate obtained therefrom was filtered under reduced pressure, sequentially washed with 100 mL of methanol and 100 mL of hexane, and then dried to obtain 1.89 g (76%) of Intermediate A1. The obtained compound was used in a next reaction without any additional purification.

Synthesis of Compound 1

Intermediate A1 (1.89 g, 1.01 mmol), acetylacetone (0.52 g, 5.05 mmol), and K$_2$COO$_3$ (0.70 g, 5.05 mmol) were added to 20 mL of 2-ethoxyethanol and stirred at room temperature for 12 hours. An organic layer was extracted therefrom by using ethyl acetate, dried by using anhydrous magnesium sulfate (MgSO$_4$), and then filtered to obtain a filtrate. Then, a residue obtained by concentrating the filtrate was purified by column chromatography eluting with ethyl acetate: hexane=1:5 to obtain 0.26 g (26%) of Compound 1. The obtained compound was identified by LCMS and $^1$H NMR.

1H-NMR (CDCl$_3$) δ8.43 (d, 2H), 8.11 (s, 2H), 7.82 (d, 2H), 7.75 (m, 4H), 7.33 (m, 6H), 6.61 (s, 2H), 2.31 (s, 12H), 1.30 (s, 18H).

MS: m/z 1001.31 [(M+1)$^+$].

Synthesis Example 2: Synthesis of Compound 2

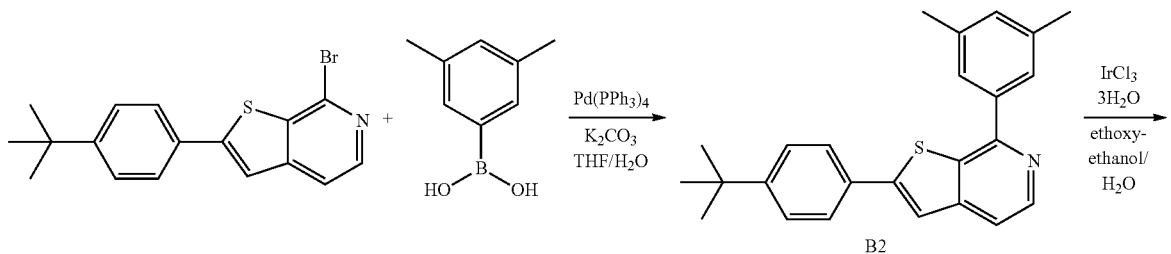

B2

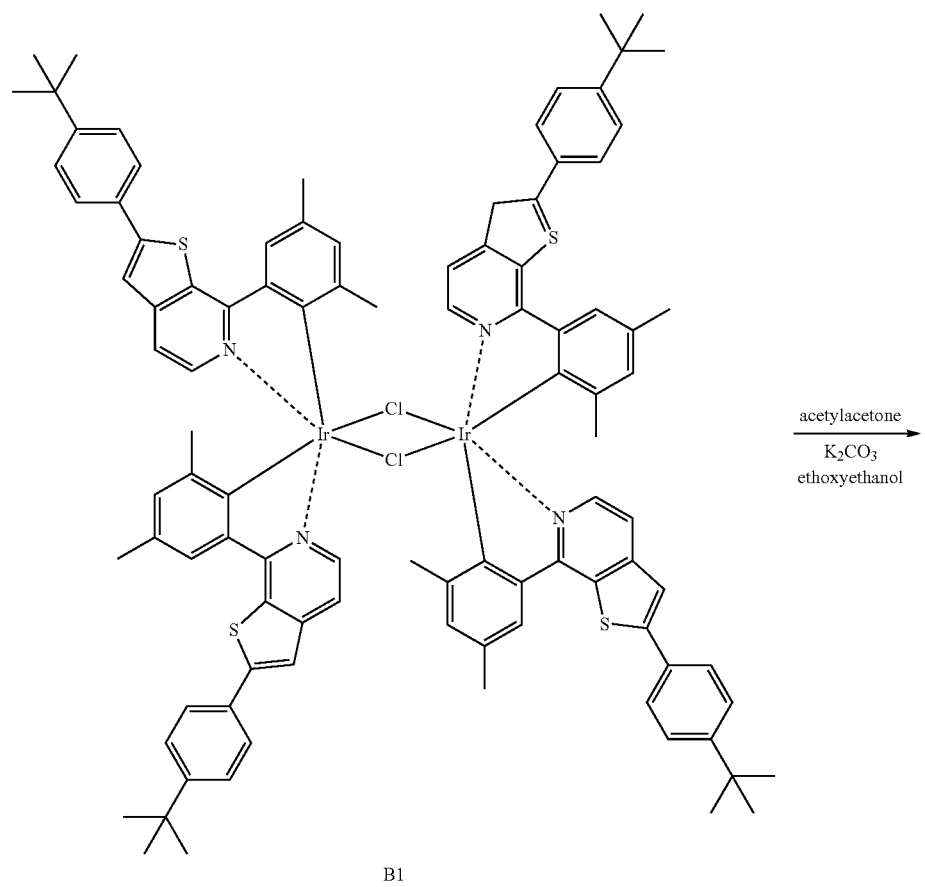

B1

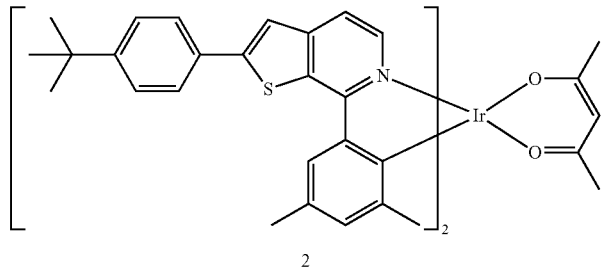

Synthesis of Intermediate B2

7-bromo-2-(4-(tert-butyl)phenyl)thieno[2,3-c]pyridine (2.33 g, 6.73 mmol), 3,5-dimethylphenylboronic acid (1.11 g, 7.40 mmol), Pd(PPh$_3$)$_4$ (0.44 g, 0.47 mmol), and K$_2$CO$_3$ (1.40 g, 10.1 mmol) were mixed with 30 mL of THF and 15 mL of distilled water, stirred at a temperature of 75° C. for 5 hours, and then cooled to room temperature. An organic layer was extracted therefrom by using ethyl acetate, dried by using anhydrous magnesium sulfate (MgSO$_4$), and then filtered to obtain a filtrate. Then, a residue obtained by concentrating the filtrate was purified by column chromatography eluting with ethyl acetate:hexane=1:5 to obtain 1.88 g (75%) of Intermediate B2. The obtained compound was identified by LCMS and $^1$H NMR.

1H-NMR (CDCl$_3$) δ8.33 (d, 1H), 8.02 (s, 2H), 7.77 (d, 1H), 7.65 (m, 2H), 7.28 (m, 3H), 6.33 (s, 1H), 2.33 (s, 6H), 1.30 (s, 9H).

MS: m/z 372.24 [(M+1)+].

Synthesis of Intermediate B1

Intermediate B2 (1.88 g, 5.06 mmol) and iridium chloride hydrate (0.88 g, 2.50 mmol) were mixed with 21 mL of ethoxyethanol and 7 mL of distilled water, stirred at a temperature of 120° C. for 12 hours, and then cooled to room temperature. A precipitate obtained therefrom was filtered under reduced pressure, sequentially washed with 100 mL of methanol and 100 mL of hexane, and then dried to obtain 1.74 g (72%) of Intermediate B1. The obtained compound was used in a next reaction without any additional purification.

Synthesis of Compound 2

Intermediate B1 (1.74 g, 0.90 mmol), acetylacetone (0.46 g, 4.49 mmol), and K$_2$COO$_3$ (0.62 g, 4.49 mmol) were added to 20 mL of 2-ethoxyethanol and stirred at room temperature for 12 hours. An organic layer was extracted therefrom by using ethyl acetate, dried by using anhydrous magnesium sulfate (MgSO$_4$), and then filtered to obtain a filtrate. Then, a residue obtained by concentrating the filtrate was purified by column chromatography eluting with ethyl acetate:hexane=1:5 to obtain 0.34 g (37%) of Compound 2. The obtained compound was identified by LCMS and $^1$H NMR.

1H-NMR (CDCl$_3$) δ8.36 (d, 2H), 8.06 (s, 2H), 7.81 (d, 2H), 7.70 (m, 4H), 7.31 (m, 6H), 6.34 (s, 2H), 2.34 (s, 12H), 1.31 (s, 18H).

MS: m/z 1033.37 [(M+1)$^+$]

Synthesis Example 3: Synthesis of Compound 6

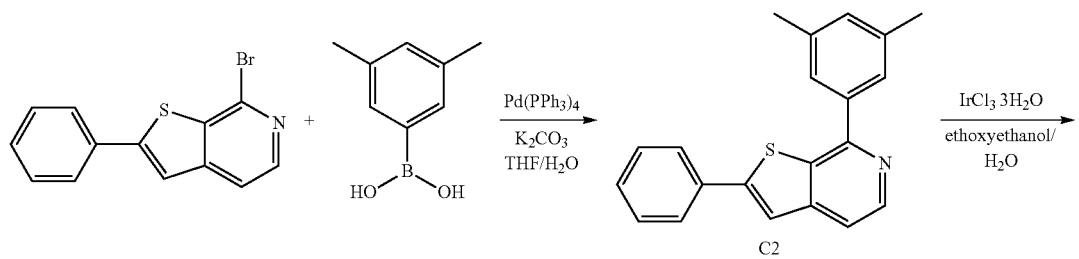

-continued

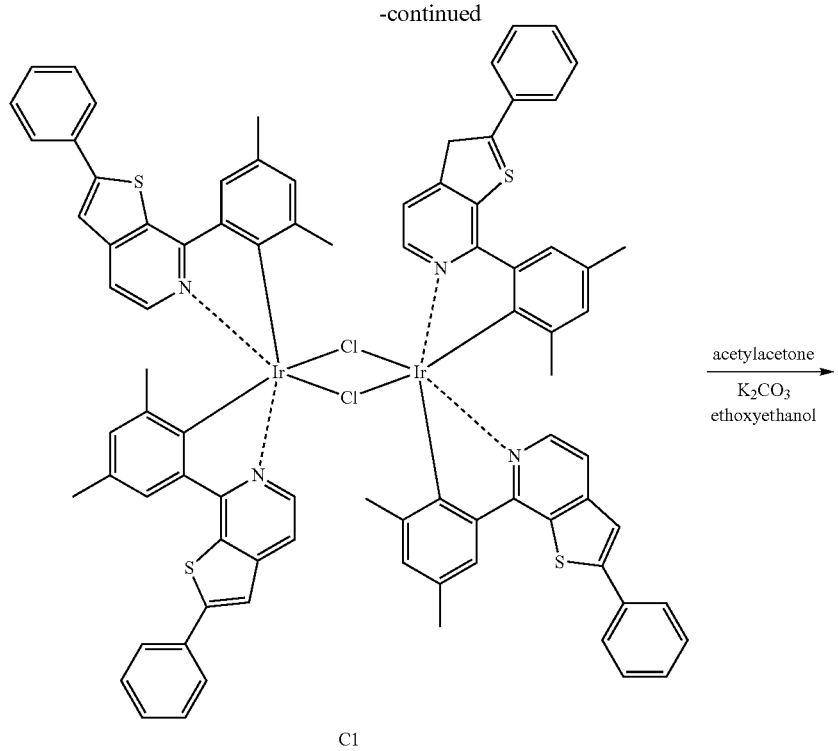

C1

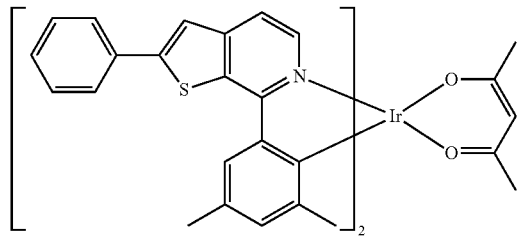

6

Compound 6 was synthesized in the same manner as in Synthesis Example 2, except that 7-bromo-2-phenylthieno[2,3-c]pyridine was used instead of 7-bromo-2-(4-(tert-butyl)phenyl)thieno[2,3-c]pyridine in synthesizing Intermediate C2.

Evaluation Example 1: Evaluation of Radiative Decay Rate

CBP and Compound 1 were co-deposited at a weight ratio of 9:1 under a vacuum ($10^{-7}$ torr) to manufacture a film having a thickness of 40 nm.

A photoluminescence (PL) spectrum of the film was evaluated at room temperature by using a PICOQUANT TRPL measurement system FLUOTIME 300 and a PICOQUANT pumping source PLS340 (excitation wavelength=340 nm, spectral width=20 nm), a wavelength of a main peak of the spectrum was determined, and PLS340 repeatedly measured the number of photons emitted from the film at the wavelength of the main peak due to a photon pulse (pulse width=500 ps) applied to the film according to time based on time-correlated single photon counting (TCSPC), thereby obtaining a sufficiently fittable TRPL curve. A decay time $T_{decay}$(Ex) of the film was obtained by fitting one or more exponential decay functions to the result obtained therefrom, and a radiative decay rate that is a reciprocal of $T_{decay}$(Ex) was calculated, and a result thereof is shown in Table 3. The function used for fitting is expressed by Equation 10, and the greatest value of $T_{decay}$ obtained from each exponential decay function used for fitting was taken as $T_{decay}$ (Ex). At this time, a baseline or background signal curve was obtained by repeating the same measurement once more for the same measurement time as the measurement time for obtaining the TRPL curve in a dark state (a state in which a pumping signal applied to the predetermined film was blocked), and the baseline or background signal curve was used for fitting as a baseline.

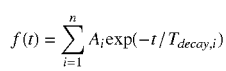

The measurement of the radiative decay rate was performed on Compounds 2, 6, and A to D, and results thereof are shown in Table 3.

TABLE 3

| Compound No. | Radiative decay rate (s$^{-1}$) |
|---|---|
| 1 | 1.53 × 10$^6$ |
| 2 | 1.31 × 10$^6$ |
| 6 | 1.25 × 10$^6$ |
| A | 6.94 × 10$^5$ |
| B | 4.62 × 10$^5$ |
| C | 2.67 × 10$^5$ |
| D | 3.79 × 10$^5$ |

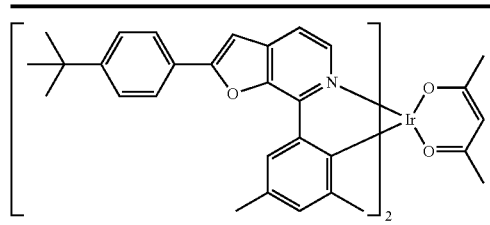

1

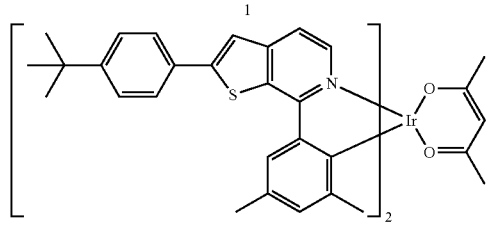

2

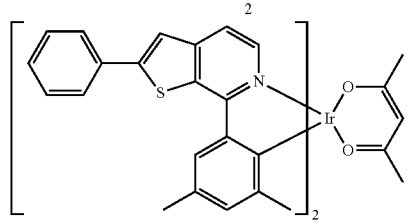

6

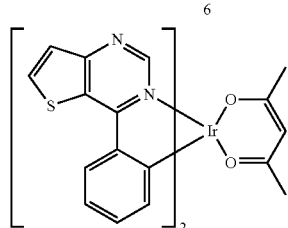

A

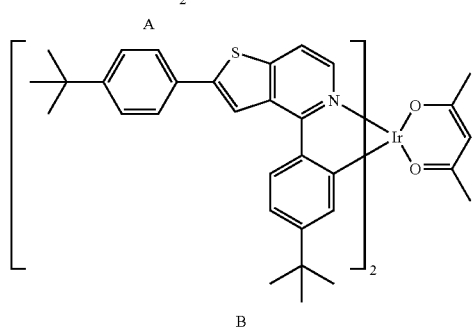

B

TABLE 3-continued

| Compound No. | Radiative decay rate (s$^{-1}$) |
|---|---|

C

D

From Table 3, it is confirmed that Compounds 1, 2, and 6 have a superior radiative decay rate, as compared with Compounds A to D.

Example 1

As an anode, a glass substrate, on which ITO/Ag/ITO were deposited to thicknesses of 70 Å/1,000 Å/70 Å, was cut to a size of 50 millimeters (mm)×50 mm×0.5 mm, sonicated with isopropyl alcohol and pure water each for 5 minutes, and then cleaned by exposure to ultraviolet rays and ozone for 30 minutes. Then, the glass substrate was provided to a vacuum deposition apparatus.

2-TNATA was vacuum-deposited on the anode to form a hole injection layer having a thickness of 600 Å, and 4,4'-bis[N-(1-naphthyl)-N-phenylamino]biphenyl (NPB) was vacuum-deposited on the hole injection layer to form a hole transport layer having a thickness of 1,350 Å.

Then, CBP (host) and Compound 1 (dopant) were co-deposited on the hole transport layer at a weight ratio of 98:2 to form an emission layer having a thickness of 400 Å.

Then, BCP was vacuum-deposited on the emission layer to form a hole blocking layer having a thickness of 50 Å, Alq$_3$ was vacuum-deposited on the hole blocking layer to form an electron transport layer having a thickness of 350 Å, LiF was vacuum-deposited on the electron transport layer to form an electron injection layer having a thickness of 10 Å, and Mg and Ag were co-deposited on the electron injection layer at a weight ratio of 90:10 to form a cathode having a thickness of 120 Å, thereby completing the manufacture of an organic light-emitting device (which emits red light).

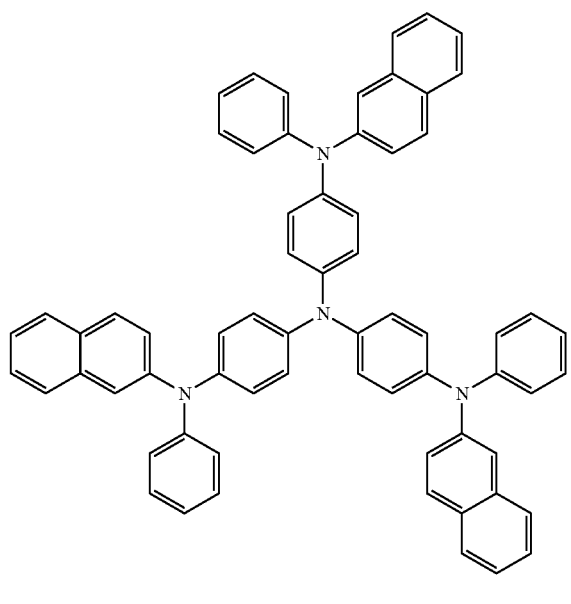

2-TNATA

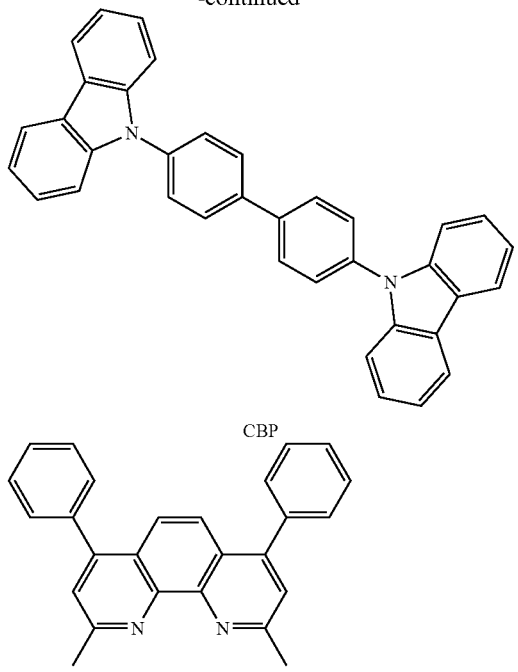

CBP

BCP

NPB

Examples 2 and 3 and Comparative Examples A to D

Organic light-emitting devices were manufactured in the same manner as in Example 1, except that Compounds shown in Table 4 were each used instead of Compound 1 as a dopant in forming an emission layer.

Evaluation Example 2: Evaluation of Characteristics of Organic Light-Emitting Devices The driving voltage, maximum value (Max EQE) of external quantum efficiency, roll-off ratio, full width at half maximum (FWHM) of main peak of EL spectrum, maximum emission wavelength, and lifespan ($T_{97}$) of the organic light-emitting devices manufactured according to Examples 1 to 3 and Comparative Examples A to D were evaluated, and results thereof are shown in Table 4. A current-voltage meter (KEITHLY 2400) and a luminance meter (Minolta Cs-1000A) were used as the evaluation apparatuses, and the lifespan ($T_{97}$) (at 3,500 nit) indicates the time that lapsed when luminance was 97% of initial luminance (100%). The roll-off ratio was calculated by Equation 20.

Roll off={1−(Efficiency(at 3,500 nit)/Maximum luminescent efficiency)}×100%   Equation 20

TABLE 4

|  | Dopant in emission layer | Driving voltage (V) | Max EE (%) | Roll-Off ratio (%) | FWHM (nm) | Maximum emission wavelength (nm) | $T_{97}$ (hr) (at 3,500 nit) |
|---|---|---|---|---|---|---|---|
| Example 1 | Compound 1 | 4.08 | 29.7 | 3.0 | 65 | 596 | 300 |
| Example 2 | Compound 2 | 4.10 | 28.4 | 3.0 | 66 | 580 | 180 |
| Example 3 | Compound 6 | 4.21 | 28.0 | 8.0 | 72 | 601 | 100 |
| Comparative Example A | Compound A | 4.05 | 18.1 | 25 | 68 | 606 | 80 |

TABLE 4-continued
|  | Dopant in emission layer | Driving voltage (V) | Max EE (%) | Roll-Off ratio (%) | FWHM (nm) | Maximum emission wavelength (nm) | $T_{97}$ (hr) (at 3,500 nit) |
|---|---|---|---|---|---|---|---|
| Comparative Example B | Compound B | 4.32 | 26.0 | 14 | 76 | 580 | 60 |
| Comparative Example C | Compound C | 5.44 | 15.5 | 31 | 80 | 622 | 90 |
| Comparative Example D | Compound D | 5.20 | 17.9 | 28 | 82 | 565 | 25 |
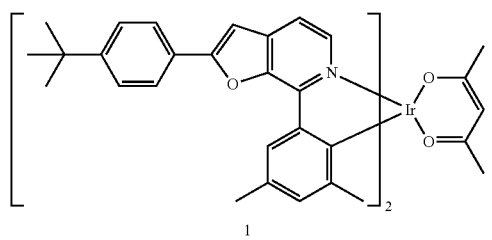
1
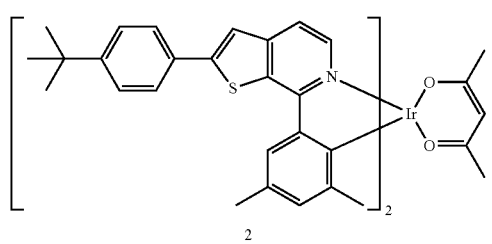
2
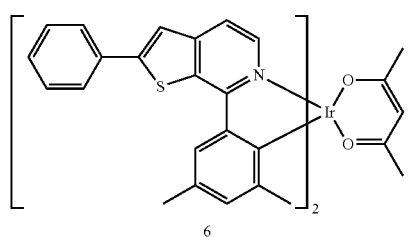
6
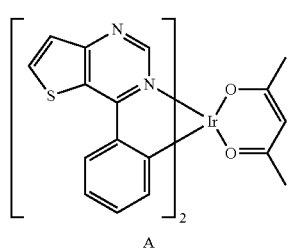
A
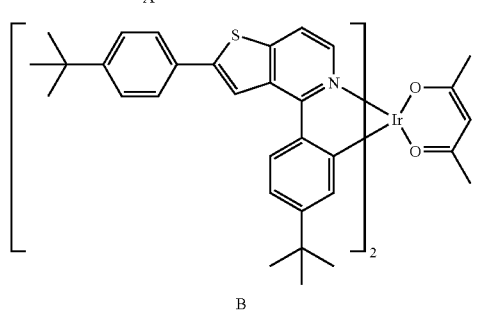
B TABLE 4-continued

| Dopant in emission layer | Driving voltage (V) | Max EE (%) | Roll-Off ratio (%) | FWHM (nm) | Maximum emission wavelength (nm) | $T_{97}$ (hr) (at 3,500 nit) |
| --- | --- | --- | --- | --- | --- | --- |

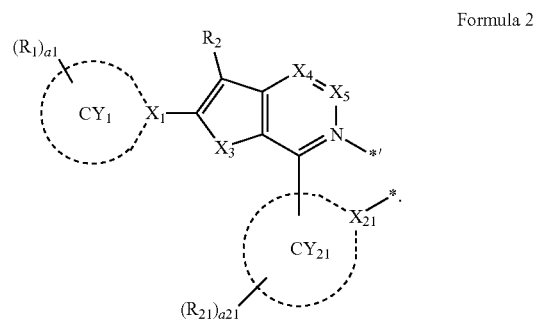

C

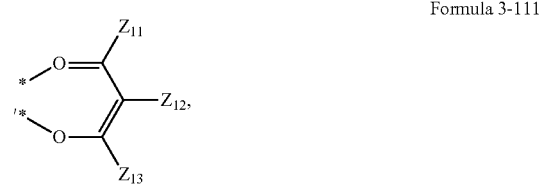

D

Table 4 shows that the organic light-emitting devices of Examples 1 to 3 may emit red light and may have improved driving voltage, external quantum efficiency, roll-off ratio, and lifespan characteristics, as compared with those of the organic light-emitting devices of Comparative Examples A to D.

Since the organometallic compound has a high spin density and a high radiative decay rate, an electronic device, for example, an organic light-emitting device, which includes the organometallic compound may have improved driving voltage, efficiency, color purity, and/or lifespan characteristics. In addition, since the organometallic compound has excellent phosphorescence characteristics, a diagnostic composition having high diagnostic efficiency may be provided by using the organometallic compound.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

$$M(L_1)_{n1}(L_2)_{n2}, \quad \text{Formula 1}$$

wherein M in Formula 1 is a first-row transition metal, a second-row transition metal, or a third-row transition metal, of the Periodic Table of Elements, $L_1$ in Formula 1 is a ligand represented by Formula 2, n1 in Formula 1 is 1, 2, or 3, wherein, when n1 is two or more, two or more $L_1$ are identical to or different from each other, $L_2$ in Formula 1 is a ligand represented by Formula 3-111, n2 in Formula 1 is 0, 1, 2, 3, or 4, wherein, when n2 is two or more, two or more $L_2$ are identical to or different from each other, and $L_1$ and $L_2$ in Formula 1 are different from each other:

Formula 2

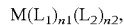

Formula 3-111 wherein, in Formula 2, $X_1$ is C, N, Si, or P, $X_{21}$ is C, a group represented by

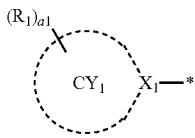

in Formula 2 is a phenyl group, unsubstituted or substituted with $R_1$ in the number of a1,
$X_3$ is O or S
$X_4$ is $C(R_4)$,
$X_5$ is $C(R_5)$,
a group represented by

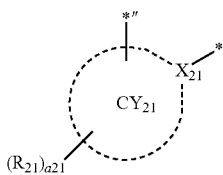

in Formula 2 is a group represented by Formula CY21-1:

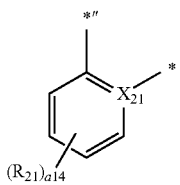

CY21-1 wherein, in Formulae CY21-1,
a14 is an integer from 0 to 4,
*″ indicates a binding site to a carbon atom of a neighboring 6-membered ring in Formula 2, and
* indicates a binding site to M in Formula 1,
$R_1$ is deuterium, a methyl group, an ethyl group, a propyl group, an n-butyl group, an isobutyl group, a sec-butyl group, a tert-butyl group, each optionally substituted with at least one deuterium,
$R_2$ is
hydrogen, a methyl group, or a —$CF_3$ group, or
an ethyl group, a propyl group, an n-butyl group, an isobutyl group, a sec-butyl group, a tert-butyl group, each optionally comprising a —$CF_3$ group,
$R_4$ is hydrogen or deuterium,
$R_5$ is hydrogen, or deuterium,
$R_{21}$ is —$CH_3$, or a group represented by Formulae 9-1 to 9-13:

9-1

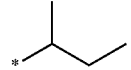
9-2

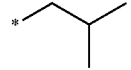
9-3

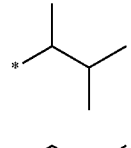
9-4

9-5

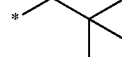
9-6

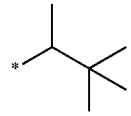
9-7

9-8

9-9

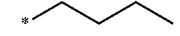
9-10

9-11

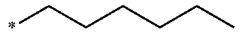
9-12

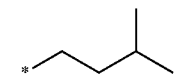
9-13

$Z_{11}$ and $Z_{13}$ are each independently an unsubstituted $C_1$-$C_6$ alkyl group,
$Z_{12}$ is hydrogen,
a1 is an integer from 0 to 5, provided that when $X_3$ is O, then a1 is 1 to 5,
ring $CY_1$ and $R_2$ are not linked to each other, and $R_1$ and $R_2$ are not linked to each other,
$R_4$ and $R_5$ are not linked to form a $C_5$-$C_{30}$ carbocyclic group that is unsubstituted or substituted with $R_{10a}$ or a $C_1$-$C_{30}$ heterocyclic group that is unsubstituted or substituted with $R_{10a}$,
a plurality of $R_{21}$ are optionally linked to form a $C_5$-$C_{30}$ carbocyclic group that is unsubstituted or substituted with $R_{10a}$ or a $C_1$-$C_{30}$ heterocyclic group that is unsubstituted or substituted with $R_{10a}$,
$R_{10a}$ is the same as defined in connection with $R_{21}$,
* and *′ each indicate a binding site to M in Formula 1.

2. The organometallic compound of claim 1, wherein
M is Ir or Os, and the sum of n1 and n2 is 3 or 4; or
M is Pt, and the sum of n1 and n2 is 2.

3. The organometallic compound of claim 1, wherein a group represented by
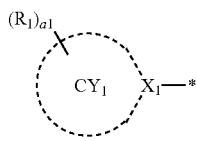
is a group represented by Formulae 10-13 (1) to 10-13 (18) or 10-13:
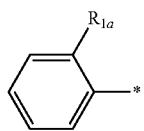
10-13(1)
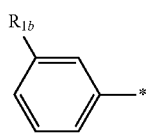
10-13(2)
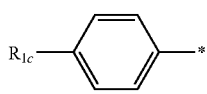
10-13(3)
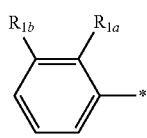
10-13(4)
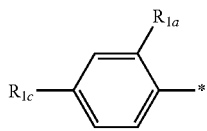
10-13(5)
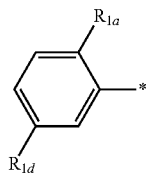
10-13(6)
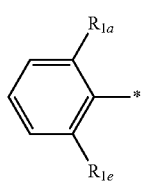
10-13(7)
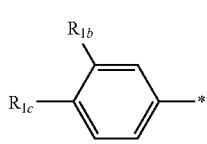
10-13(8)
-continued
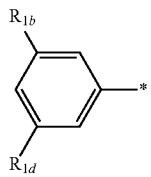
10-13(9)
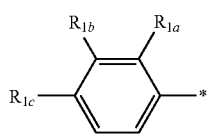
10-13(10)
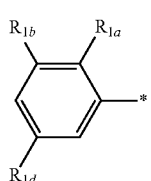
10-13(11)
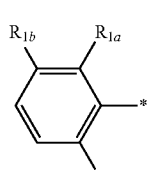
10-13(12)
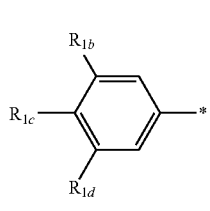
10-13(13)
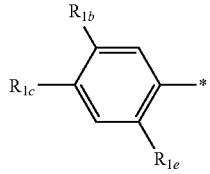
10-13(14)
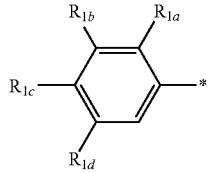
10-13(15)
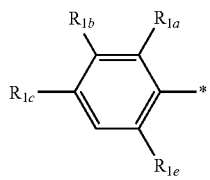
10-13(16)
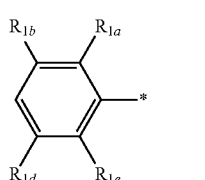
10-13(17)

-continued
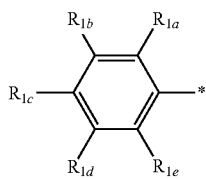
10-13(18)
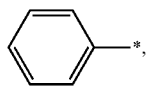
10-13
wherein, in Formulae 10-13 (1) to 10-13 (18) and 10-13, $R_{1a}$ to $R_{1e}$ are each independently the same as defined for $R_1$, wherein $R_{1a}$ to $R_{1e}$ are not hydrogen, and * indicates a binding site to a neighboring atom.
4. The organometallic compound of claim 1, wherein a group represented by
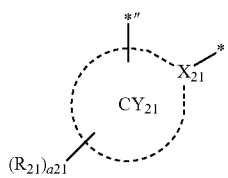
in Formula 2 is a group represented by Formulae $CY_{21}$ (1) to $CY_{21}$ (16):
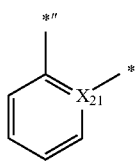
CY21(1)
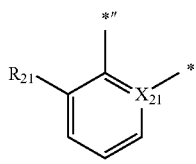
CY21(2)
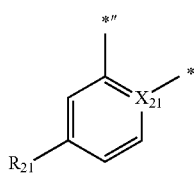
CY21(3)
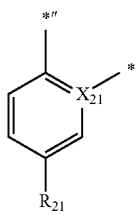
CY21(4)
-continued
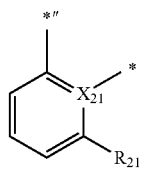
CY21(5)
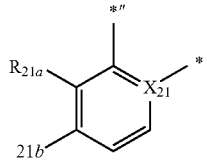
CY21(6)
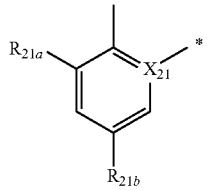
CY21(7)
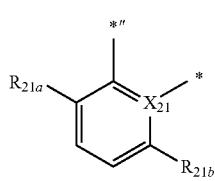
CY21(8)
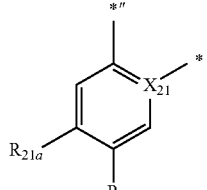
CY21(9)
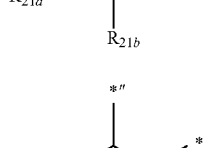
CY21(10)
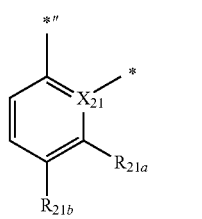
CY21(11)
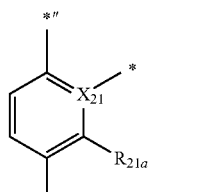
CY21(11)
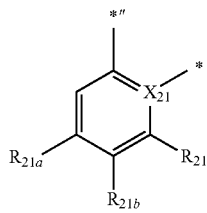
CY21(12)

-continued

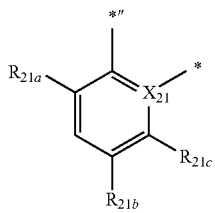
CY21(13)

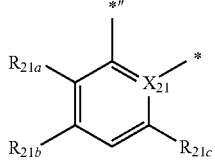
CY21(14)

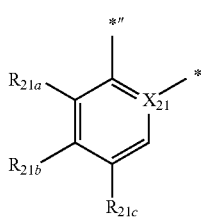
CY21(15)

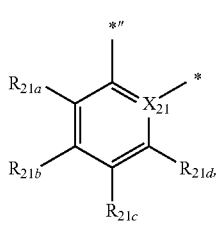
CY21(16)

wherein, in Formulae CY21(1) to CY21(16),
$X_{21}$ and $R_{21}$ are each independently the same as defined in claim 1,
$R_{21a}$ to $R_{21d}$ are each independently the same as for $R_{21}$, wherein $R_{21}$ and $R_{21a}$ to $R_{21d}$ are not hydrogen,
*" indicates a binding site to a carbon atom of a neighboring 6-membered ring in Formula 2, and
* indicates a binding site to M in Formula 1.

5. The organometallic compound of claim 1, wherein the organometallic compound emits red light having a maximum emission wavelength in a range of about 550 nanometers or more.

6. An organic light-emitting device comprising:
a first electrode;
a second electrode; and
an organic layer between the first electrode and the second electrode and comprising an emission layer,
wherein the organic layer comprises the organometallic compound of claim 1.

7. The organic light-emitting device of claim 6, wherein the first electrode is an anode,
the second electrode is a cathode,
the organic layer further comprises a hole transport region between the first electrode and emission layer and an electron transport region between the emission layer and the second electrode,
the hole transport region comprises a hole injection layer, a hole transport layer, an electron blocking layer, a buffer layer, or any combination thereof, and
the electron transport region comprises a hole blocking layer, an electron transport layer, an electron injection layer, or any combination thereof.

8. The organic light-emitting device of claim 6, wherein the emission layer comprises the organometallic compound.

9. The organic light-emitting device of claim 8, wherein the emission layer further comprises a host, and an amount of the host is larger than an amount of the organometallic compound.

10. An organometallic compound being one of Compounds 1, 2, 5 to 7, 10, 15, 16, 18, 20, and 22 to 30:

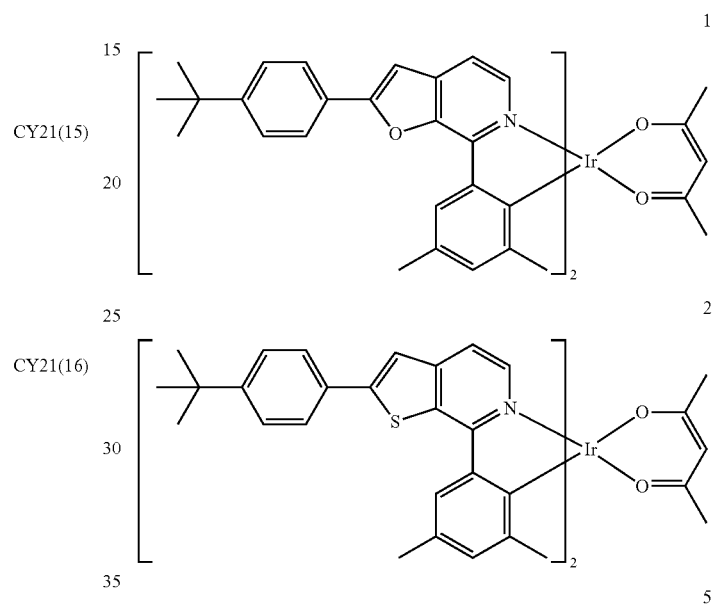

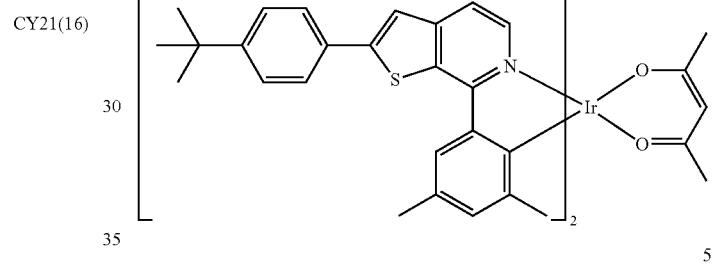

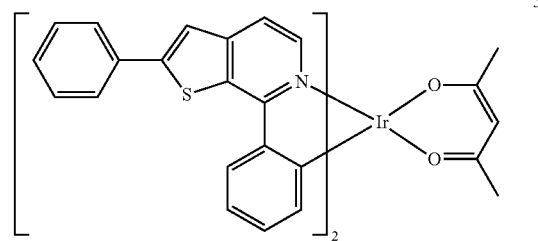

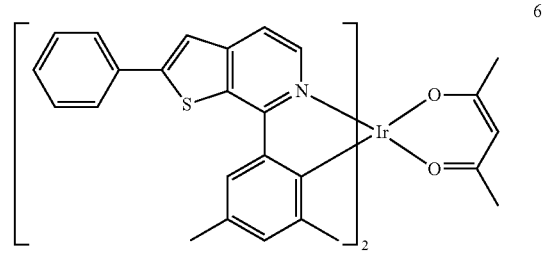

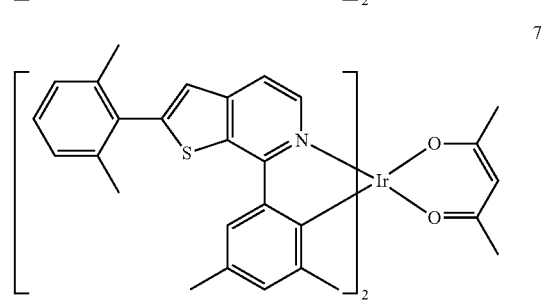

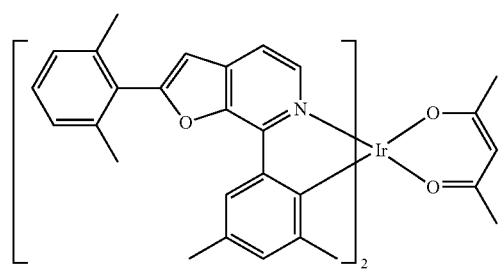
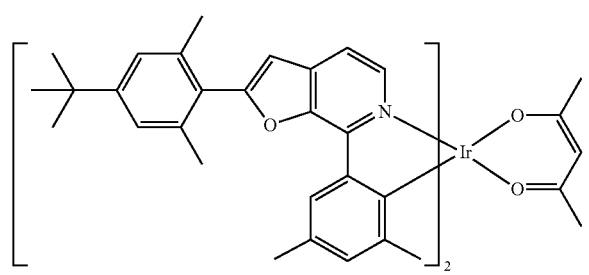
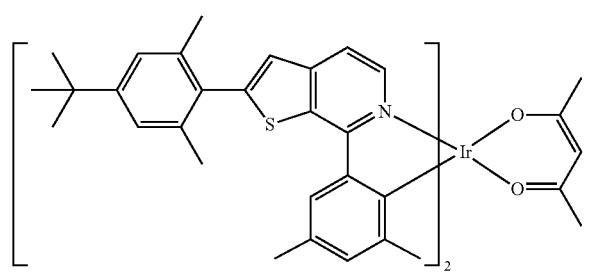
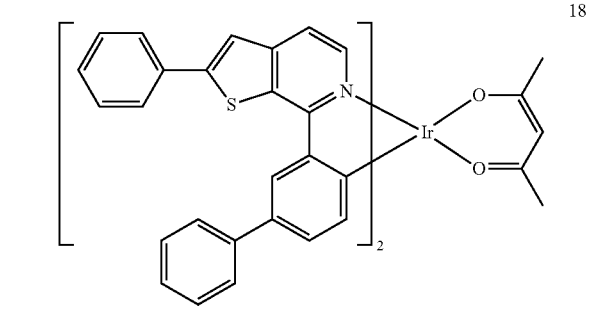
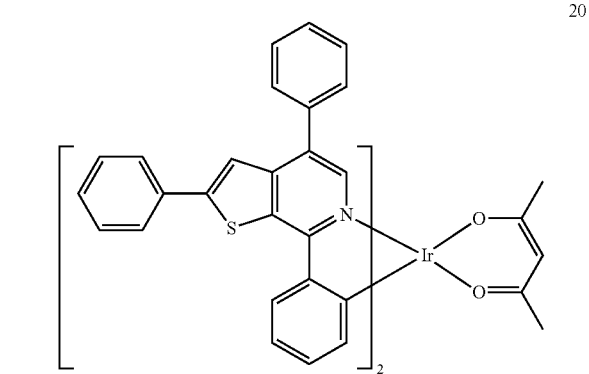
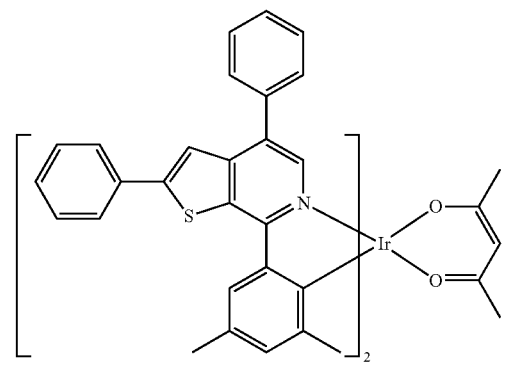
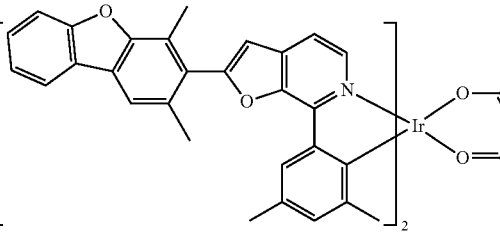
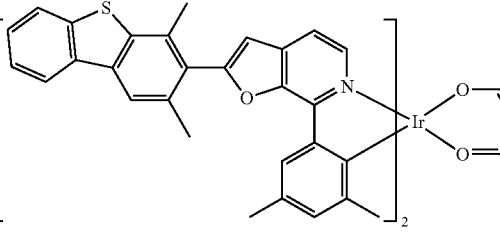
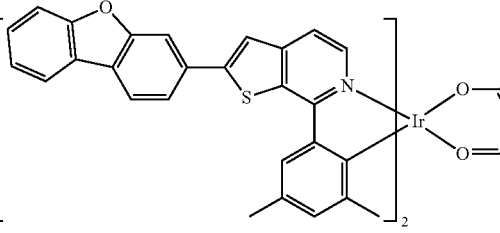
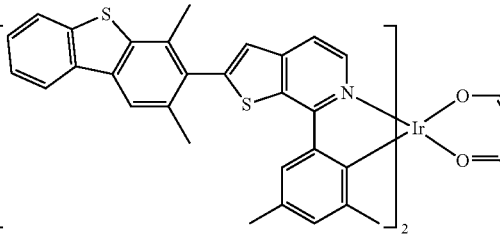

27
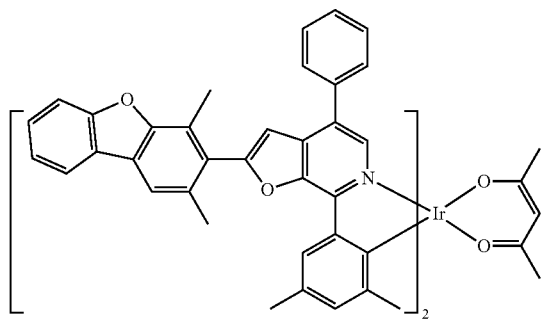
28
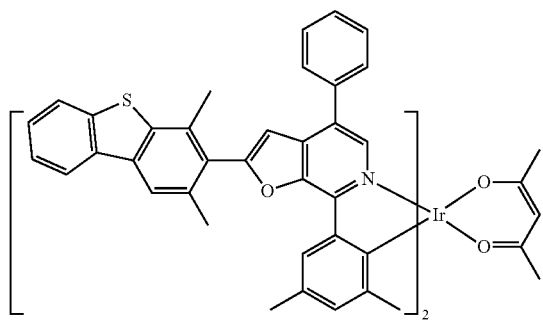
29
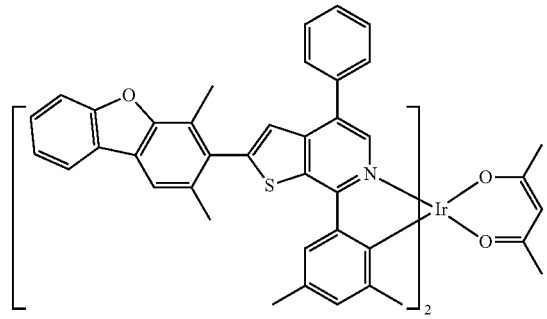
30
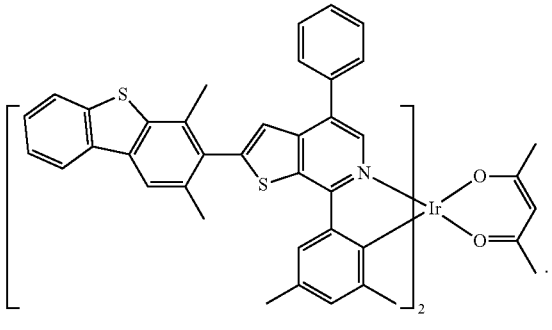
* * * * *